US011605786B2

(12) United States Patent
Kim et al.

(10) Patent No.: US 11,605,786 B2
(45) Date of Patent: Mar. 14, 2023

(54) ORGANIC LIGHT-EMITTING DEVICE AND APPARATUS INCLUDING THE SAME

(71) Applicant: Samsung Display Co., Ltd., Yongin-si (KR)

(72) Inventors: Hyunyoung Kim, Yongin-si (KR); Minje Kim, Yongin-si (KR); Eungdo Kim, Yongin-si (KR); Hyojeong Kim, Yongin-si (KR); Hyosup Shin, Yongin-si (KR); Seokgyu Yoon, Yongin-si (KR); Youngki Lee, Yongin-si (KR); Jungsub Lee, Yongin-si (KR); Jiyoung Lee, Yongin-si (KR); Hyejin Jung, Yongin-si (KR); Kunwook Cho, Yongin-si (KR); Hyeongu Cho, Yongin-si (KR); Minsoo Choi, Yongin-si (KR); Youngeun Choi, Yongin-si (KR); Hyein Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 247 days.

(21) Appl. No.: 17/028,894

(22) Filed: Sep. 22, 2020

(65) Prior Publication Data

US 2021/0104683 A1 Apr. 8, 2021

(30) Foreign Application Priority Data

Oct. 4, 2019 (KR) ........................ 10-2019-0123355

(51) Int. Cl.
*H01L 33/00* (2010.01)
*H01L 21/00* (2006.01)
(Continued)

(52) U.S. Cl.
CPC ...... *H01L 51/0072* (2013.01); *H01L 51/0059* (2013.01); *H01L 51/0067* (2013.01);
(Continued)

(58) Field of Classification Search
CPC ............. H01L 51/5096; H01L 51/5076; H01L 51/0056; H01L 51/0058; H01L 51/0072–0074
(Continued)

(56) References Cited

U.S. PATENT DOCUMENTS

| | | | |
|---|---|---|---|
| 9,666,817 | B2 | 5/2017 | Kim et al. |
| 9,685,615 | B2 | 6/2017 | Numata et al. |

(Continued)

FOREIGN PATENT DOCUMENTS

| | | | |
|---|---|---|---|
| JP | WO2014/122937 | A1 | 8/2014 |
| JP | 2019-169710 | A | 10/2019 |

(Continued)

OTHER PUBLICATIONS

Ming Zhang et al., Efficient, color-stable and high color-rendering-index white organic light-emitting diodes employing full thermally activated delayed fluorescence system, Organic electronics, 2017, pp. 466-472, vol. 50, Elsevier B.V.

(Continued)

*Primary Examiner* — Calvin Lee
(74) *Attorney, Agent, or Firm* — Lewis Roca Rothgerber Christie LLP

(57) ABSTRACT

An organic light-emitting device and an apparatus including the same are disclosed. The organic light-emitting device includes: a first electrode; a second electrode facing the first electrode; and an organic layer between the first electrode and the second electrode. The organic layer includes an emission layer, the emission layer includes a first compound, a second compound, a third compound, and a fourth com-
(Continued)

pound, the first compound is represented by Formula 1, the second compound is represented by Formula 2, the third compound is represented by Formula 3, the fourth compound is represented by any one of Formulae 4-1 to 4-3, each as respectively described in the detailed description.

20 Claims, 5 Drawing Sheets

(51) Int. Cl.
*H01L 51/00* (2006.01)
*H01L 51/50* (2006.01)
*H01L 51/42* (2006.01)

(52) U.S. Cl.
CPC ...... *H01L 51/0073* (2013.01); *H01L 51/0087* (2013.01); *H01L 51/5024* (2013.01); *H01L 51/4273* (2013.01); *H01L 51/5056* (2013.01); *H01L 51/5072* (2013.01); *H01L 51/5092* (2013.01)

(58) Field of Classification Search
USPC .................................... 438/46; 257/102, 103
See application file for complete search history.

(56) References Cited

U.S. PATENT DOCUMENTS 9,741,939 B2 * 8/2017 Kim ...................... C07F 7/0812
10,008,676 B2 * 6/2018 Han ..................... C07D 407/04
10,062,850 B2 * 8/2018 Jung ..................... C09B 57/008
10,090,483 B2 10/2018 Kim et al.
10,141,520 B2 11/2018 Oikawa et al.
10,418,573 B2 9/2019 Kim et al.
10,431,766 B2 * 10/2019 Ito ....................... H01L 51/5096
11,316,124 B2 * 4/2022 Ito ....................... H01L 51/5096
2016/0164020 A1 6/2016 Kim et al.
2016/0190478 A1 6/2016 Nakanotani et al.
2018/0198074 A1 7/2018 Lee et al.
2019/0019964 A1 1/2019 Jeon et al.
2019/0036055 A1 1/2019 Lin et al.
2019/0097155 A1 3/2019 Kim et al.
2019/0157351 A1 5/2019 Kim et al.
2019/0203114 A1 7/2019 Ihn et al.
2019/0296254 A1 9/2019 Ko et al.

FOREIGN PATENT DOCUMENTS

KR 10-1419810 B1 7/2014
KR 10-2015-0126381 A 11/2015
KR 10-2016-0039974 A 4/2016
KR 10-1617877 B1 5/2016
KR 10-2016-0067629 A 6/2016
KR 10-1646732 B1 8/2016
KR 10-1680934 B1 11/2016
KR 10-2017-0014797 A 2/2017
KR 10-1706752 B1 2/2017
KR 10-2017-0026075 A 3/2017
KR 10-2017-0078573 A 7/2017
KR 10-2018-0013380 A 2/2018
KR 10-2019-0008481 A 1/2019
WO WO 2016/072743 A1 5/2016

OTHER PUBLICATIONS

Extended European Search Report dated Mar. 11, 2021 for European Application No. 20198753.4, 6 pages.

* cited by examiner

10

20

30

40

ORGANIC LIGHT-EMITTING DEVICE AND APPARATUS INCLUDING THE SAME

CROSS-REFERENCE TO RELATED APPLICATION

This application claims priority to and the benefit of Korean Patent Application No. 10-2019-0123355, filed on Oct. 4, 2019, in the Korean Intellectual Property Office, the disclosure of which is incorporated herein in its entirety by reference, and is related to U.S. patent application Ser. No. 16/923,539, filed on Jul. 8, 2020, by way of a common assignee.

BACKGROUND

1. Field

One or more embodiments relate to an organic light-emitting device and an apparatus including the same.

2. Description of Related Art

Organic light-emitting devices are self emissive devices that have a wide viewing angle, a high contrast ratio, and/or a short response time, and/or show suitable (e.g., excellent) characteristics in terms of luminance, driving voltage, and/or response speed.

In an organic light-emitting device, a first electrode is arranged on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. The holes and the electrons, which are carriers, recombine in the emission layer to produce excitons. These excitons transition from an excited state to a ground state, thereby generating (e.g., emitting) light.

SUMMARY

Aspects according to one or more embodiments are directed toward an organic light-emitting device and an apparatus including the same.

Additional aspects will be set forth in part in the description which follows and, in part, will be apparent from the description, or may be learned by practice of the presented embodiments of the disclosure.

According to one or more embodiments, an organic light-emitting device includes:

a first electrode;

a second electrode facing the first electrode; and an organic layer between the first electrode and the second electrode, wherein the organic layer includes an emission layer, the emission layer includes a first compound, a second compound, a third compound, and a fourth compound, the first compound is represented by Formula 1;

the second compound is represented by Formula 2;

the third compound is represented by Formula 3;

the fourth compound is represented by any one of Formulae 4-1 to 4-3; and the first compound, the second compound, the third compound, and the fourth compound are different from each other:

Formula 1

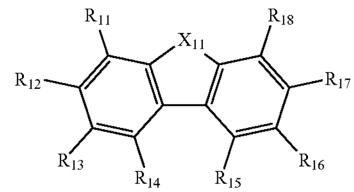

Formula 2

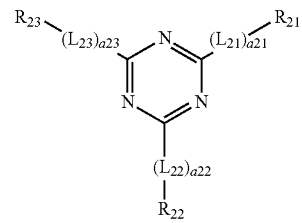

Formula 3

$$M_{31}(L_{31})_{n31}(L_{32})_{n32}$$

Formula 3A

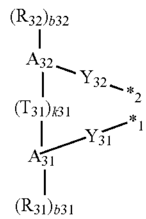

Formula 3B

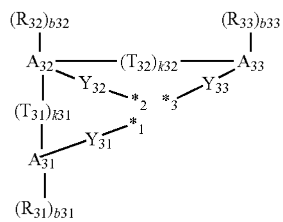

Formula 3C

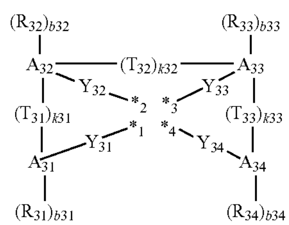

Formula 3D

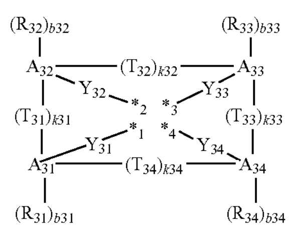

Formula 4-1

$$(D_{41})_{n41}—(L_{41})_{a41}—(A_{41})_{m41}$$

Formula 4-2

$$(D_{41})_{n41}—(L_{41})_{a41}—(A_{41})_{m41}—(L_{42})_{a42}—(D_{42})_{n42}$$

Formula 4-3

$$(A_{41})_{m41}—(L_{41})_{a41}—(D_{41})_{n41}—(L_{42})_{a42}—(A_{42})_{m42}$$

In Formula 1, $X_{11}$ may be selected from O, S, $N(R_{19})$, and $C(R_{19})(R_{20})$;

$R_{11}$ to $R_{20}$ may each independently be selected from:

a group represented by $*-(L_{11})_{a11}-A_{11}$, hydrogen, deuterium, a $C_1$-$C_{60}$ alkyl group, a π electron-depleted nitrogen-free cyclic group, —$C(Q_1)(Q_2)(Q_3)$, —$Si(Q_1)(Q_2)(Q_3)$, —$B(Q_1)(Q_2)$, and —$N(Q_1)(Q_2)$;

a π electron-depleted nitrogen-free cyclic group substituted with at least one selected from deuterium, a $C_1$-$C_{60}$ alkyl group, a π electron-depleted nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a π electron-depleted nitrogen-free cyclic group substituted with at least one π electron-depleted nitrogen-free cyclic group that is substituted with at least one selected from deuterium, a $C_1$-$C_{60}$ alkyl group, a π electron-depleted nitrogen-free cyclic group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$, $L_{11}$ may be selected from:

a π electron-depleted nitrogen-free cyclic group, —$C(Q_1)(Q_2)$-, —$Si(Q_1)(Q_2)$-, —$B(Q_1)$-, and —$N(Q_1)$-; and a π electron-depleted nitrogen-free cyclic group substituted with at least one selected from deuterium, a $C_1$-$C_{60}$ alkyl group, a π electron-depleted nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$, a11 may be selected from 1, 2, and 3, and $A_{11}$ may be selected from:

a π electron-depleted nitrogen-free cyclic group;

a π electron-depleted nitrogen-free cyclic group substituted with at least one selected from deuterium, a $C_1$-$C_{60}$ alkyl group, a π electron-depleted nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a π electron-depleted nitrogen-free cyclic group substituted with at least one π electron-depleted nitrogen-free cyclic group that is substituted with at least one selected from deuterium, a $C_1$-$C_{60}$ alkyl group, a π electron-depleted nitrogen-free cyclic group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$.

In Formula 2, $L_{21}$ to $L_{23}$ may each independently be selected from a substituted or unsubstituted $C_5$-$C_{30}$ carbocyclic group and a substituted or unsubstituted $C_1$-$C_{30}$ heterocyclic group, a21 to a23 may each independently be selected from 0, 1, and 2, $R_{21}$ to $R_{23}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$.

In Formula 3, $M_{31}$ may be selected from a Period 4 transition metal, a Period 5 transition metal, and a Period 6 transition metal of the Periodic Table of Elements, $L_{31}$ may be a ligand represented by one of Formulae 3A to 3D, $L_{32}$ may be selected from a monodentate ligand, a bidentate ligand, and a tridentate ligand, n31 may be 1 or 2, n32 may be selected from 0, 1, 2, 3, and 4, $A_{31}$ to $A_{34}$ may each independently be selected from a $C_5$-$C_{30}$ carbocyclic group and a $C_1$-$C_{30}$ heterocyclic group, T31 to T34 may each independently be selected from a single bond, a double bond, *—O—*', *—S—*, *—C(=O)—*', *—S(=O)—*', *—$C(R_{35})(R_{36})$—*', *—$C(R_{35})=C(R_{36})$—*', *—$C(R_{35})$=*', *—$Si(R_{35})(R_{36})$—*', *—$B(R_{35})$—*', *—$N(R_{35})$—*', and *—$P(R_{35})$—*', k31 to k34 may each independently be selected from 1, 2, and 3, $Y_{31}$ to $Y_{34}$ may each independently be selected from a single bond, *—O—*', *—S—*', *—$C(R_{37})(R_{33})$—*', *—$Si(R_{37})(R_{38})$—*', *—$B(R_{37})$—*', *—$N(R_{37})$—*', and *—$P(R_{37})$—*', $*_1$, $*_2$, $*_3$, and $*_4$ may each indicate a binding site to $M_{31}$, $R_{31}$ to $R_{38}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, wherein $R_{31}$ to $R_{38}$ may optionally be linked to each other to form a substituted or unsubstituted $C_5$-$C_{60}$ carbocyclic group or a substituted or unsubstituted $C_1$-$C_{60}$ heterocyclic group, and b31 to b34 may each independently be an integer from 0 to 10.

In Formulae 4-1 to 4-3, $A_{41}$ and $A_{42}$ may each independently be selected from:

a π electron-depleted nitrogen-free cyclic group, —$Si(Q_1)(Q_2)(Q_3)$, —$B(Q_1)(Q_2)$, and —$N(Q_1)(Q_2)$;

a π electron-depleted nitrogen-free cyclic group substituted with at least one selected from deuterium, a $C_1$-$C_{60}$ alkyl group, a π electron-depleted nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a π electron-depleted nitrogen-free cyclic group substituted with at least one π electron-depleted nitrogen-free cyclic group that is substituted with at least one selected from deuterium, a $C_1$-$C_{60}$ alkyl group, a π electron-depleted nitrogen-free cyclic group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$, m41 and m42 may each independently be selected from 1, 2, and 3, $D_{41}$ and $D_{42}$ may each independently be selected from:

—F, a cyano group, a π electron-depleted nitrogen-containing cyclic group, a C(═O)-containing group, a P(═O)-containing group, and a P(═S)-containing group;

a π electron-depleted nitrogen-containing cyclic group, a C(═O)-containing group, a P(═O)-containing group, and a P(═S)-containing group, each substituted with at least one selected from deuterium, —F, a cyano group, a $C_1$-$C_{60}$ alkyl group, a π electron-depleted nitrogen-containing cyclic group, and a π electron-depleted nitrogen-free cyclic group;

a π electron-depleted nitrogen-containing cyclic group, a C(═O)-containing group, a P(═O)-containing group, and a P(═S)-containing group, each substituted with at least one selected from a $C_1$-$C_{60}$ alkyl group, a π electron-depleted nitrogen-containing cyclic group and a π electron-depleted nitrogen-free cyclic group that are each independently substituted with at least one selected from deuterium, —F, a cyano group, a $C_1$-$C_{60}$ alkyl group, a π electron-depleted nitrogen-containing cyclic group, and a π electron-depleted nitrogen-free cyclic group;

a $C_1$-$C_{60}$ alkyl group and a π electron-depleted nitrogen-free cyclic group, each substituted with at least one selected from —F, a cyano group, and a π electron-depleted nitrogen-containing cyclic group;

a $C_1$-$C_{60}$ alkyl group and a π electron-depleted nitrogen-free cyclic group, each substituted with at least one π electron-depleted nitrogen-containing cyclic group that is substituted with at least one selected from deuterium, —F, a cyano group, a $C_1$-$C_{60}$ alkyl group, a π electron-depleted nitrogen-containing cyclic group, and a π electron-depleted nitrogen-free cyclic group; and a $C_1$-$C_{60}$ alkyl group and a π electron-depleted nitrogen-free cyclic group, each substituted with at least one selected from a $C_1$-$C_{60}$ alkyl group and a π electron-depleted nitrogen-free cyclic group that are each independently substituted with at least one selected from —F, a cyano group, and a π electron-depleted nitrogen-containing cyclic group, n41 and n42 may each independently be selected from 1, 2, and 3, $L_{41}$ and $L_{42}$ may each independently be selected from:

a π electron-depleted nitrogen-free cyclic group, —C($Q_1$)($Q_2$)-, —Si($Q_1$)($Q_2$)-, —B($Q_1$)-, and —N($Q_1$)-; and a π electron-depleted nitrogen-free cyclic group substituted with at least one selected from deuterium, a $C_1$-$C_{60}$ alkyl group, a π electron-depleted nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), and a41 and a42 may each independently be selected from 0, 1, 2, and 3.

In Formulae 1, 2, 3 and 4-1 to 4-3, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, the substituted monovalent non-aromatic condensed heteropolycyclic group, the substituted $C_5$-$C_{30}$ carbocyclic group, the substituted $C_1$-$C_{30}$ heterocyclic group, the substituted $C_5$-$C_{60}$ carbocyclic group, and the substituted $C_1$-$C_{60}$ heterocyclic group may be selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_1$ to $Q_3$, $Q_{11}$ to $Q_{13}$, $Q_{21}$ to $Q_{23}$ and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group.

According to one or more embodiments, an apparatus includes a thin-film transistor including a source electrode, a drain electrode, and an activation layer; and the organic light-emitting device, wherein the first electrode of the organic light-emitting device is electrically connected to the source electrode or the drain electrode of the thin-film transistor.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
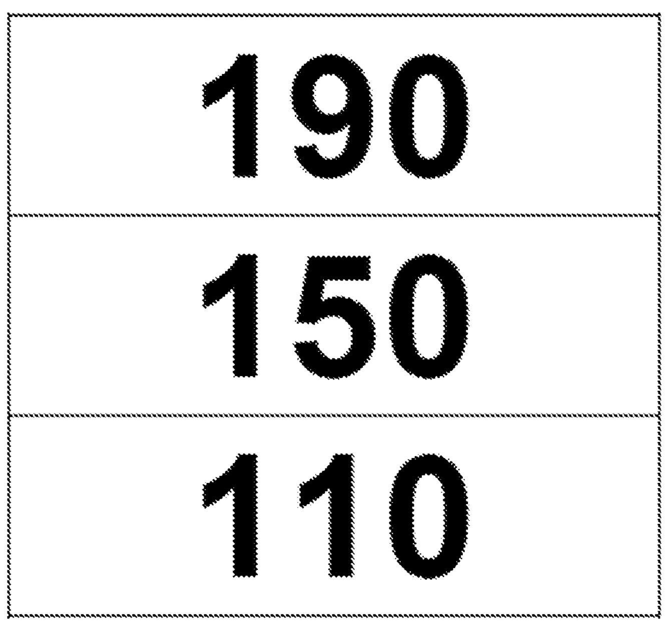
FIG. 1 shows a schematic view of an organic light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present inventive concept will be described in more detail by explaining embodiments with reference to the accompanying drawings. When described with reference to the drawings, the same or corresponding elements will be given the same reference numerals, and redundant description thereof will be omitted (i.e., will not be provided).

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not essentially limited thereto.

The term "organic layer" as used herein refers to a single layer and/or a plurality of layers between the first electrode and the second electrode of the organic light-emitting device. A material included in the "organic layer" is not limited to an organic material.

According to one or more embodiments, an organic light-emitting device includes: a first electrode; a second electrode; and an organic layer disposed between the first electrode and the second electrode, wherein the organic layer includes an emission layer; and the emission layer includes a first compound, a second compound, a third compound, and a fourth compound, wherein the first compound is represented by Formula 1 below; the second compound is represented by Formula 2 below; the third compound is represented by Formula 3 below; the fourth compound is represented by one of Formulae 4-1 to 4-3; and the first compound, the second compound, the third compound, and the fourth compound are different from each other:

Formula 1

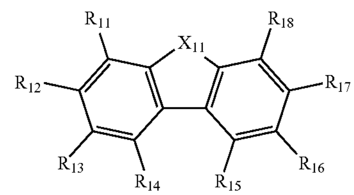

Formula 2

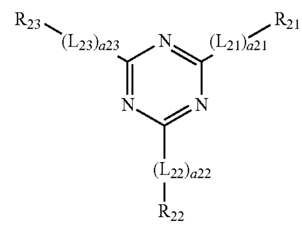

Formula 3

$$M_{31}(L_{31})_{n31}(L_{32})_{n32}$$

Formula 3A

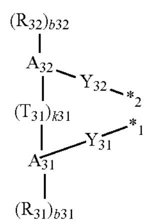

Formula 3B

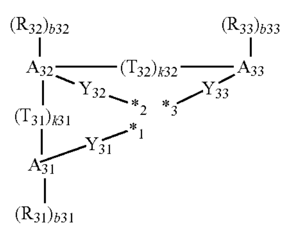

Formula 3C

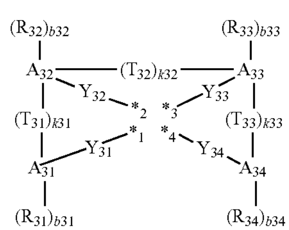

-continued

Formula 3D

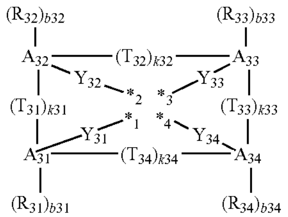

Formula 4-1

$$(D_{41})_{n41}—(L_{41})_{a41}—(A_{41})_{m41}$$

Formula 4-2

$$(D_{41})_{n41}—(L_{41})_{a41}—(A_{41})_{m41}—(L_{42})_{a42}—(D_{42})_{n42}$$

Formula 4-3

$$(A_{41})_{m41}—(L_{41})_{a41}—(D_{41})_{n41}—(L_{42})_{a42}—(A_{42})_{m42}$$

In Formulae 1, 2, 3, and 4-1 to 4-3, $X_{11}$ may be selected from O, S, $N(R_{19})$, and $C(R_{19})(R_{20})$;

$R_{11}$ to $R_{20}$ may each independently be selected from:

a group represented by $*-(L_{11})_{a11}-A_{11}$, hydrogen, deuterium, a $C_1$-$C_{60}$ alkyl group, a π electron-depleted nitrogen-free cyclic group, $—C(Q_1)(Q_2)(Q_3)$, $—Si(Q_1)(Q_2)(Q_3)$, $—B(Q_1)(Q_2)$, and $—N(Q_1)(Q_2)$;

a π electron-depleted nitrogen-free cyclic group substituted with at least one selected from deuterium, a $C_1$-$C_{60}$ alkyl group, a π electron-depleted nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$; and a π electron-depleted nitrogen-free cyclic group substituted with at least one TT electron-depleted nitrogen-free cyclic group that is substituted with at least one selected from deuterium, a $C_1$-$C_{60}$ alkyl group, a π electron-depleted nitrogen-free cyclic group, $—C(Q_{21})(Q_{22})(Q_{23})$, $—Si(Q_{21})(Q_{22})(Q_{23})$, $—B(Q_{21})(Q_{22})$, and $—N(Q_{21})(Q_{22})$, $L_{11}$ may be selected from:

a π electron-depleted nitrogen-free cyclic group, $—C(Q_1)(Q_2)-$, $—Si(Q_1)(Q_2)-$, $—B(Q_1)-$, and $—N(Q_1)-$; and a π electron-depleted nitrogen-free cyclic group substituted with at least one selected from deuterium, a $C_1$-$C_{60}$ alkyl group, a π electron-depleted nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$, a11 may be selected from 1, 2, and 3, $A_{11}$ may be selected from:

a π electron-depleted nitrogen-free cyclic group;

a π electron-depleted nitrogen-free cyclic group substituted with at least one selected from deuterium, a $C_1$-$C_{60}$ alkyl group, a π electron-depleted nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$; and a π electron-depleted nitrogen-free cyclic group substituted with at least one π electron-depleted nitrogen-free cyclic group that is substituted with at least one selected from deuterium, a $C_1$-$C_{60}$ alkyl group, a π electron-depleted nitrogen-free cyclic group, $—C(Q_{21})(Q_{22})(Q_{23})$, $—Si(Q_{21})(Q_{22})(Q_{23})$, $—B(Q_{21})(Q_{22})$, and $—N(Q_{21})(Q_{22})$, $L_{21}$ to $L_{23}$ may each independently be selected from a substituted or unsubstituted $C_5$-$C_{30}$ carbocyclic group and a substituted or unsubstituted $C_1$-$C_{30}$ heterocyclic group, a21 to a23 may each independently be selected from 0, 1, and 2, $R_{21}$ to $R_{23}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_5$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—C(Q_1)(Q_2)(Q_3)$, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, and $—P(=S)(Q_1)(Q_2)$, $M_{31}$ may be selected from a Period 4 transition metal, a Period 5 transition metal, and a Period 6 transition metal of the Periodic Table of Elements, $L_{31}$ may be a ligand represented by one of Formulae 3A to 3D, $L_{32}$ may be selected from a monodentate ligand, a bidentate ligand, and a tridentate ligand, n31 may be 1 or 2, n32 may be selected from 0, 1, 2, 3, and 4, $A_{31}$ to $A_{34}$ may each independently be selected from a $C_5$-$C_{30}$ carbocyclic group and a $C_1$-$C_{30}$ heterocyclic group, $T_{31}$ to $T_{34}$ may each independently be selected from a single bond, a double bond, $*—O—*'$, $*—S—*'$, $*—C(=O)—*'$, $*—S(=O)—*'$, $*—C(R_{35})(R_{36})—*'$, $*—C(R_{35})=C(R_{36})—*'$, $*—C(R_{35})=*'$, $*—Si(R_{35})(R_{36})—*'$, $*—B(R_{35})—*'$, $*—N(R_{35})—*'$, and $*—P(R_{35})—*'$, k31 to k34 may each independently be selected from 1, 2, and 3, $Y_{31}$ to $Y_{34}$ may each independently be selected from a single bond, $*—O—*'$, $*—S—*'$, $*—C(R_{37})(R_{38})—*'$, $*—Si(R_{37})(R_{38})—*'$, $*—B(R_{37})—*'$, $*—N(R_{37})—*'$, and $*—P(R_{37})—*$,

*1, *2, *3, and *4 may each indicate a binding site to $M_{31}$, $R_{31}$ to $R_{38}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—C(Q_1)(Q_2)(Q_3)$, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, and $—P(=S)(Q_1)(Q_2)$, wherein $R_{31}$ to $R_{38}$ (e.g., adjacent $R_{31}$ to $R_{38}$) may optionally be linked to each other to form a substituted or unsubstituted $C_5$-$C_{60}$ carbocyclic group or a substituted or unsubstituted $C_1$-$C_{60}$ heterocyclic group, b31 to b34 may each independently be an integer from 0 to 10, $A_{41}$ and $A_{42}$ may each independently be selected from:

a π electron-depleted nitrogen-free cyclic group, $—Si(Q_1)(Q_2)(Q_3)$, $—B(Q_1)(Q_2)$, and $—N(Q_1)(Q_2)$;

a π electron-depleted nitrogen-free cyclic group substituted with at least one selected from deuterium, a $C_1$-$C_{60}$ alkyl group, a π electron-depleted nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a π electron-depleted nitrogen-free cyclic group substituted with at least one π electron-depleted nitrogen-free cyclic group that is substituted with at least one selected from deuterium, a $C_1$-$C_{60}$ alkyl group, a π electron-depleted nitrogen-free cyclic group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$, m41 and m42 may each independently be selected from 1, 2, and 3, $D_{41}$ and $D_{42}$ may each independently be selected from:

—F, a cyano group, a π electron-depleted nitrogen-containing cyclic group, a C(═O)-containing group, a P(═O)-containing group, and a P(═S)-containing group;

a π electron-depleted nitrogen-containing cyclic group, a C(═O)-containing group, a P(═O)-containing group, and a P(═S)-containing group, each substituted with at least one selected from deuterium, —F, a cyano group, a $C_1$-$C_{60}$ alkyl group, a π electron-depleted nitrogen-containing cyclic group, and a π electron-depleted nitrogen-free cyclic group;

a $C_1$-$C_{60}$ alkyl group and a π electron-depleted nitrogen-free cyclic group, each substituted with at least one selected from —F, a cyano group, and a π electron-depleted nitrogen-containing cyclic group;

a π electron-depleted nitrogen-containing cyclic group, a C(═O)-containing group, a P(═O)-containing group, and a P(═S)-containing group, each substituted with at least one selected from a $C_1$-$C_{60}$ alkyl group, a π electron-depleted nitrogen-containing cyclic group and a π electron-depleted nitrogen-free cyclic group that are each independently substituted with at least one selected from deuterium, —F, a cyano group, a $C_1$-$C_{60}$ alkyl group, a π electron-depleted nitrogen-containing cyclic group, and a π electron-depleted nitrogen-free cyclic group;

a $C_1$-$C_{60}$ alkyl group and a π electron-depleted nitrogen-free cyclic group, each substituted with at least one π electron-depleted nitrogen-containing cyclic group that is substituted with at least one selected from deuterium, —F, a cyano group, a $C_1$-$C_{60}$ alkyl group, a π electron-depleted nitrogen-containing cyclic group, and a π electron-depleted nitrogen-free cyclic group; and a $C_1$-$C_{60}$ alkyl group and a π electron-depleted nitrogen-free cyclic group, each substituted with at least one selected from a $C_1$-$C_{60}$ alkyl group and a π electron-depleted nitrogen-free cyclic group that are each independently substituted with at least one selected from —F, a cyano group, and a π electron-depleted nitrogen-containing cyclic group, n41 and n42 may each independently be selected from 1, 2, and 3, $L_{41}$ and $L_{42}$ may each independently be selected from:

a π electron-depleted nitrogen-free cyclic group, —$C(Q_1)(Q_2)$-, —$Si(Q_1)(Q_2)$-, —$B(Q_1)$-, and —$N(Q_1)$-; and a π electron-depleted nitrogen-free cyclic group substituted with at least one selected from deuterium, a $C_1$-$C_{60}$ alkyl group, a π electron-depleted nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$, and a41 and a42 may each independently be selected from 0, 1, 2, and 3, wherein $Q_1$ to $Q_3$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group.

For example, at least one selected from $R_{11}$ to $R_{19}$ in Formula 1 may be a group represented by *-$(L_{11})_{a11}$-$A_{11}$.

For example, $X_{11}$ in Formula 1 may be O, S, or $N(R_{19})$.

For example, $R_{11}$ to $R_{20}$ in Formula 1 may each independently be selected from:

a group represented by *-$(L_{11})_{a11}$-$A_{11}$, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_1)(Q_2)(Q_3)$, —$Si(Q_1)(Q_2)(Q_3)$, —$B(Q_1)(Q_2)$, and —$N(Q_1)(Q_2)$;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each independently substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$.

For example, $L_{11}$ in Formula 1 may be selected from:

a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, a dibenzothiophene group, —$C(Q_1)(Q_2)$-, and —$Si(Q_1)(Q_2)$-; and a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, and —$Si(Q_{31})(Q_{32})(Q_{33})$.

In one embodiment, $L_{11}$ in Formula 1 may be selected from:

a benzene group, a fluorene group, a carbazole group, a dibenzofuran group, and a dibenzothiophene group, —$C(Q_1)(Q_2)$-, and —$Si(Q_1)(Q_2)$-; and a benzene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$.

For example, a11 in Formula 1 may be 1 or 2.

For example, $A_{11}$ in Formula 1 may be selected from:

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each independently substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$.

In one embodiment, $A_{11}$ in Formula 1 may be selected from:

a phenyl group, a biphenyl group, a terphenyl group, a fluorenyl group, a carbazolyl group, a dibenzofuranyl group, and a dibenzothiophenyl group;

a phenyl group, a biphenyl group, a terphenyl group, a fluorenyl group, a carbazolyl group, a dibenzofuranyl group, and a dibenzothiophenyl group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$; and a phenyl group, a biphenyl group, a terphenyl group, a fluorenyl group, a carbazolyl group, a dibenzofuranyl group, and a dibenzothiophenyl group, each substituted with at least one selected from a phenyl group, a biphenyl group, a terphenyl group, a fluorenyl group, a carbazolyl group, a dibenzofuranyl group, and a dibenzothiophenyl group that are each independently substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{21})(Q_{22})(Q_{23})$, and —$Si(Q_{21})(Q_{22})(Q_{23})$.

In one embodiment, $A_{11}$ in Formula 1 may be represented by one of Formulae 8-1 to 8-5 below:

8-1

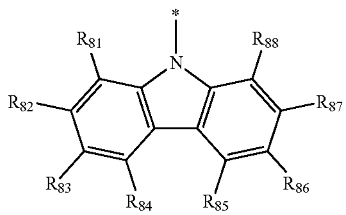

8-2

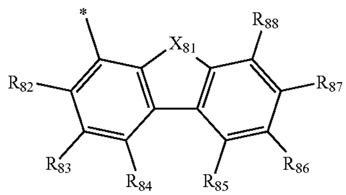

8-3

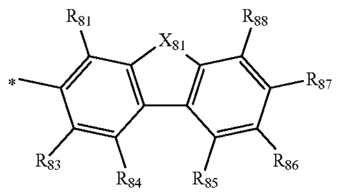

8-4

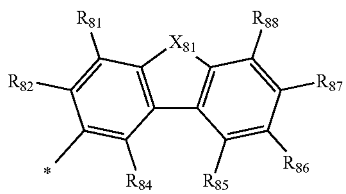

8-5

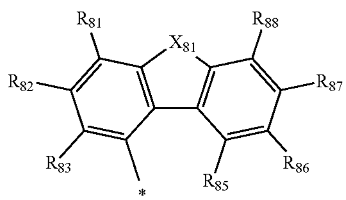

wherein, in Formulae 8-1 to 8-5, $X_{81}$ may be selected from O, S, N($R_{89}$), and C($R_{89}$)($R_{90}$), $R_{81}$ to $R_{90}$ may each independently be selected from hydrogen, deuterium, a $C_1$-$C_{20}$ alkyl group, a phenyl group, a biphenyl group, a terphenyl group, a fluorenyl group, a carbazolyl group, a dibenzofuranyl group, and a dibenzothiophenyl group, and

* indicates a binding site to a neighboring atom.

In one embodiment, the first compound may be represented by one of Formulae 1-1 to 1-9:

1-1

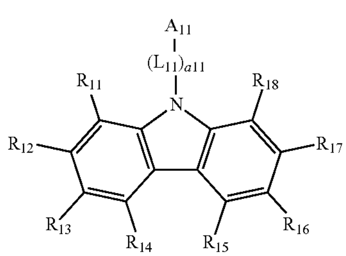

-continued 1-2

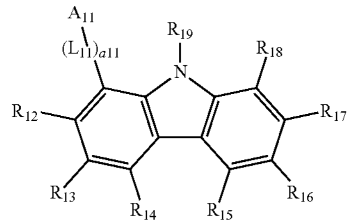

1-3

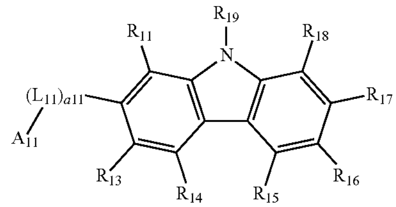

1-4

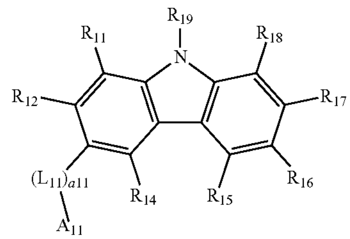

1-5

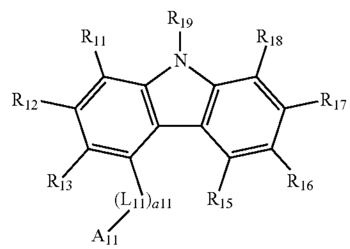

1-6

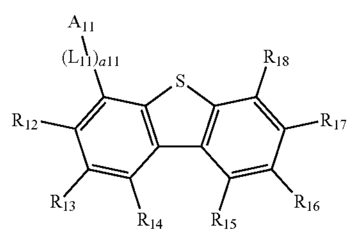

1-7

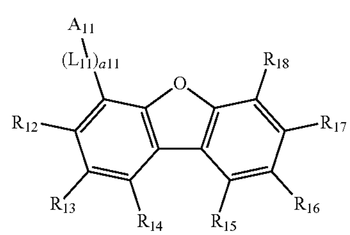

1-8

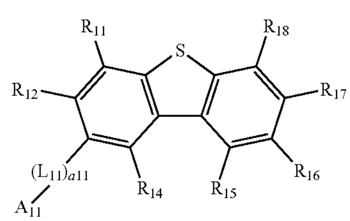

-continued

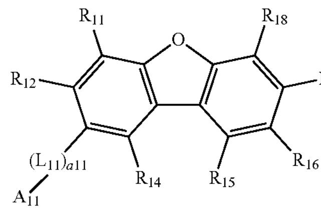

1-9 wherein, in Formulae 1-1 to 1-9, $L_{11}$, a11, $A_{11}$, and $R_{11}$ to $R_{19}$ may each be understood by referring to the corresponding descriptions thereof provided in Formula 1. That is, $L_{11}$, a11, $A_{11}$, and $R_{11}$ to $R_{19}$ may each be the same as respectively defined in connection with Formula 1.

For example, $L_{21}$ to $L_{23}$ in Formula 2 may each independently be selected from:

a benzene group, a naphthalene group, a phenalene group, an anthracene group, a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group; and a benzene group, a naphthalene group, a phenalene group, an anthracene group, a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indeno fluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

For example, a21 to a23 in Formula 2 may each independently be 0 or 1.

For example, $R_{21}$ to $R_{23}$ in Formula 2 may each independently be selected from:

a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group;

a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, —Cl, —Br, —I, a hydroxyl group, a cyano group, a nitro group, an amidino group, a hydrazine group, a hydrazone group, a $C_1$-$C_{10}$ alkyl group, a $C_1$-$C_{10}$ alkoxy group, a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, —$C(Q_{31})(Q_{32})(Q_{33})$, —$Si(Q_{31})(Q_{32})(Q_{33})$, —$B(Q_{31})(Q_{32})$, —$N(Q_{31})(Q_{32})$, —$P(Q_{31})(Q_{32})$, —$C(=O)(Q_{31})$, —$S(=O)(Q_{31})$, —$S(=O)_2(Q_{31})$, —$P(=O)(Q_{31})(Q_{32})$, and —$P(=S)(Q_{31})(Q_{32})$; and —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, and $Q_1$ to $Q_3$ and $Q_{31}$ to $Q_{33}$ may each independently be selected from a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

In one embodiment, $R_{21}$ to $R_{23}$ in Formula 2 may each independently be selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, each unsubstituted or substituted with at least one selected from deuterium, a $C_1$-$C_{10}$ alkyl group, a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —C($Q_{31}$)($Q_{32}$)($Q_{33}$), and —Si($Q_{31}$)($Q_{32}$)($Q_{33}$); and —C($Q_1$)($Q_2$)($Q_3$) and —Si($Q_1$)($Q_2$)($Q_3$), and $Q_1$ to $Q_3$ and $Q_{31}$ to $Q_{33}$ may each independently be selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group.

In one embodiment, at least one selected from $R_{21}$ to $R_{23}$ in Formula 2 may be selected from a group represented by Formula 2A, a group represented by Formula 2B, —C($Q_1$)($Q_2$)($Q_3$), and —Si($Q_1$)($Q_2$)($Q_3$):

Formula 2A

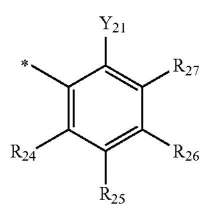

Formula 2B

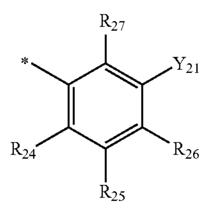

wherein, in Formulae 2A and 2B, $Y_{21}$ may be selected from a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —C($Q_{31}$)($Q_{32}$)($Q_{33}$), and —Si($Q_{31}$)($Q_{32}$)($Q_{33}$), $R_{24}$ to $R_{27}$ may each independently be selected from hydrogen, deuterium, a $C_1$-$C_{10}$ alkyl group, a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —C($Q_{31}$)($Q_{32}$)($Q_{33}$), and —Si($Q_{31}$)($Q_{32}$)($Q_{33}$), $Q_1$ to $Q_3$ and $Q_{31}$ to $Q_{33}$ may each independently be selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and

* indicates a binding site to a neighboring atom.

For example, $M_{31}$ in Formula 3 may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

For example, $M_{31}$ in Formula 3 may be Pt or Ir.

For example, $A_{31}$ to $A_{34}$ in Formulae 3A to 3D may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other;

The first ring may be selected from a cyclopentane group, a cyclopentene group, a cyclopentadiene group, a furan group, a thiophene group, a pyrrole group, a borole group, a phosphole group, a silole group, a germole group, a selenophene group, an oxazole group, a dihydroxazole group, an isoxazole group, a dihydroisoxazole group, an oxadiazole group, a dihydroxadiazole group, an isoxadiazole group, a dihydroisoxadiazole group, an oxatriazole group, a dihydrooxatriazole group, an isoxatriazole group, a dihydroisoxatriazole group, a thiazole group, a dihydrothiazole group, an isothiazole group, a dihydroisothiazole group, a thiadiazole group, a dihydrothiadiazole group, an isothiadiazole group, a dihydroisothiadiazole group, a thiatriazole group, a dihydrothiatriazole group, an isothiatriazole group, a dihydroisothiatriazole group, a pyrazole group, a dihydropyrazole group, an imidazole group, a dihydroimidazole group, a triazole group, a dihydrotriazole group, a tetrazole group, a dihydrotetrazole group, an azasilole group, a diazasilole group, and a triazasilole group.

The second ring may be selected from a cyclohexane group, a cyclohexene group, a cyclohexadiene group, an admantane group, a norbornane group, a norbornene group, a benzene group, a pyridine group, a dihydropyridine group, a tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, and a triazine group.

In one embodiment, $A_{31}$ to $A_{34}$ in Formulae 3A to 3D may each independently be selected from a benzene group, a naphthalene group, an anthracene group, a phenanthrene group, a triphenylene group, a pyrene group, a chrysene group, a furan group, a thiophene group, a silole group, an indene group, a fluorene group, a benzofuran group, a dibenzofuran group, a benzothiophene group, a dibenzothiophene group, a benzosilole group, a dibenzosilole group, an indole group, a carbazole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a pyridine group, a pyrimidine group, a pyrazine group, a pyridazine group, a triazine group, a quinoline group, an isoquinoline group, a quinoxaline group, a quinazoline group, a cinnoline group, a phthalazine group, a phenanthroline group, a pyrrole group, a pyrazole group, an imidazole group, a dihydroimidazole group, a triazole group, a dihydrotriazole group, an oxazole group, a dihydroxazole group, an isoxazole group, a thiazole group, a dihydrothiazole group, an isothiazole group, an oxadiazole group, a dihydroxadiazole group, a thiadiazole group, a dihydrothiadiazole group, a benzopyrazole group, a benzimidazole group, a dihydrobenzimidazole group, an imidazopyridine group, an imidazopyrimidine group, an imidazopyrazine group, a benzoxazole group, a dihydrobenzoxazole group, a benzothiazole group, a dihydrobenzothiazole group, a benzoxadiazole group, a dihydrobenzoxadiazole group, a benzothiadiazole group, and a dihydrobenzothiadiazole group.

For example, $T_{31}$ to $T_{34}$ in Formulae 3A to 3D may each independently be selected from a single bond, a double bond, *—O—*', *—S—*', *—C($R_{35}$)($R_{36}$)—*', and *—N($R_{35}$)—*'.

For example, $Y_{31}$ to $Y_{34}$ in Formulae 3A to 3D may each independently be selected from a single bond, *—O—*', and *—S—*'.

For example, $R_{31}$ to $R_{38}$ in Formulae 3A to 3D may each independently be selected from:

hydrogen, deuterium, —F, —Cl, —Br, —I, a cyano group, a $C_1$-$C_{20}$ alkyl group, and a $C_1$-$C_{20}$ alkoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, —CI, —Br, —I, a cyano group, a $C_1$-$C_{20}$ alkyl group, a $C_1$-$C_{20}$ alkoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and —B($Q_1$)($Q_2$) and —N($Q_1$)($Q_2$), and $Q_1$ and $Q_2$ may each independently be selected from:

hydrogen, deuterium, and a $C_1$-$C_{20}$ alkyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

In one embodiment, $R_{31}$ to $R_{38}$ in Formulae 3A to 3D may each independently be selected from:

hydrogen, deuterium, —F, —CI, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group, and a butoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, —F, —Cl, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group, a butoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and —B($Q_1$)($Q_2$) and —N($Q_1$)($Q_2$), and $Q_1$ and $Q_2$ may each independently be selected from:

hydrogen, deuterium, a methyl group, an ethyl group, an n-propyl group, an isopropyl group, an n-butyl group, an isobutyl group, a sec-butyl group, and a tert-butyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group.

In one embodiment, the third compound may be represented by one of Formulae 3-1 and 3-2 below:

Formula 3-1

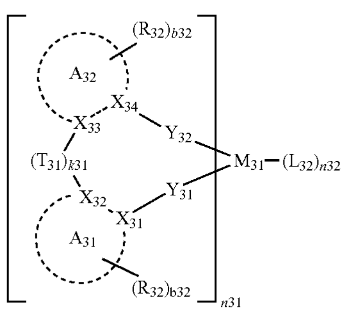

Formula 3-2

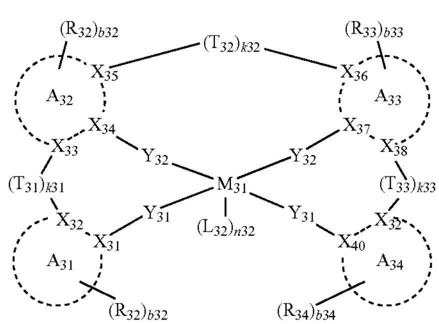

In Formulae 3-1 and 3-2, $X_{31}$ to $X_{40}$ may each independently be selected from N and C, and the remaining components may each be understood by referring to respective descriptions thereof provided above in connection with Formula 3.

In Formulae 3-1 and 3-2, $X_{31}$ and $X_{32}$ may each independently be a ring member of $A_{31}$, and $X_{33}$ to $X_{40}$ may each be understood by referring to descriptions provided in connection with Formulae 3-1 and 3-2. That is, $X_{33}$ to $X_{40}$ may each independently be N or C.

For example, $A_{41}$ and $A_{42}$ in Formulae 4-1 to 4-3 may each independently be selected from a group represented by Formula 12, —Si($Q_1$)($Q_2$)($Q_3$), —B($Q_1$)($Q_2$), and —N($Q_1$)($Q_2$):

Formula 12

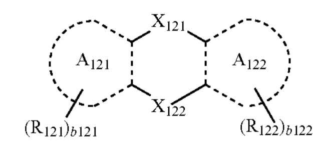

wherein, in Formula 12, $X_{121}$ may be selected from O, S, N($R_{123}$), and C($R_{123}$)($R_{124}$), $X_{122}$ may be selected from a single bond, O, S, N($R_{125}$), and C($R_{125}$)($R_{126}$), $A_{121}$ and $A_{122}$ may each independently be selected from a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, $R_{121}$ to $R_{126}$ may each independently be selected from:

a binding site, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —Si($Q_{31}$)($Q_{32}$)($Q_{33}$), —B($Q_{31}$)($Q_{32}$), and —N($Q_{31}$)($Q_{32}$); and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —Si($Q_{21}$)($Q_{22}$)($Q_{23}$), —B($Q_{21}$)($Q_{22}$), and —N($Q_{21}$)($Q_{22}$), wherein $R_{123}$ and $R_{124}$ may optionally be linked to each other to form a π electron-depleted nitrogen-free cyclic group, $R_{125}$ and $R_{126}$ may optionally be linked to each other to form a π electron-depleted nitrogen-free cyclic group, and at least one selected from $R_{121}$ to $R_{126}$ is a binding site, and b121 and b122 may each independently be selected from 1, 2, 3, 4, 5, and 6, wherein $Q_1$ to $Q_3$, $Q_{21}$ to $Q_{23}$, and $Q_{31}$ to $Q_{33}$ may each be understood by referring to descriptions thereof provided above.

In one or more embodiments, $A_{41}$ and $A_{42}$ in Formulae 4-1 to 4-3 may each independently be selected from a group represented by Formula 12 and —N($Q_1$)($Q_2$):

Formula 12

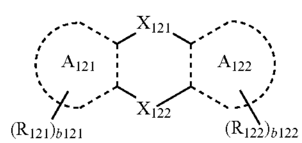

wherein, in Formula 12, $X_{121}$ may be selected from O, S, N($R_{123}$), and C($R_{123}$)($R_{124}$), $X_{122}$ may be selected from a single bond, O, S, N($R_{125}$), and C($R_{125}$)($R_{126}$), $A_{121}$ and $A_{122}$ may each independently be selected from a benzene group, a naphthalene group, a fluorene group, a carbazole group, a dibenzofuran group, and a dibenzothiophene group, $R_{121}$ to $R_{126}$ may each independently be selected from:

a binding site, hydrogen, deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, and —N($Q_{31}$)($Q_{32}$); and a phenyl group, a biphenyl group, a terphenyl group, a fluorenyl group, a carbazolyl group, a dibenzofuranyl group, and a dibenzothiophenyl group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, and —N($Q_{21}$)($Q_{22}$), wherein $R_{123}$ and $R_{124}$ may optionally be linked to each other to form a π electron-depleted nitrogen-free cyclic group, $R_{125}$ and $R_{126}$ may optionally be linked to each other to form a π electron-depleted nitrogen-free cyclic group, and at least one selected from $R_{121}$ to $R_{126}$ is a binding site, and b121 and b122 may each independently be selected from 1, 2, 3, 4, 5, and 6, wherein $Q_1$ to $Q_3$, $Q_{21}$ to $Q_{23}$, and $Q_{31}$ to $Q_{33}$ may each be understood by referring to descriptions thereof provided above.

For example, $D_{41}$ and $D_{42}$ in Formulae 4-1 to 4-3 may each independently be selected from:

—F, a cyano group, a pyrazole group, an imidazole group, a triazole group, an oxazole group, an isoxazole group, an oxadiazole group, an isoxadiazole group, a thiazole group, an isothiazole group, a thiadiazole group, an isothiadiazole group, a pyridine group, a pyrazine group, a pyridazine group, a pyrimidine group, a triazine group, a quinoline group, an isoquinoline group, a naphthyridine group, a quinoxaline group, a quinazoline group, and a group represented by one of Formulae 13-1 to 13-3 below;

a pyrazole group, an imidazole group, a triazole group, an oxazole group, an isoxazole group, an oxadiazole group, an isoxadiazole group, a thiazole group, an isothiazole group, a thiadiazole group, an isothiadiazole group, a pyridine group, a pyrazine group, a pyridazine group, a pyrimidine group, a triazine group, a quinoline group, an isoquinoline group, a naphthyridine group, a quinoxaline group, and a quinazoline group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group;

a pyrazole group, an imidazole group, a triazole group, an oxazole group, an isoxazole group, an oxadiazole group, an isoxadiazole group, a thiazole group, an isothiazole group, a thiadiazole group, an isothiadiazole group, a pyridine group, a pyrazine group, a pyridazine group, a pyrimidine group, a triazine group, a quinoline group, an isoquinoline group, a naphthyridine group, a quinoxaline group, and a quinazoline group, each substituted with at least one selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group that are each independently substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group;

a $C_1$-$C_{20}$ alkyl group, a benzene group, biphenyl group, terphenyl group, a naphthalene group, a phenanthrene group, a triphenylene group, a chrysene group, a fluoranthene group, a fluorene group, a carbazole group, a dibenzofuran group, a dibenzothiophene group, a benzofluorene group, a benzocarbazole group, a benzonaphthofuran group, a benzonaphthothiophene group, a dibenzofluorene group, a dibenzocarbazole group, a dinaphthofuran group, and a dinaphthothiophene group, each substituted with at least one selected from —F, a cyano group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group;

a $C_1$-$C_{20}$ alkyl group, a benzene group, biphenyl group, terphenyl group, a naphthalene group, a phenanthrene group, a triphenylene group, a chrysene group, a fluoranthene group, a fluorene group, a carbazole group, a dibenzofuran group, a dibenzothiophene group, a benzofluorene group, a benzocarbazole group, a benzonaphthofuran group, a benzonaphthothiophene group, a dibenzofluorene group, a dibenzocarbazole group, a dinaphthofuran group, and a dinaphthothiophene group, each substituted with at least one selected from a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group that are each independently substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group; and a $C_1$-$C_{20}$ alkyl group, a benzene group, biphenyl group, terphenyl group, a naphthalene group, a phenanthrene group, a triphenylene group, a chrysene group, a fluoranthene group, a fluorene group, a carbazole group, a dibenzofuran group, a dibenzothiophene group, a benzofluorene group, a benzocarbazole group, a benzonaphthofuran group, a benzonaphthothiophene group, a dibenzofluorene group, a dibenzocarbazole group, a dinaphthofuran group, and a dinaphthothiophene group, each substituted with at least one selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each independently substituted with at least one selected from —F, a cyano group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group:

Formula 13-1

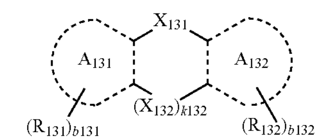

Formula 13-2

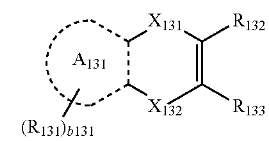

Formula 13-3

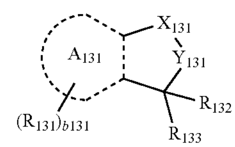

wherein, in Formulae 13-1 to 13-3, $X_{131}$ may be selected from C(═O), S(═O), $S(═O)_2$, $P(═O)(R_{134})$, and $P(═S)(R_{134})$, $X_{132}$ may be selected from O, S, C(═O), S(═O), $S(═O)_2$, $P(═O)(R_{135})$, and $P(═S)(R_{135})$, k132 may be 0 or 1, wherein, when k132 is 0, —$(X_{132})_{k132}$— is not present. That is, when k132 is 0, —$(X_{132})_{k132}$— is a direct link.

$Y_{131}$ may be selected from O and S, $A_{131}$ and $A_{132}$ may each independently be selected from a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, $R_{131}$ to $R_{135}$ may each independently be selected from:

a binding site, hydrogen, deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group; and a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group, wherein at least one selected from $R_{131}$ to $R_{135}$ is a binding site, and b131 and b132 may each independently be selected from 1, 2, 3, 4, 5, and 6.

In one or more embodiments, $D_{41}$ and $D_{42}$ in Formulae 4-1 to 4-3 may each independently be selected from:

—F, a cyano group, a pyridine group, a pyrazine group, a pyridazine group, a pyrimidine group, a triazine group, and a group represented by one of Formulae 13-1 to 13-3;

a pyridine group, a pyrazine group, a pyridazine group, a pyrimidine group, and a triazine group, each substituted with at least one selected from deuterium, —F, a cyano group, a $C_1$-$C_{20}$ alkyl group, a phenyl group, a biphenyl group, a terphenyl group, a naphthyl group, a fluorenyl group, a carbazolyl group, a dibenzofuranyl group, a dibenzothiophenyl group, a pyridinyl group, a pyrazinyl group, a pyridazinyl group, a pyrimidinyl group, and a triazinyl group;

a pyridine group, a pyrazine group, a pyridazine group, a pyrimidine group, and a triazine group, each substituted with at least one selected from a $C_1$-$C_{20}$ alkyl group, a phenyl group, a biphenyl group, a terphenyl group, a fluorenyl group, a carbazolyl group, a dibenzofuranyl group, a dibenzothiophenyl group, a pyridinyl group, a pyrazinyl group, a pyridazinyl group, a pyrimidinyl group, and a triazinyl group that are each independently substituted with at least one selected from deuterium, —F, a cyano group, a $C_1$-$C_{20}$ alkyl group, a phenyl group, a biphenyl group, a terphenyl group, a fluorenyl group, a carbazolyl group, a dibenzofuranyl group, a dibenzothiophenyl group, a pyridinyl group, a pyrazinyl group, a pyridazinyl group, a pyrimidinyl group, and a triazinyl group;

a benzene group, a fluorene group, a carbazole group, a dibenzofuran group, and a dibenzothiophene group, each substituted with a $C_1$-$C_{20}$ alkyl group that is substituted with at least one selected from —F, a cyano group, a pyridinyl group, a pyrazinyl group, a pyridazinyl group, a pyrimidinyl group, and a triazinyl group;

a benzene group, a fluorene group, a carbazole group, a dibenzofuran group, and a dibenzothiophene group, each substituted with at least one selected from a pyridinyl group, a pyrazinyl group, a pyridazinyl group, a pyrimidinyl group, and a triazinyl group that are each independently substituted with at least one selected from deuterium, —F, a cyano group, a $C_1$-$C_{20}$ alkyl group, a phenyl group, a biphenyl group, a terphenyl group, a fluorenyl group, a carbazolyl group, a dibenzofuranyl group, a dibenzothiophenyl group, a pyridinyl group, a pyrazinyl group, a pyridazinyl group, a pyrimidinyl group, and a triazinyl group; and a $C_1$-$C_{20}$ alkyl group, a benzene group, a fluorene group, a carbazole group, a dibenzofuran group, and a dibenzothiophene group, each substituted with at least one selected from a $C_1$-$C_{20}$ alkyl group, a phenyl group, a biphenyl group, a terphenyl group, a fluorenyl group, a carbazolyl group, a dibenzofuranyl group, and a dibenzothiophenyl group that are each independently substituted with at least one selected from —F, a cyano group, a pyridinyl group, a pyrazinyl group, a pyridazinyl group, a pyrimidinyl group, and a triazinyl group:

Formula 13-1

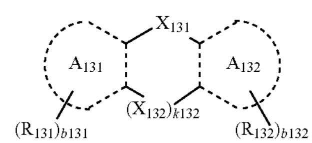

Formula 13-2

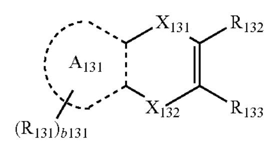

Formula 13-3

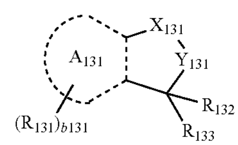

wherein, in Formulae 13-1 to 13-3, $X_{131}$ may be selected from C(═O), S(═O), S(═O)$_2$, P(═O)($R_{134}$), and P(═S)($R_{134}$), $X_{132}$ may be selected from O, S, C(═O), S(═O), S(═O)$_2$, P(═O)($R_{135}$), and P(═S)($R_{135}$), k132 may be 0 or 1, wherein, when k132 is 0, —$(X_{132})_{k132}$— is not present. That is, when k132 is 0, —$(X_{132})_{k132}$— is a direct link.

$Y_{131}$ may be selected from O and S, $A_{131}$ and $A_{132}$ may each independently be selected from a benzene group, a naphthalene group, a fluorene group, a carbazole group, a dibenzofuran group, and a dibenzothiophene group, $R_{131}$ to $R_{135}$ may each independently be selected from:

a binding site, hydrogen, deuterium, —F, a cyano group, a $C_1$-$C_{20}$ alkyl group, a phenyl group, a biphenyl group, a terphenyl group, a fluorenyl group, a carbazolyl group, a dibenzofuranyl group, a dibenzothiophenyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group; and a $C_1$-$C_{20}$ alkyl group, a phenyl group, a biphenyl group, a terphenyl group, a fluorenyl group, a carbazolyl group, a dibenzofuranyl group, a dibenzothiophenyl group, a pyridinyl group, a pyrazinyl group, a pyridazinyl group, a pyrimidinyl group, and a triazinyl group, each substituted with at least one selected from deuterium, —F, a cyano group, a $C_1$-$C_{20}$ alkyl group, a phenyl group, a biphenyl group, a terphenyl group, a fluorenyl group, a carbazolyl group, a dibenzofuranyl group, a dibenzothiophenyl group, a pyridinyl group, a pyrazinyl group, a pyridazinyl group, a pyrimidinyl group, and a triazinyl group, wherein at least one selected from $R_{131}$ to $R_{135}$ is a binding site, and b131 and b132 may each independently be selected from 1, 2, 3, 4, 5, and 6.

For example, $L_{41}$ and $L_{42}$ in Formulae 4-1 to 4-3 may each independently be selected from:

a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, a dibenzothiophene group, —$C(Q_1)(Q_2)$-, and —$Si(Q_1)(Q_2)$-; and a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, and —$Si(Q_{31})(Q_{32})(Q_{33})$, and $Q_1$, $Q_2$, and $Q_{31}$ to $Q_{33}$ are the same as described above.

In one embodiment, $L_{41}$ and $L_{42}$ in Formulae 4-1 to 4-3 may each independently be selected from:

a benzene group, a fluorene group, a carbazole group, a dibenzofuran group, and a dibenzothiophene group, —$C(Q_1)(Q_2)$-, and —$Si(Q_1)(Q_2)$-; and a benzene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$, and $Q_1$, $Q_2$, and $Q_{31}$ to $Q_{33}$ are the same as described above.

In one embodiment, the first compound may be selected from compounds of Group 1, the second compound may be selected from compounds of Group II, the third compound may be selected from compounds of Group 111-1 and Group III-II, and the fourth compound may be selected from compounds of Group IV:

Group I

HT-01

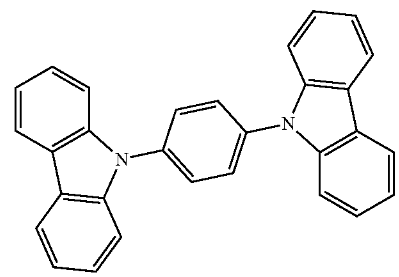

HT-02

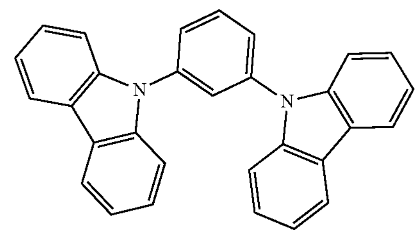

HT-03

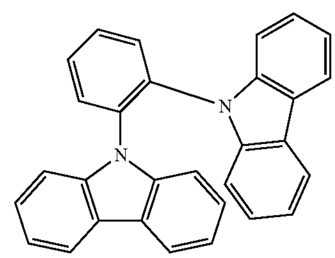

HT-04

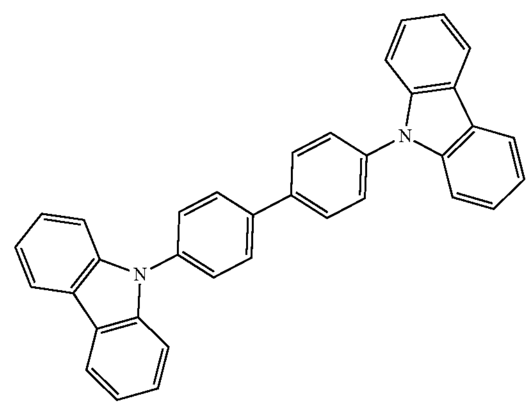

HT-05

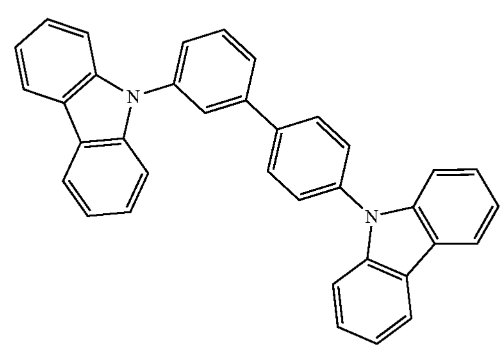

-continued
HT-06
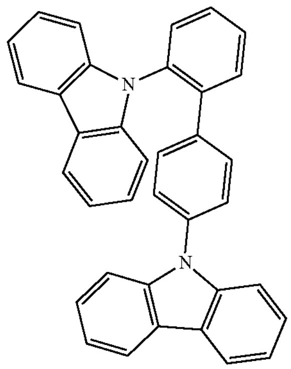
HT-07
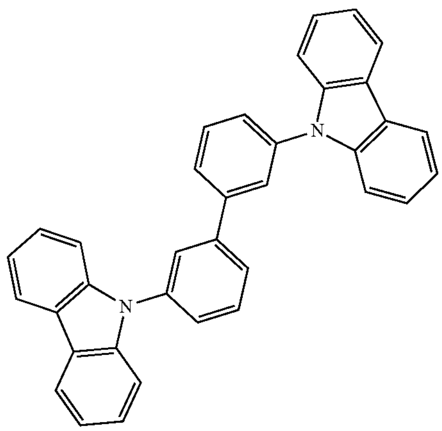
HT-08
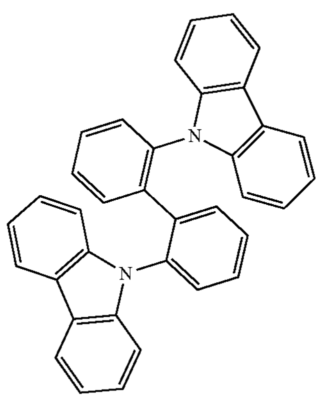
HT-09
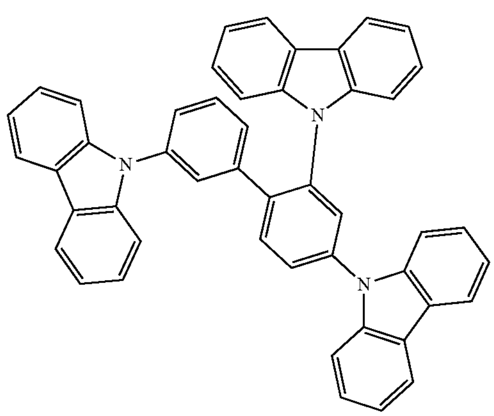
-continued
HT-10
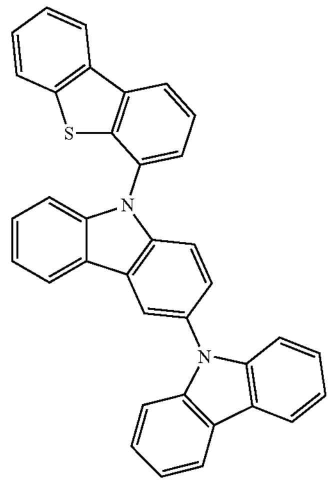
HT-11
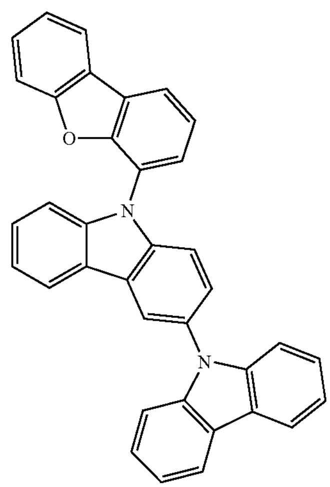
HT-12
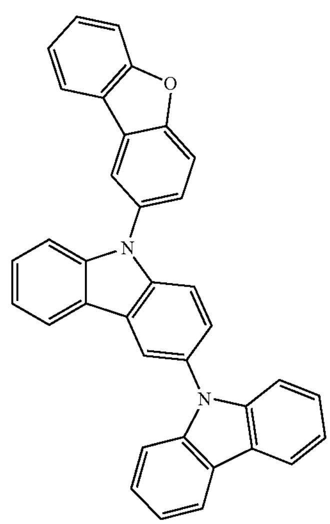

HT-13
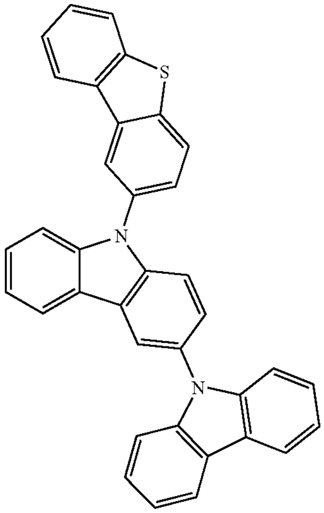
HT-14
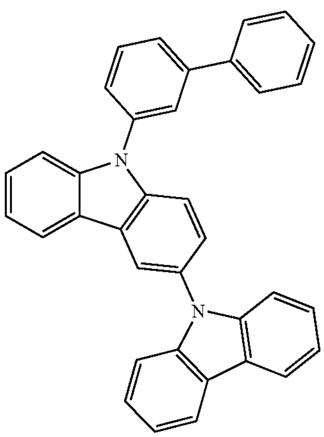
HT-15
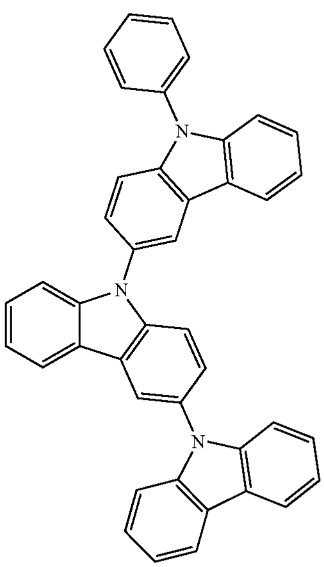
HT-16
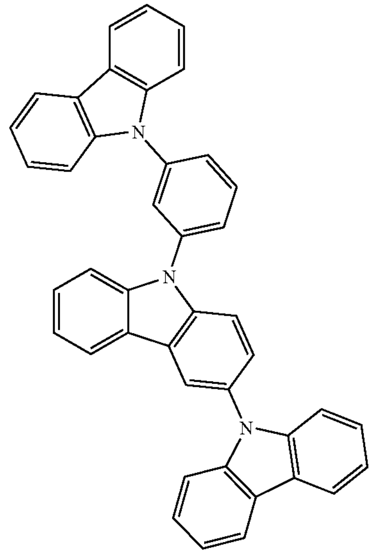
HT-17
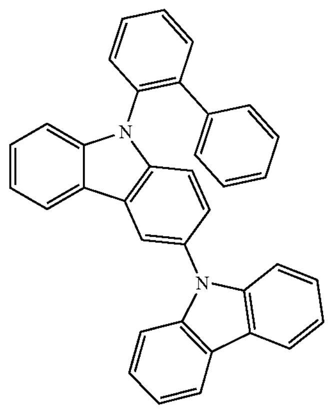
Group II
ET01
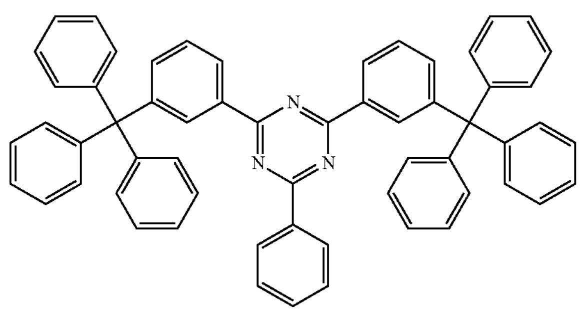
ET02
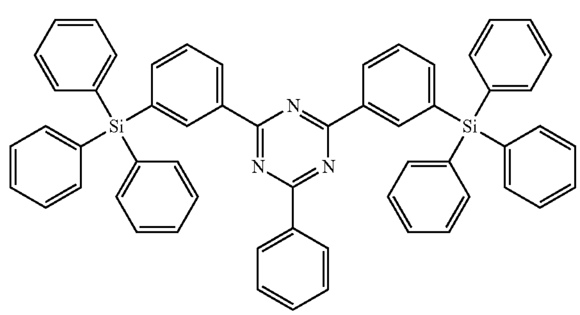

-continued
ET03
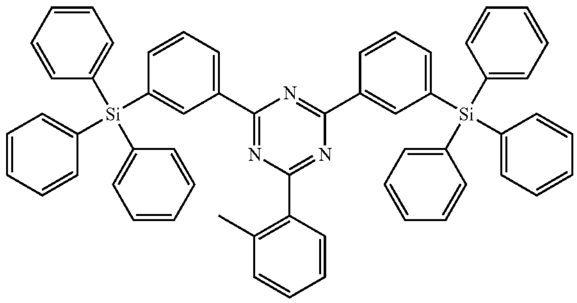
ET04
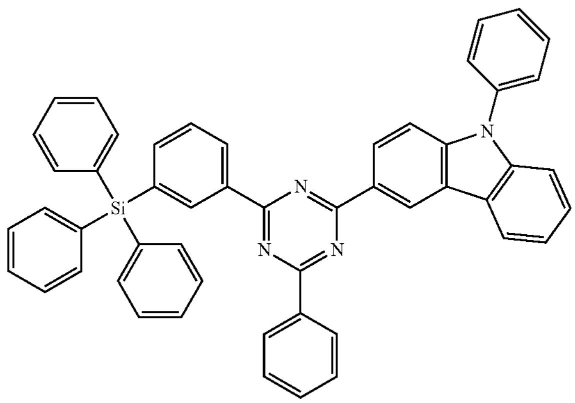
ET05
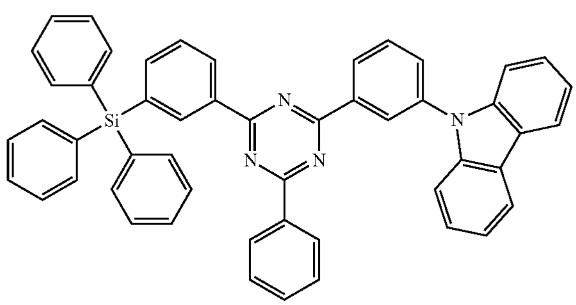
ET06
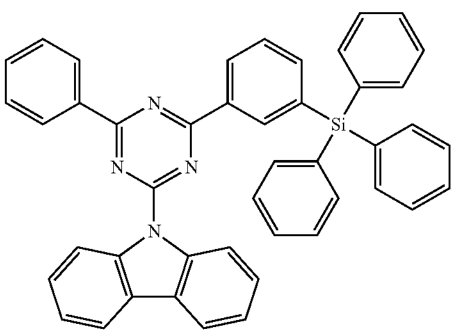
-continued
ET07
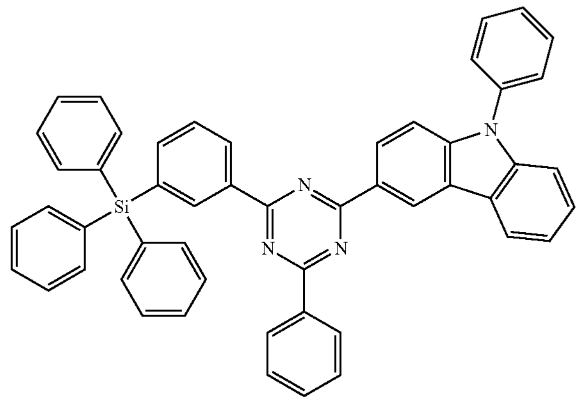
ET08
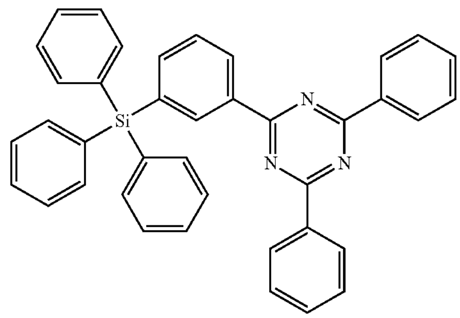
ET09
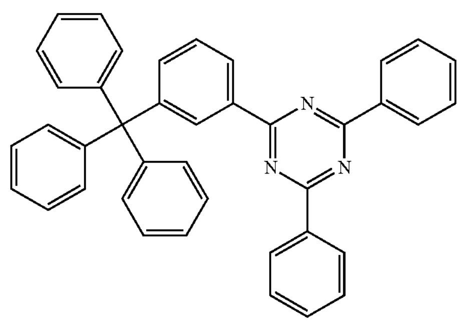
ET010
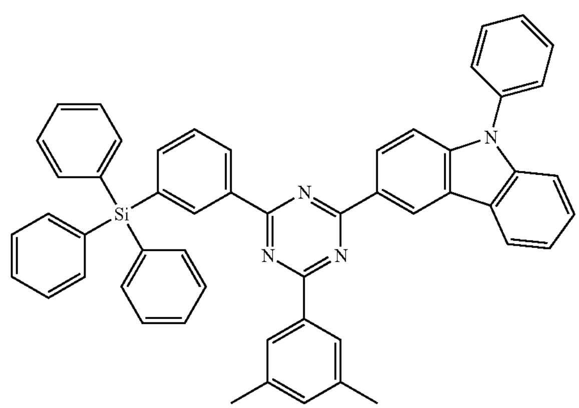

-continued
ET011
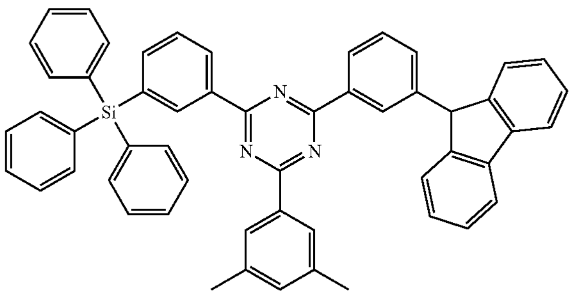
ET012
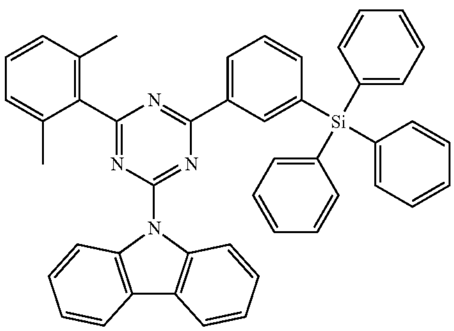
ET013
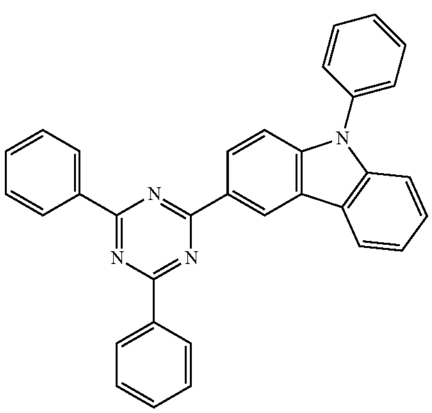
ET014
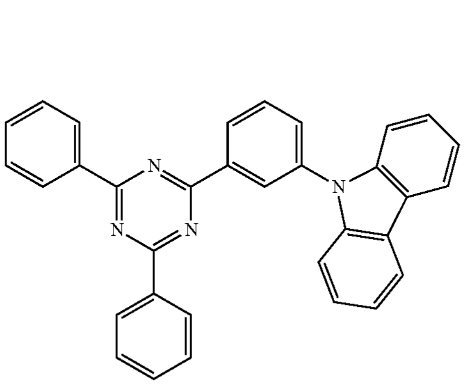
-continued
ET015
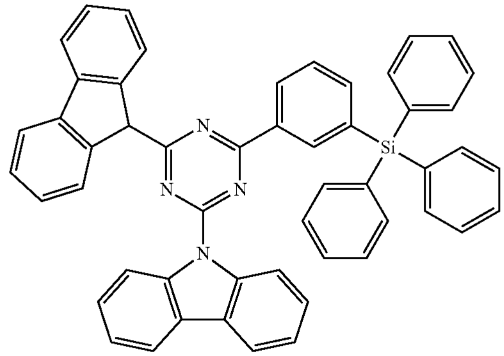
Group III-I
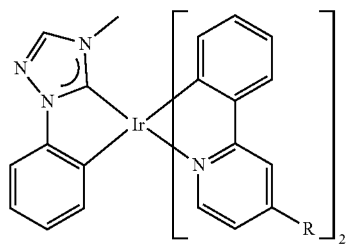
1 (R = H)
2 (R = Me)
3 (R = Iso-Pr)
4 (R = tert-Bu)
5 (R = NMe$^2$)
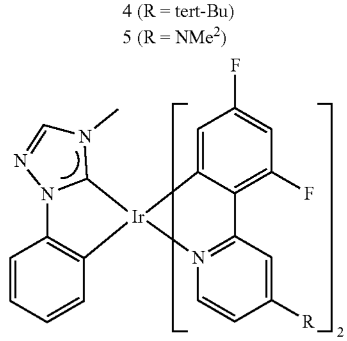
6 (R = H)
7 (R = Me)
8 (R = Iso-Pr)
9 (R = tert-Bu)
10 (R = NMe$^2$)
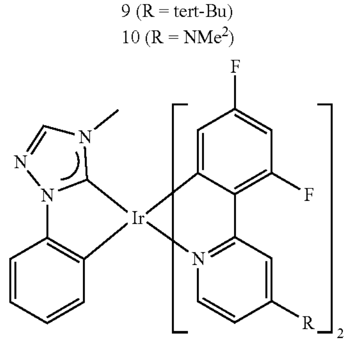
11 (R = H)
12 (R = Me)
13 (R = Iso-Pr)
14 (R = tert-Bu)
15 (R = NMe$^2$)

-continued
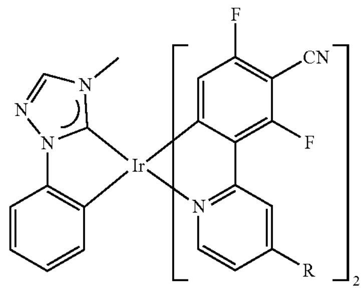
16 (R = H)
17 (R = Me)
18 (R = Iso-Pr)
19 (R = tert-Bu)
20 (R = $NMe^2$)
21
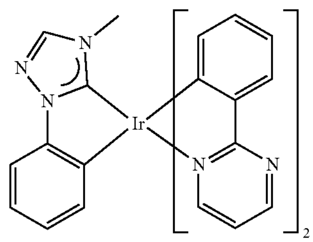
22
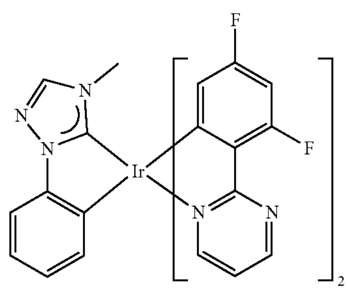
23
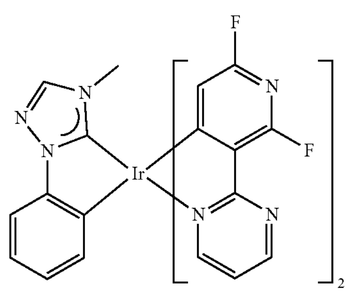
24
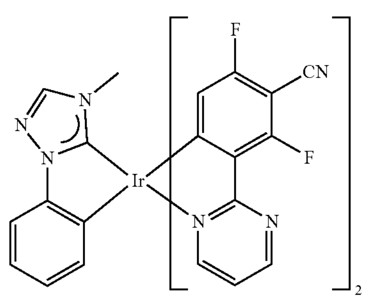
-continued
25
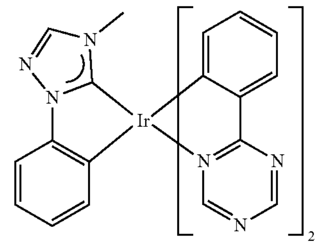
26
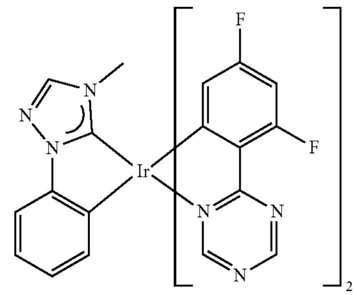
27
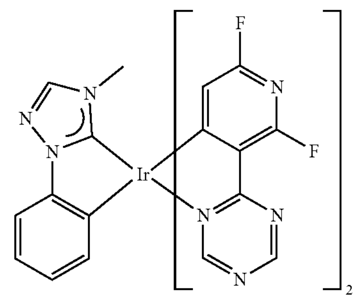
28
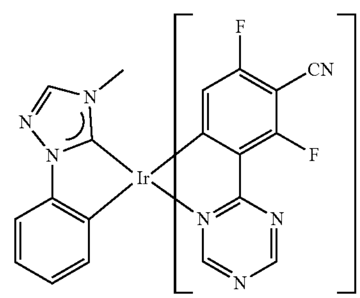
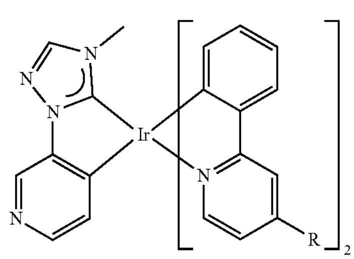
29 (R = H)
30 (R = Me)
31 (R = Iso-Pr)
32 (R = tert-Bu)
33 (R = $NMe^2$)

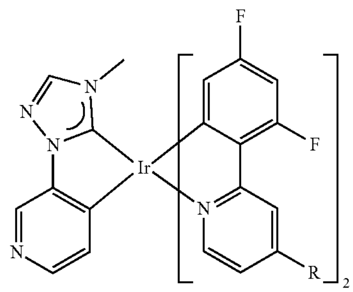
34 (R = H)
35 (R = Me)
36 (R = Iso-Pr)
37 (R = tert-Bu)
38 (R = NMe$^2$)
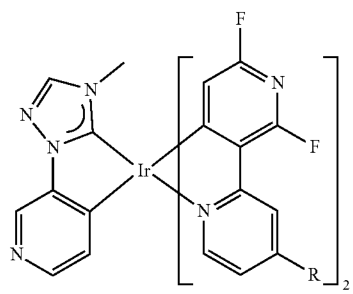
39 (R = H)
40 (R = Me)
41 (R = Iso-Pr)
42 (R = tert-Bu)
43 (R = NMe$^2$)
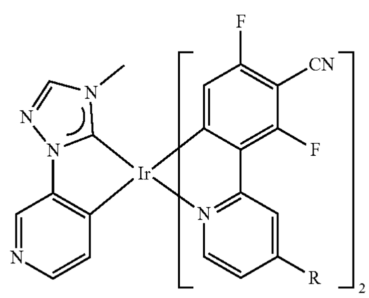
44 (R = H)
45 (R = Me)
46 (R = Iso-Pr)
47 (R = tert-Bu)
48 (R = NMe$^2$)
49
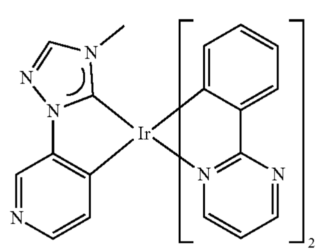
50
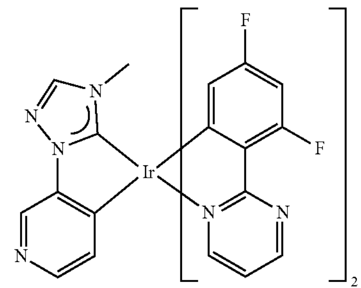
51
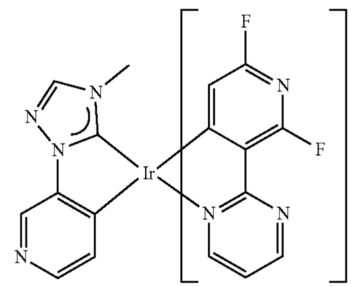
52
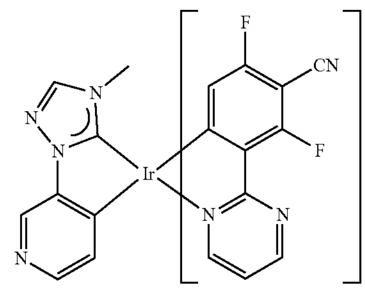
53
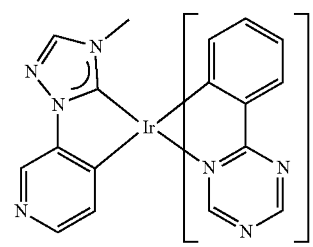
54
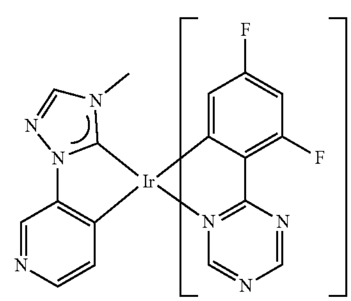

55
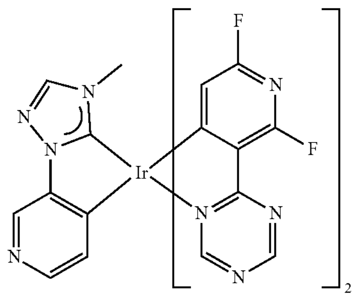
56
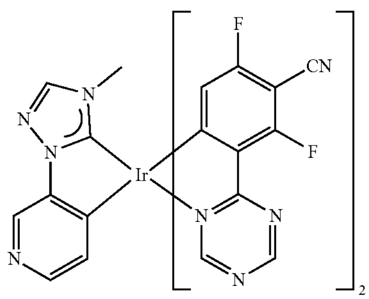
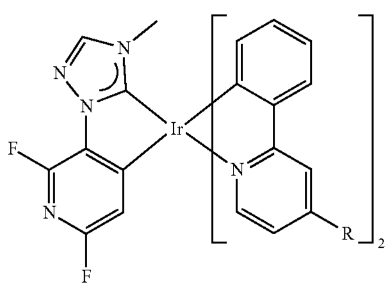
57 (R = H)
58 (R = Me)
59 (R = Iso-Pr)
60 (R = tert-Bu)
61 (R = NMe$^2$)
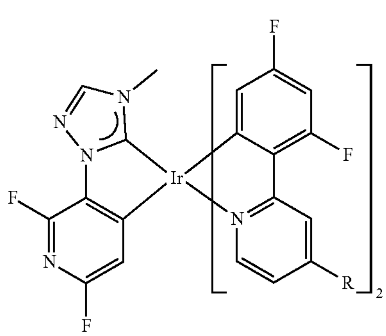
62 (R = H)
63 (R = Me)
64 (R = Iso-Pr)
65 (R = tert-Bu)
66 (R = NMe$^2$)
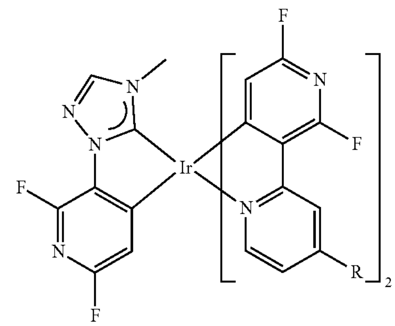
67 (R = H)
68 (R = Me)
69 (R = Iso-Pr)
70 (R = tert-Bu)
71 (R = NMe$^2$)
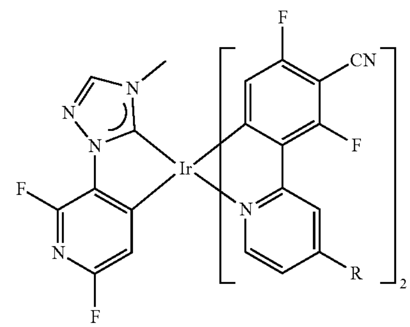
72 (R = H)
73 (R = Me)
74 (R = Iso-Pr)
75 (R = tert-Bu)
76 (R = NMe$^2$)
77
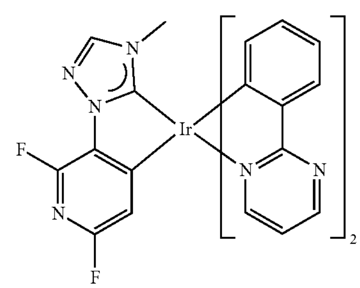
78
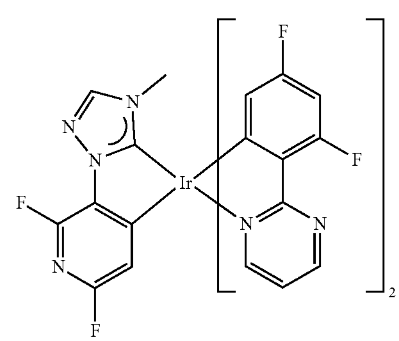

79
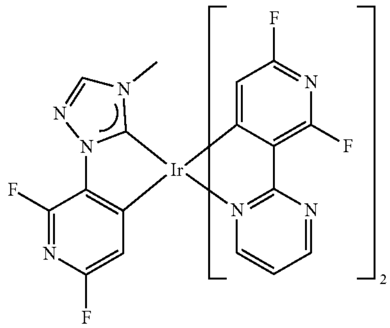
80
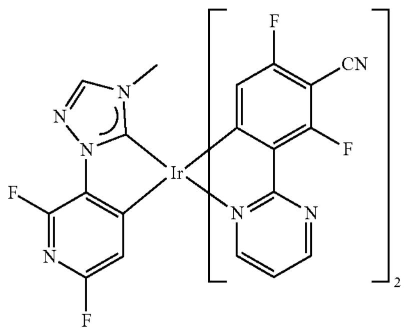
81
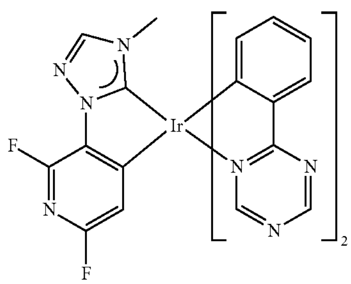
82
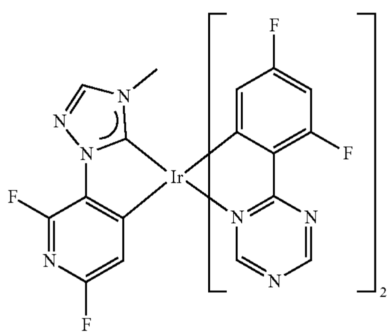
83
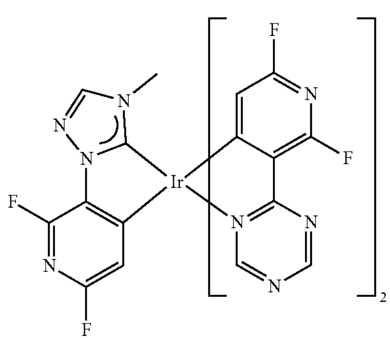
84
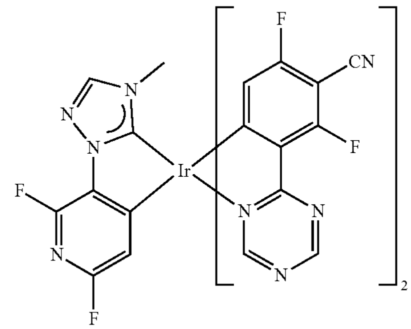
Group III-2
PD1
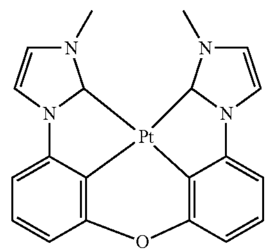
PD2
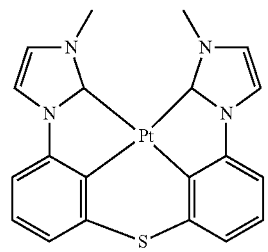
PD3
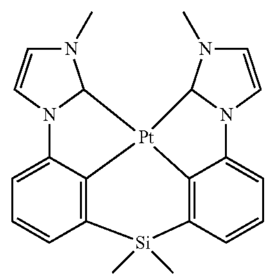
PD4
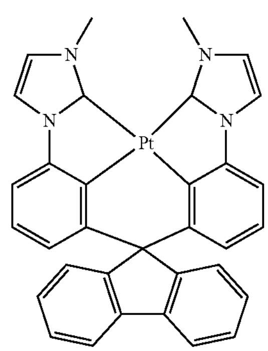

-continued
PD5
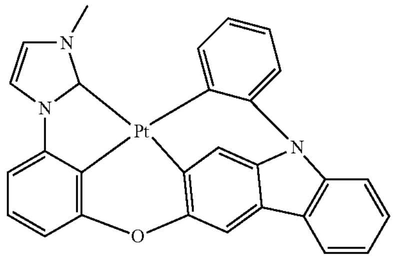
PD6
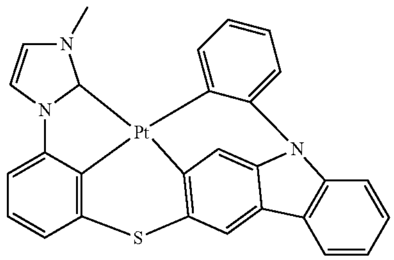
PD7
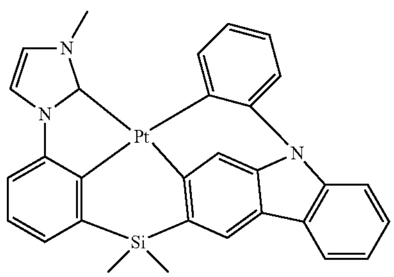
PD8
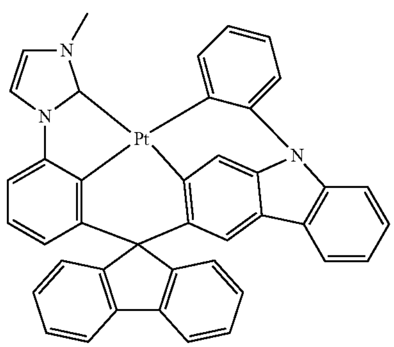
PD9
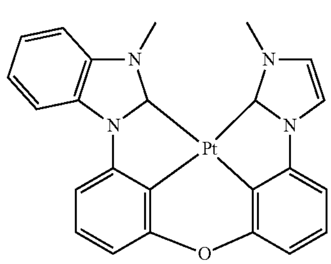
-continued
PD10
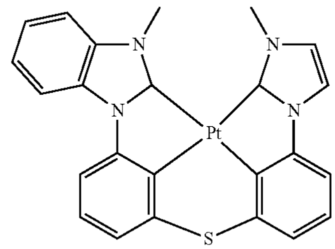
PD11
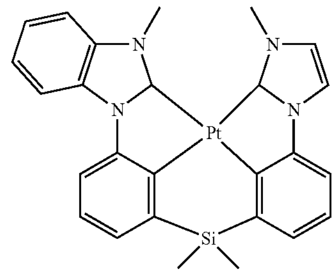
PD12
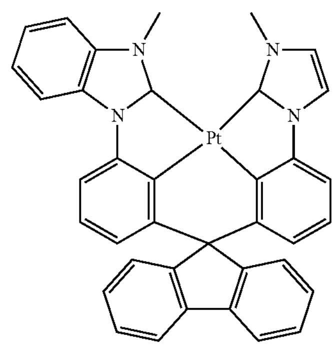
PD13
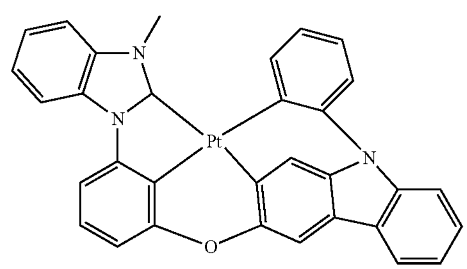
PD14
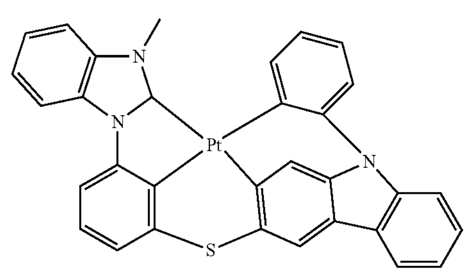

-continued
PD15
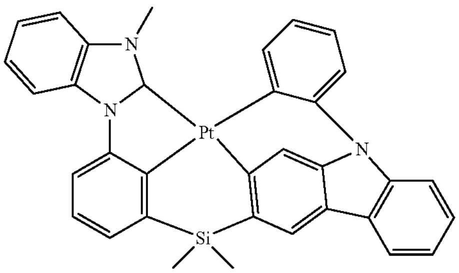
PD16
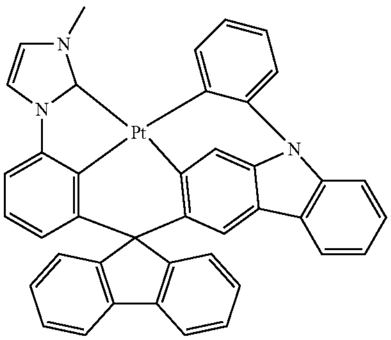
PD17
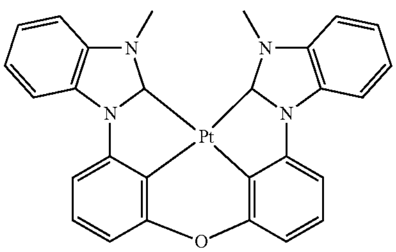
PD18
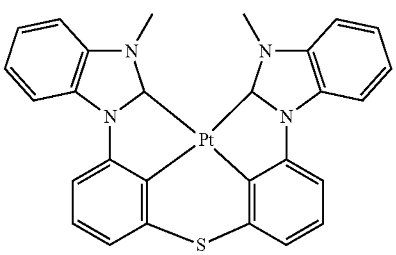
PD19
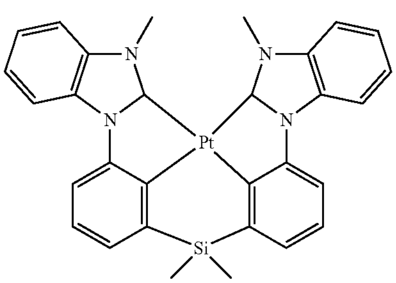
-continued
PD20
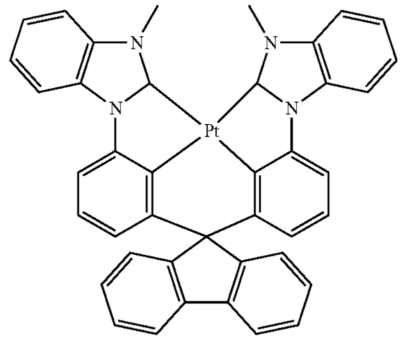
PD21
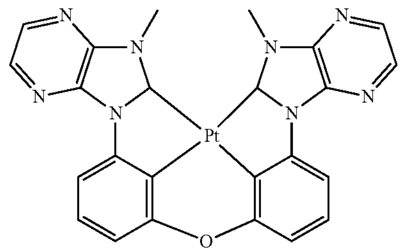
PD22
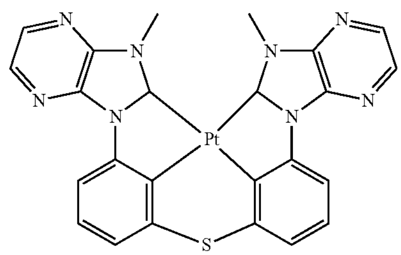
PD23
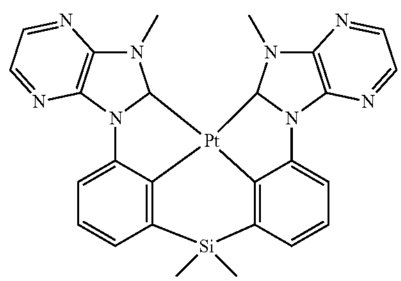
PD24
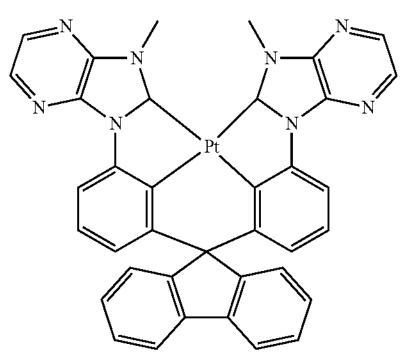

-continued
PD25
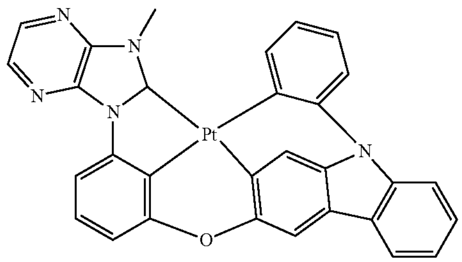
PD26
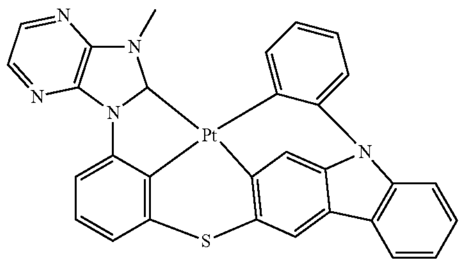
PD27
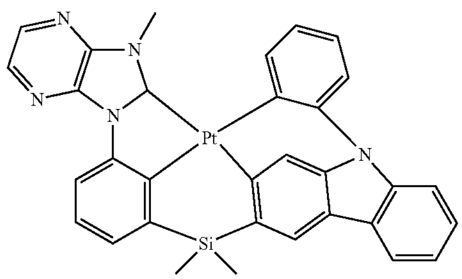
PD28
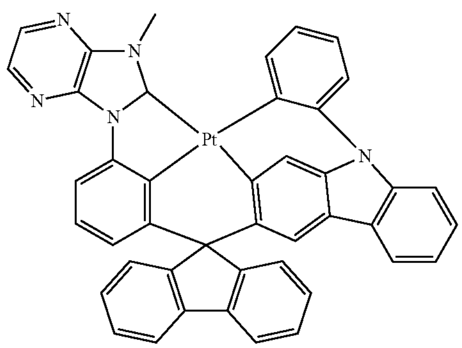
PD29
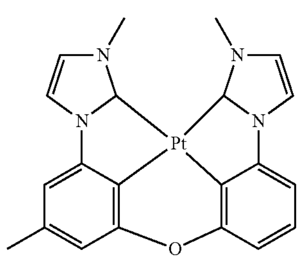
-continued
PD30
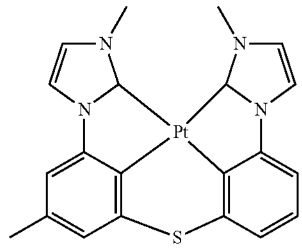
PD31
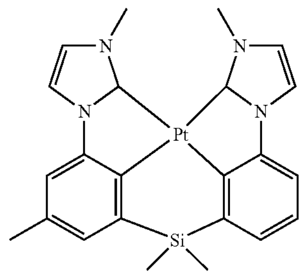
PD32
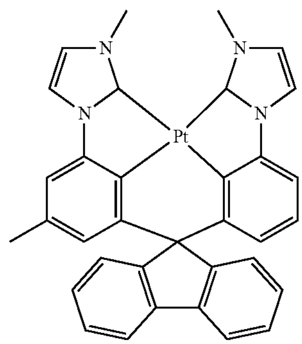
PD33
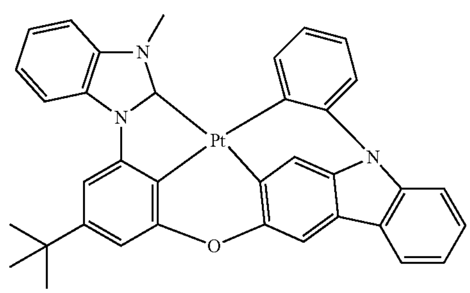
PD34
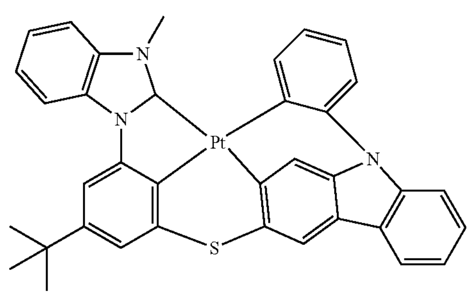

-continued
PD35
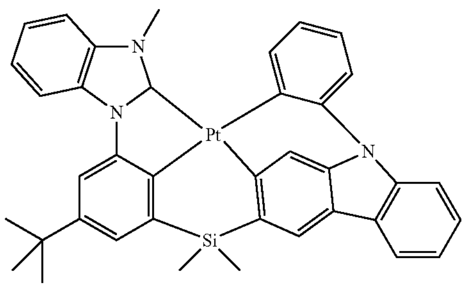
PD36
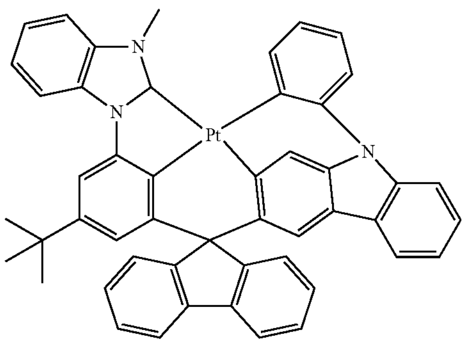
Group IV
DA-01
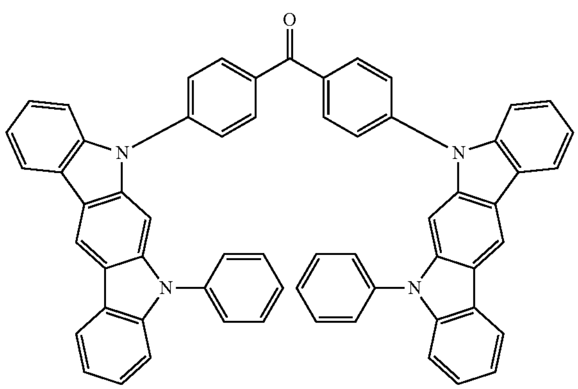
DA-02
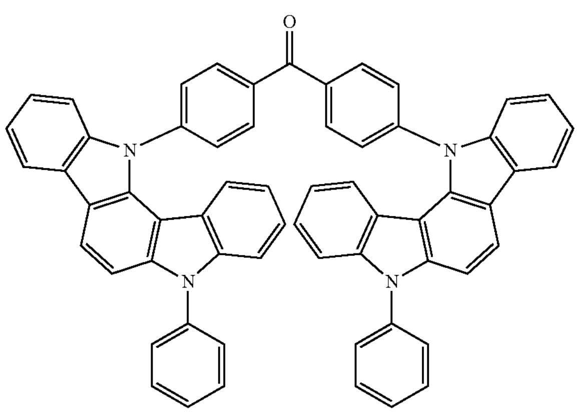
-continued
DA-03
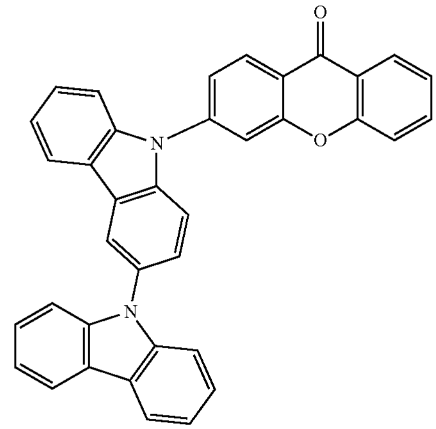
DA-04
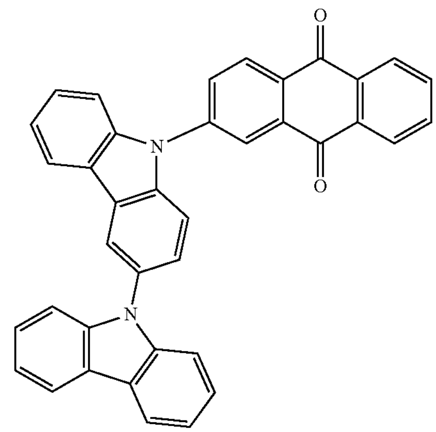
DA-05
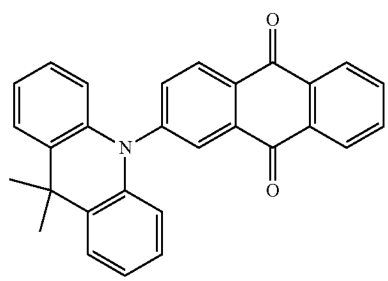
DA-06
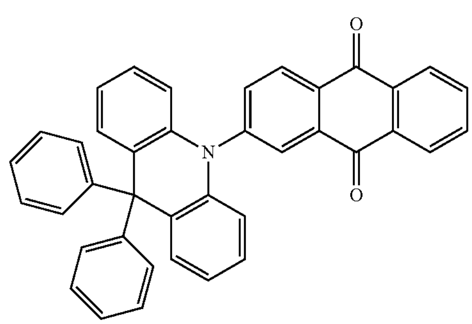

-continued
DA-07
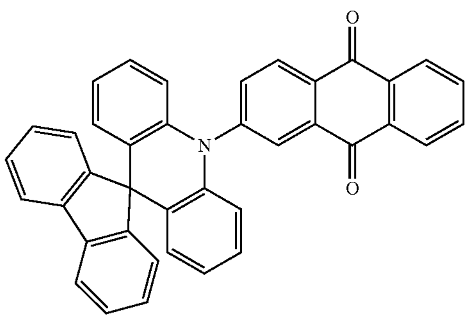
DA-08
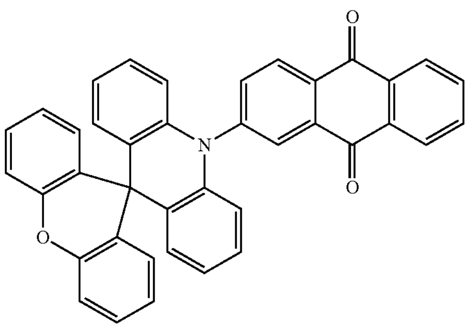
DA-09
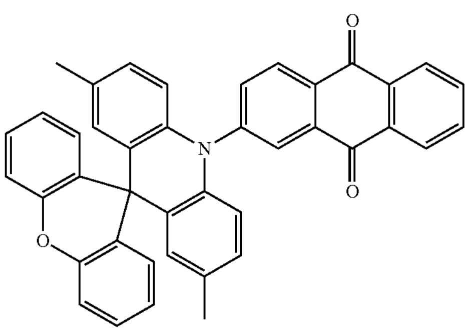
DA-10
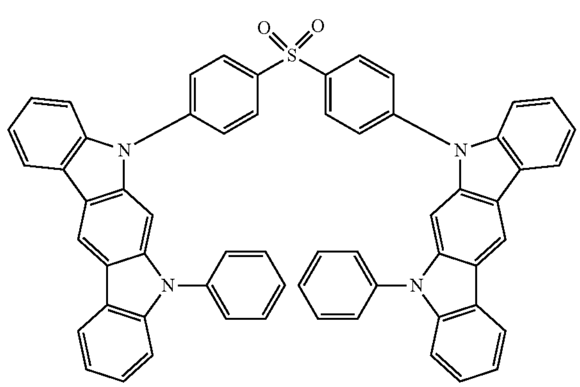
-continued
DA-11
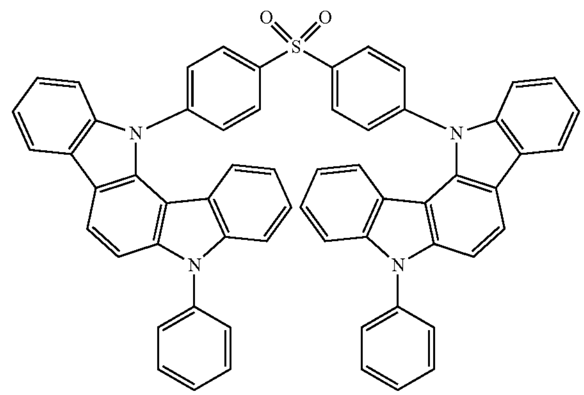
DA-12
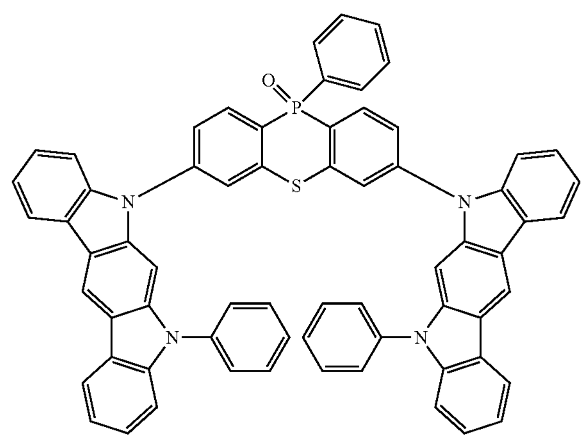
DA-13
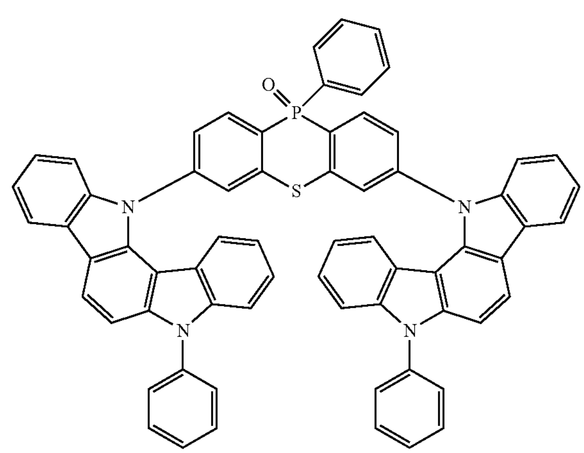

-continued
DA-14
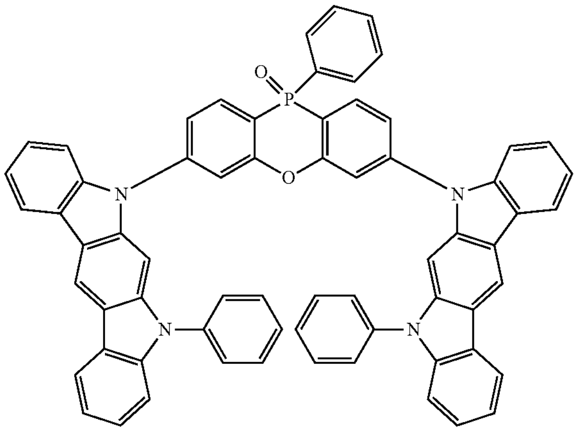
DA-15
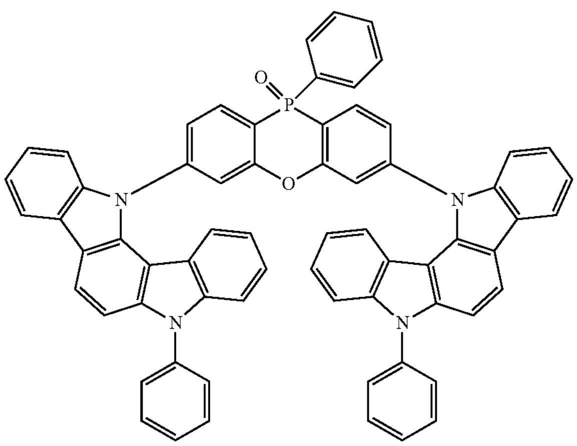
DA-16
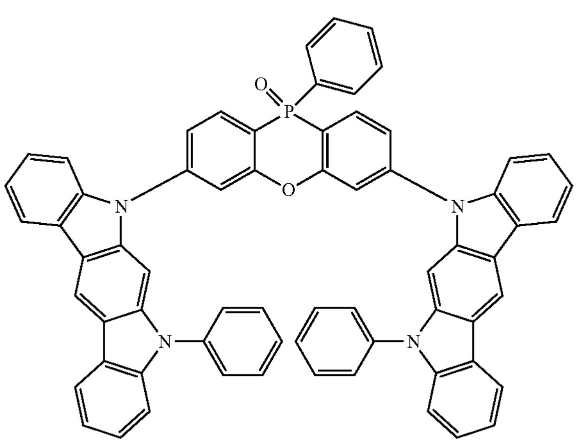
-continued
DA-17
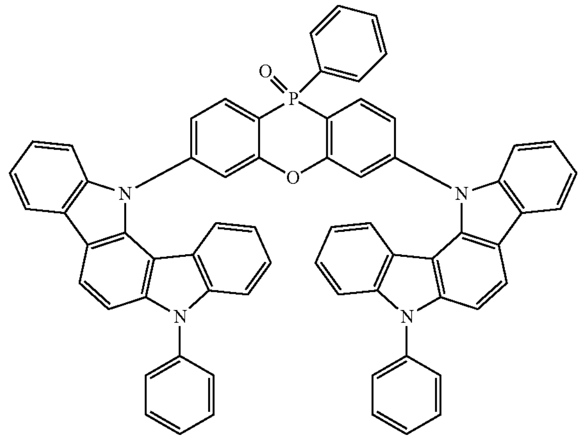
DA-18
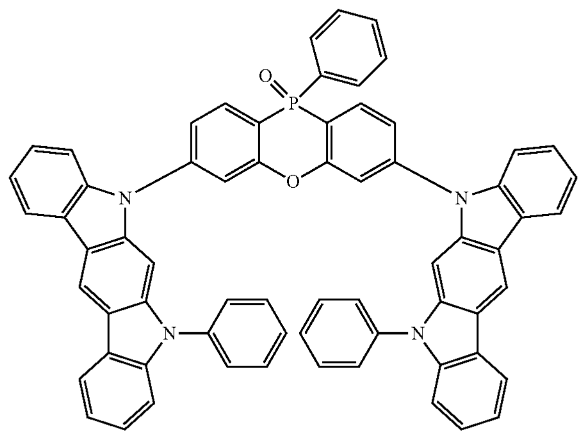
DA-19
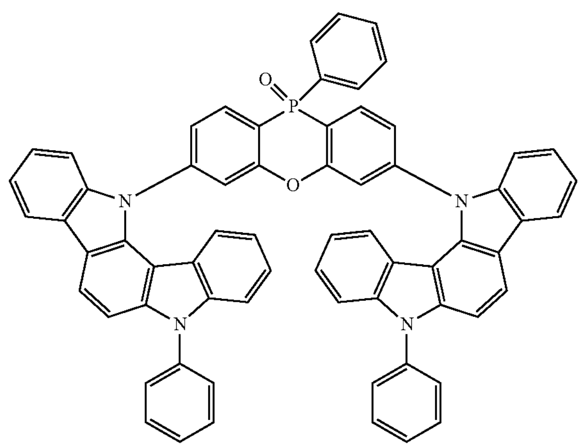
DA-20
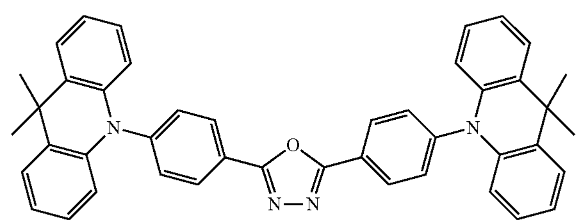

-continued
DA-21
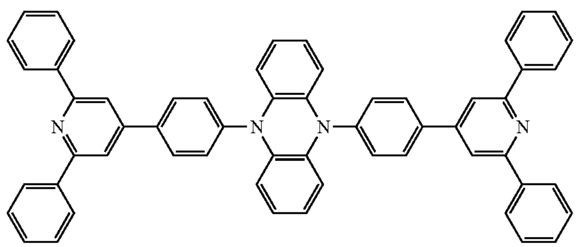
DA-22
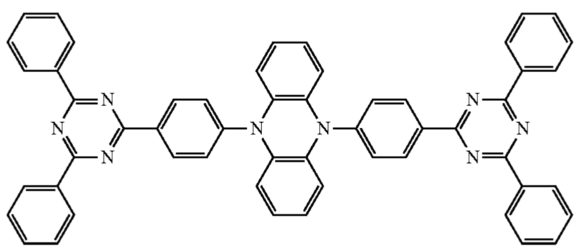
DA-23
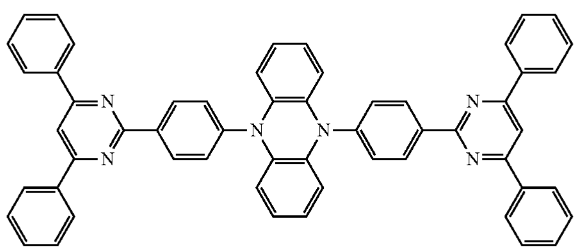
DA-24
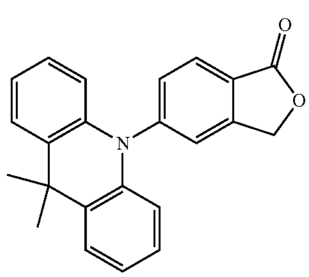
DA-25
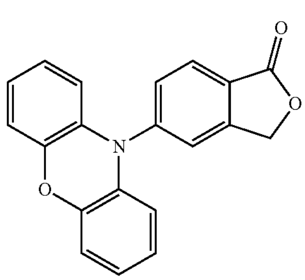
-continued
DA-26
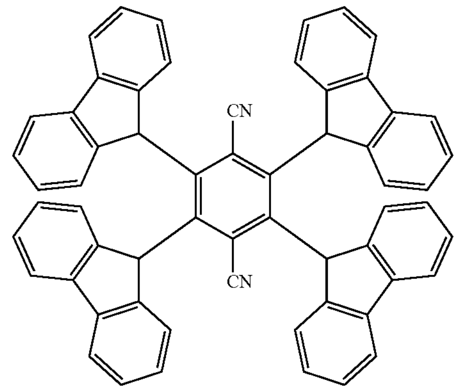
DA-27
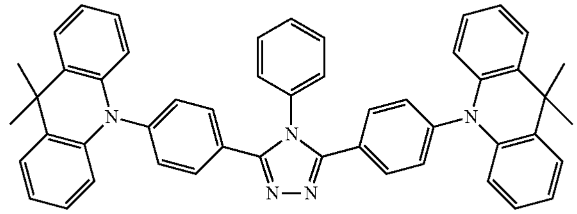
DA-28
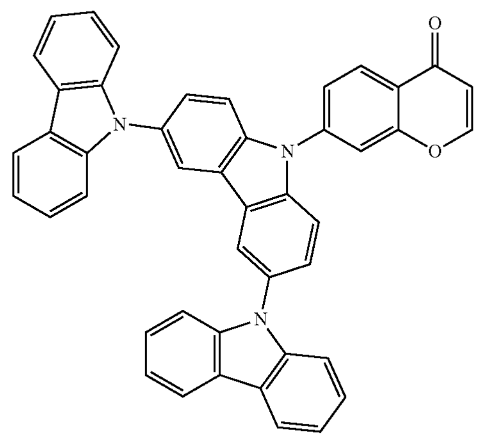
DA-29
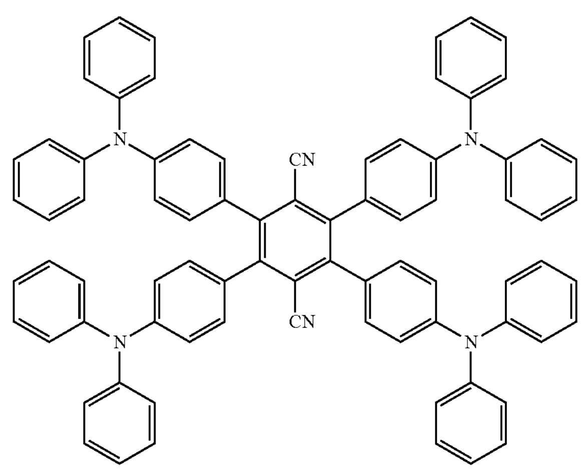

-continued

DA-30

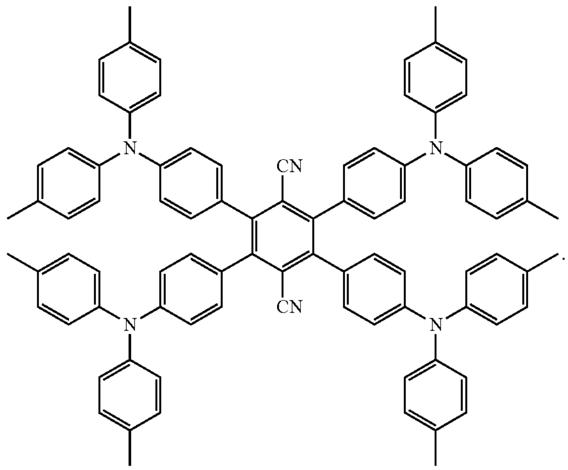

In Group III-I, compounds 1 to 5 are represented by the first structure of this group, with the substituent R respectively defined under the corresponding structure. Compounds 6-20, 29 to 48, and 57 to 76 are defined similarly.

The first compound, the second compound, and the third compound may substantially not emit light. For example, the first compound, the second compound, and the third compound may not emit any light, or light emitted by the first compound, the second compound, and the third compound may only be of an insignificant amount compared to light emitted by the other compounds, e.g., the fourth compound.

In more detail, the third compound may not emit light, and instead, reverse intersystem crossing (RISC) and/or intersystem crossing (ISC) may occur actively therein, thereby causing the triplet excitons generated from the first compound and the second compound to be transferred to the fourth compound.

Accordingly, by transferring the singlet excitons and triplet excitons generated in the emission layer to the fourth compound, an organic light-emitting device having improved efficiency may be obtained. In addition, because an organic light-emitting device having a significantly reduced energy loss is obtained, the life characteristics of the organic light-emitting device may be improved.

In addition, because the exciton is transitioned in the third compound and then transitioned in the fourth compound, the degradation of the fourth compound due to the exciton's energy can be suppressed, thereby improving the life characteristics.

The lowest excitation triplet energy level of the third compound may be from about 2.5 eV to about 3.5 eV. Accordingly, the lowest excitation triplet level of the third compound is higher than the lowest excitation singlet energy level of the fourth compound, so that the lowest triplet excitons of the third compound may be easily transferred to the lowest excitation singlet energy level of the fourth compound.

The fourth compound emits light, and the fourth compound may be a delayed fluorescent emitter. That is, the fourth compound is configured to emit light, and the fourth compound may be a delayed fluorescent emitting material.

In one or more embodiments, the fourth compound may be a thermally activated delayed fluorescent (TADF) emitter.

In one or more embodiments, the ratio of a light-emitting component emitted from the fourth compound to the total light-emitting components emitted from the emission layer may be 80% or more. That is, the ratio of light emitted from the fourth compound to the total light emitted from the emission layer may be 80% or more.

The fourth compound may have a maximum emission wavelength in the range of about 450 nm to about 490 nm, but embodiments of the present disclosure are not limited thereto.

In more detail, the fourth compound in the emission layer may emit blue delayed fluorescent light by receiving energy from the excitons (formed in other compounds) without directly participating in the formation of the excitons.

The fourth compound may satisfy Condition 1:

$$\Delta E_{ST}(C_4) \leq 0.3 \text{ eV} \quad \text{Condition 1}$$

In Condition 1, $\Delta E_{ST}(C4)$ is a difference between the lowest excitation singlet energy level ($E_{S1}(C4)$) and the lowest excitation triplet energy level ($E_{T1}(C4)$) of the fourth compound.

Here, $E_{S1}$ (C4) and $E_{T1}$ (C4) may each be evaluated utilizing the Density Function Theory (DFT) method of Gaussian program which is structure-optimized at a B3LYP/6-31G(d, p) level.

The T1 level of the fourth compound is much higher than the T1 level in a related art (e.g., typical) fluorescent dopant to enable a reverse intersystem crossing (RISC) to S1 level by heat. In the case of the related art (e.g., typical) fluorescent dopant, the T1 level thereof is significantly lower than the T1 level of the phosphorescent dopant, so that the exciton at the T1 level generated by the phosphorescent dopant is actively energy-transferred to the T1 level of the related art (e.g., typical) fluorescent dopant, and is likely to be quenched without the participation in light-emission after the energy transfer. In addition, due to the low T1 level of the fluorescent dopant, the triplet excitons generated in the first compound and the second compound are likely to be quenched without participating in light-emission while transferring to T1 level of the fluorescent dopant, not to T1 level of the phosphorescent dopant. Accordingly, the usage of a fluorescent dopant is not appropriate. However, because the fourth compound has a sufficiently high RISC efficiency even at room temperature, even when the excitons in the T1 level of the phosphorescent dopant move to the T1 level of the delayed fluorescent dopant, the exciton at the T1 level of the delayed fluorescent dopant may be reverse-intersystem transitioned to the S1 level of the delayed fluorescent dopant, and then may be emitted as fluorescence. In other words, the exciton is not quenched). Therefore, the probability of exciton quenching may be reduced (e.g., extremely reduced), so that the luminescent efficiency is significantly (e.g., greatly) increased, and because the exciton is transferred from the phosphorescent dopant to the delayed fluorescent dopant, the degradation of the delayed fluorescent dopant due to the exciton energy is suppressed or reduced and lifespan characteristics may also be improved.

The second compound contains a triazine core, and thus, the second compound has a high T1 energy, thereby reducing or preventing triplet quenching and triple-triple annihilation.

In general, when electrons are not smoothly (e.g., efficiently) provided from the electron transport region to the emission layer, charges are accumulated at the interface between the emission layer and the electron transport region and the interface deteriorates. On the other hands, when holes are not smoothly (e.g., efficiently) provided from the hole transport region to the emission layer, the charge is accumulated at the interface between the emission layer and the hole transport region and the interface deteriorates, thereby resulting in a decrease in the lifespan of an organic light-emitting device.

Because the second compound includes an electron transport moiety, the second compound may be utilized (e.g., easily utilized) to adjust the electron transporting characteristics of the organic light-emitting device, and because the first compound does not include an electron transport moiety, the first compound may be utilized (e.g., easily utilized) to adjust the hole transporting characteristics of the organic light-emitting device. Accordingly, the charge balance in the emission layer of the organic light-emitting device may be enhanced or optimized.

The first compound in the emission layer may be from about 10 wt % to about 90 wt % based on the total weight of the emission layer.

The second compound in the emission layer may be from about 10 wt % to about 90 wt % by weight based on the total weight of the emission layer.

The amount of the third compound in the emission layer may be greater than or equal to that of the fourth compound.

The fourth compound in the emission layer may be from about 0.25 wt % to about 5 wt % by weight based on the total weight of the emission layer.

The amount of the fourth compound may be from about 0.01 parts by weight to about 20 parts by weight per 100 parts by weight of the total amount of the first compound and the second compound.

When the first compound, the second compound, the third compound, and the fourth compound satisfy the above ranges, an organic light-emitting device having improved efficiency and lifespan may be obtained.

In one embodiment, the emission layer may include the first compound, the second compound, the third compound and the fourth compound, but embodiments of the present disclosure are not limited thereto. For example, the emission layer may consists of (i.e., may include only) the first compound, the second compound, the third compound and the fourth compound, but embodiments of the present disclosure are not limited thereto.

In one embodiment, the first electrode is an anode, the second electrode is a cathode, and the organic layer further includes a hole transport region between the first electrode and the emission layer and/or an electron transport region between the emission layer and the second electrode, wherein the hole transport region may include a hole injection layer, a hole transport layer, an emission auxiliary layer, and/or an electron blocking layer, and the electron transport region may include a hole blocking layer, an electron transport layer, and/or an electron injection layer, but embodiments of the present disclosure are not limited thereto.

For example, the hole blocking layer may include a hole blocking material represented by Formula 2.

The hole blocking material may be understood by referring the description of Formula 2 described above.

The hole blocking material may be selected from group II described above.

Description oF FIG. 1

FIG. 1 is a schematic view of an organic light-emitting device 10 in one embodiment. The organic light-emitting device 10 includes a first electrode 110, an organic layer 150, and a second electrode 190.

Hereinafter, the structure of the organic light-emitting device 10 according to an embodiment and a manufacturing method thereof according to an embodiment will be described in connection with FIG. 1.

First Electrode 110

Referring to FIG. 1, a substrate may be additionally located under the first electrode 110 or above the second electrode 190. The substrate may be a glass substrate or a plastic substrate, each having suitable (e.g., excellent) mechanical strength, thermal stability, transparency, surface smoothness, ease of handling, and/or water resistance.

The first electrode 110 may be, for example, formed by depositing or sputtering a material to form the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, the material for forming the first electrode 110 may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 110 is a semi-transmissive electrode or a reflective electrode, the material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 is disposed on the first electrode 110. The organic layer 150 may include an emission layer.

The organic layer 150 may further include a hole transport region between the first electrode 110 and the emission layer and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in the stated order, but the structure of the hole transport region is not limited thereto.

In one embodiment, the hole transport region may include at least one selected from m-MTDATA, TDATA, 2-TNATA, NPB(NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, and a compound represented by Formula 202 below:

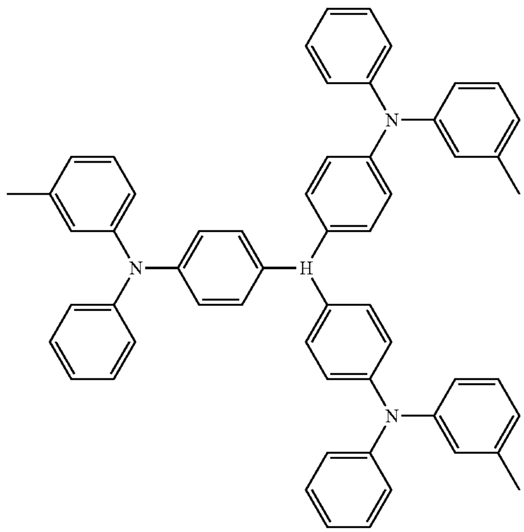

m-MTDATA

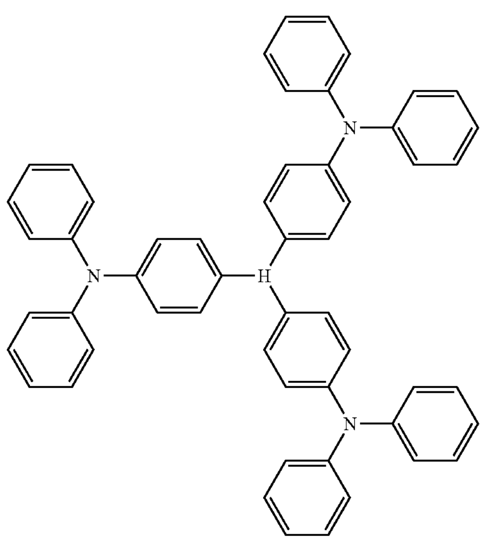

TDATA

-continued

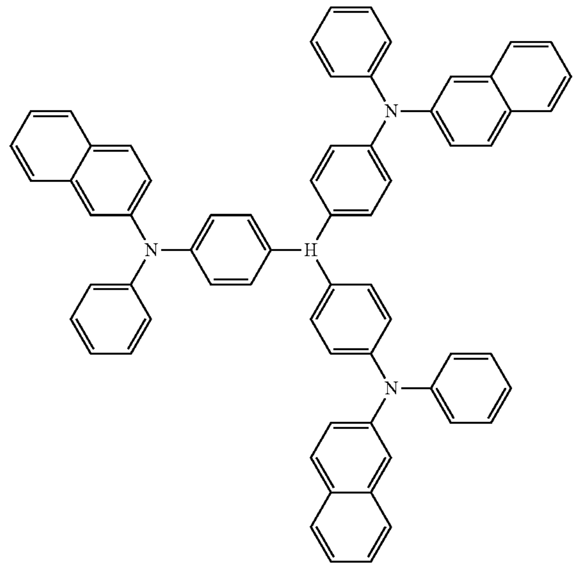

2-TDATA

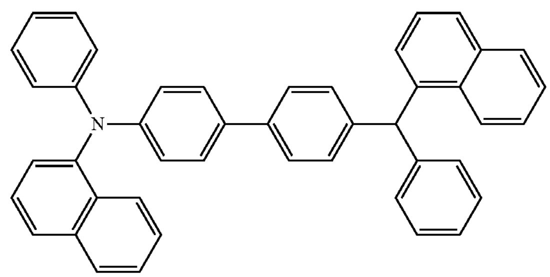

NPB

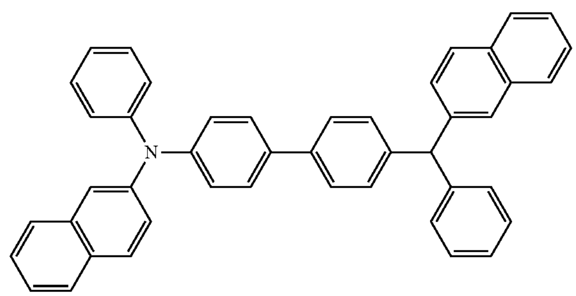

β-NPB

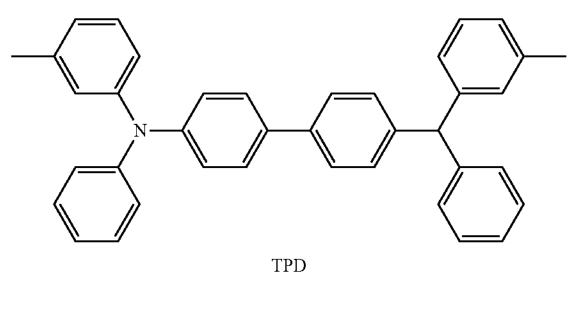

TPD

-continued

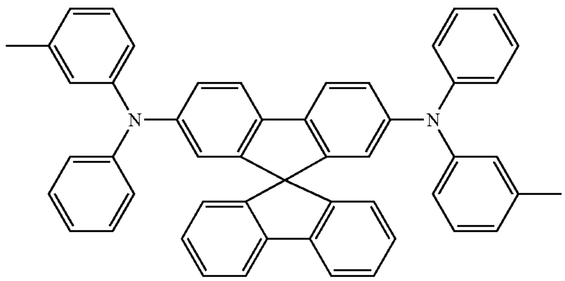

Spiro-TPD

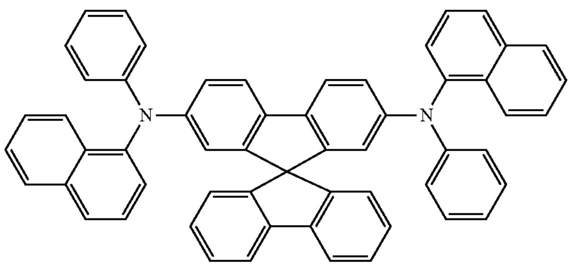

Spiro-NPB

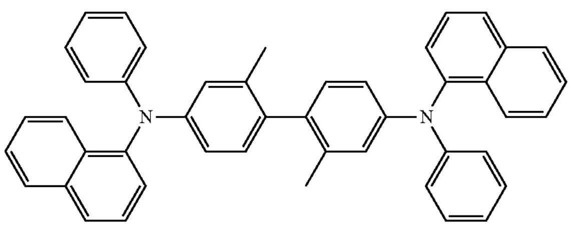

methylated NPB

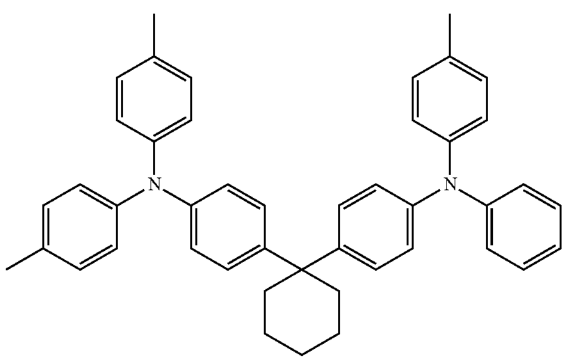

TAPC

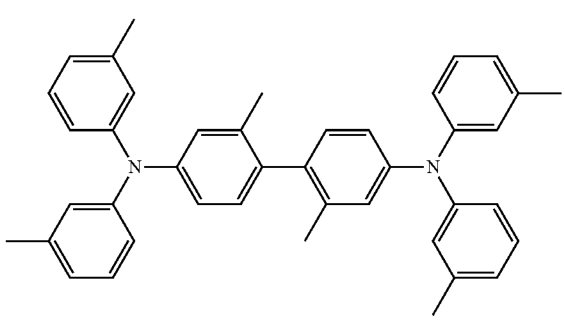

HMTPD

Formula 201

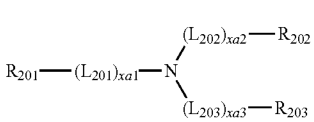

-continued

Formula 202

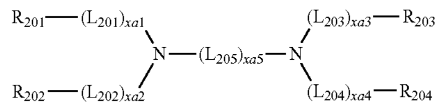

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$) *', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ are the same as described above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked to each to each other via a single bond, and/or ii) $R_{203}$ and $R_{204}$ may be linked to each other via a single bond.

In one or more embodiments, $R_{201}$ to $R_{204}$ in Formula 202 may each independently be selected from:

a carbazolyl group; and a carbazolyl group substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201-1:

Formula 201-1

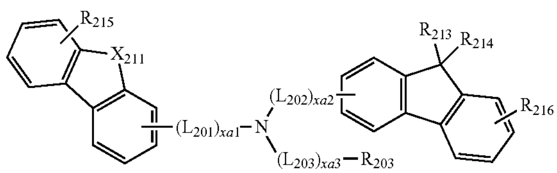

In one embodiment, the compound represented by Formula 201 may be represented by Formula 201-2, but embodiments of the present disclosure are not limited thereto:

Formula 201-2

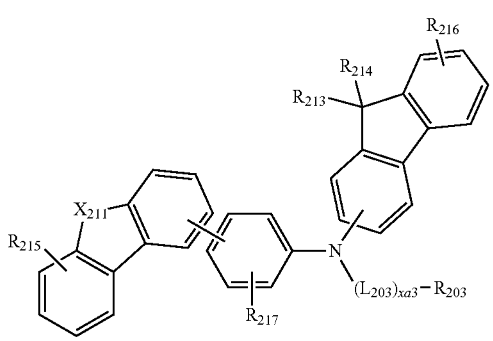

In one or more embodiments, the compound represented by Formula 201 may be represented by Formula 201-2(1) below, but embodiments of the present disclosure are not limited thereto:

Formula 201-2(1)

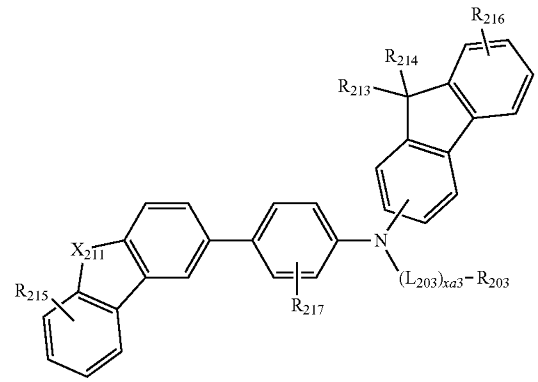

In one or more embodiments, the compound represented by Formula 201 may be represented by Formula 201A below:

Formula 201A

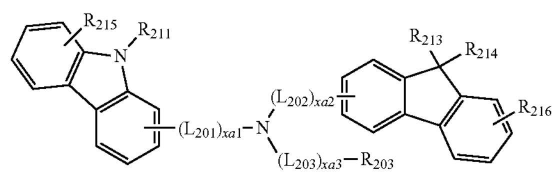

In one or more embodiments, the compound represented by Formula 201 may be represented by Formula 201A(1) below, but embodiments of the present disclosure are not limited thereto:

Formula 201A(1)

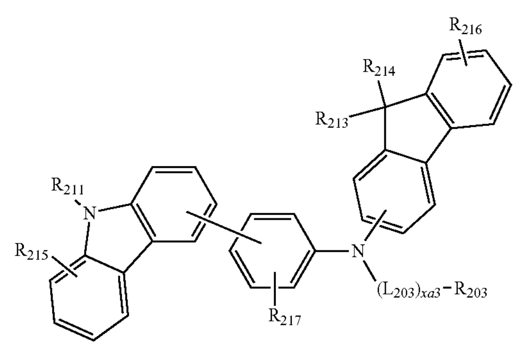

In one or more embodiments, the compound represented by Formula 201 may be represented by Formula 201A-1 below, but embodiments of the present disclosure are not limited thereto:

Formula 201A-1

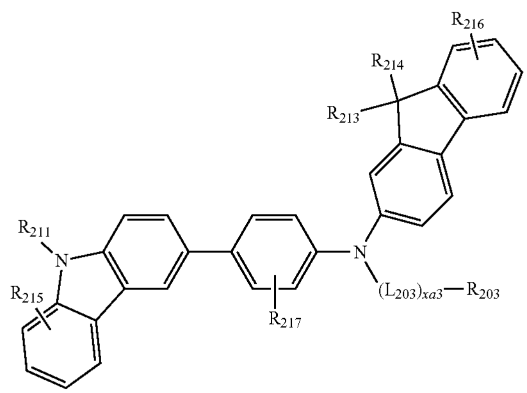

In one embodiment, the compound represented by Formula 202 may be represented by Formula 202-1 below:

Formula 202-1

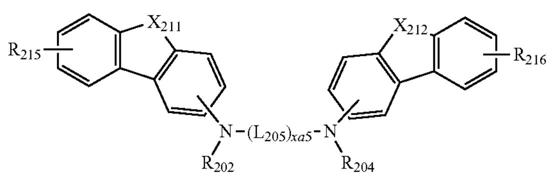

In one or more embodiments, the compound represented by Formula 202 may be represented by Formula 202-1(1) below:

Formula 202-1(1)

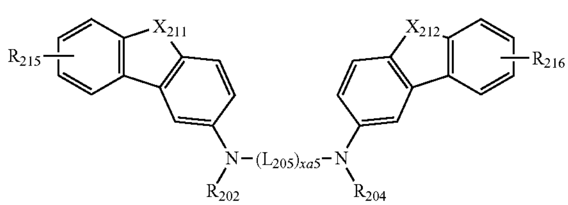

In one or more embodiments, the compound represented by Formula 202 may be represented by Formula 202A below:

Formula 202A

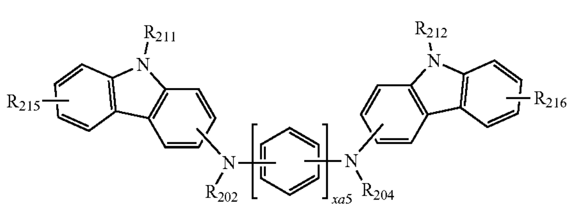

In one or more embodiments, the compound represented by Formula 202 may be represented by Formula 202A-1 below:

Formula 202A-1

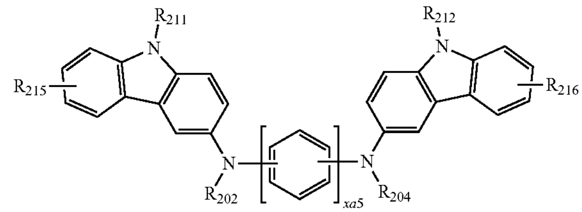

In Formulae 201-1, 201-2, 201-2(1), 201A, 201A(1), 201A-1, 202-1, 202-1(1), 202A, and 202A-1, $L_{201}$ to $L_{203}$, xa1 to xa3, xa5, and $R_{202}$ to $R_{204}$ may each be understood by referring to the corresponding descriptions thereof provided above, $L_{205}$ may be selected from a phenylene group and a fluorenylene group, $X_{211}$ may be selected from O, S, and $N(R_{211})$, $X_{212}$ may be selected from O, S, and $N(R_{212})$, $R_{211}$ and $R_{212}$ may each be understood by referring to the description presented in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT48, but embodiments of the present disclosure are not limited thereto:

-continued
HT1
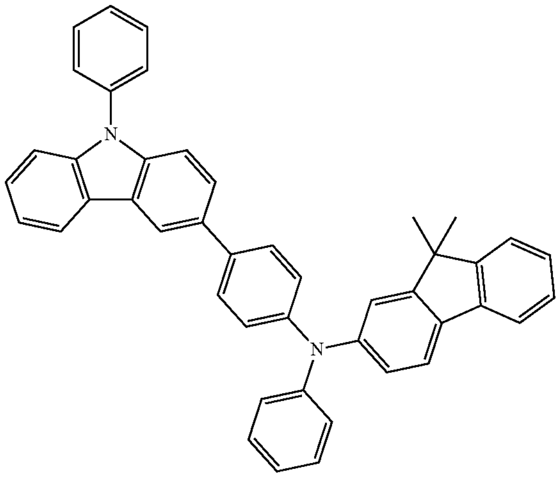
HT2
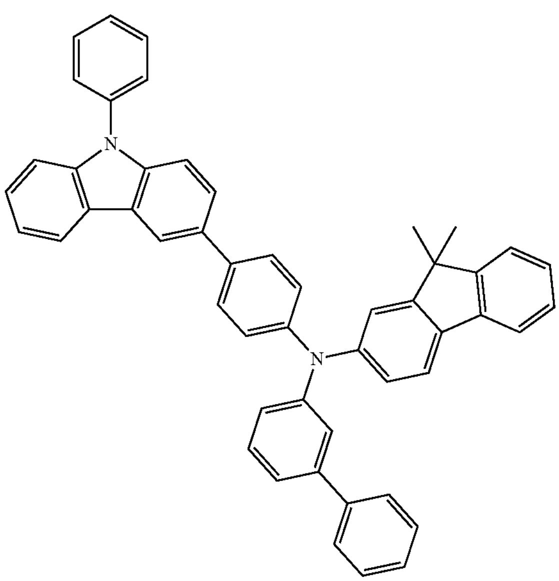
HT3
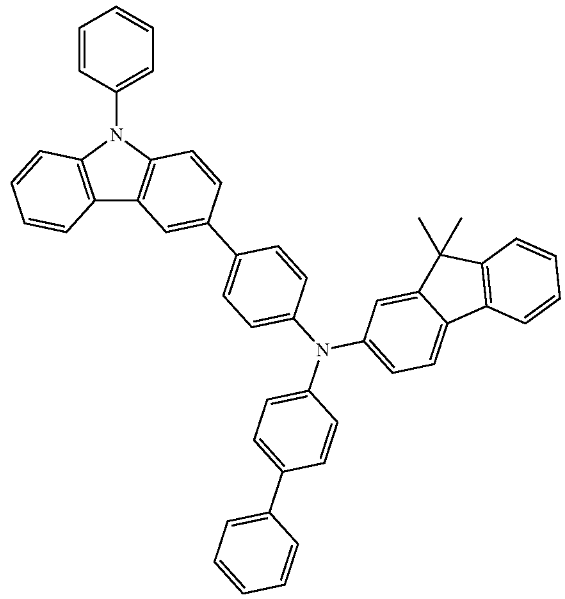
HT4
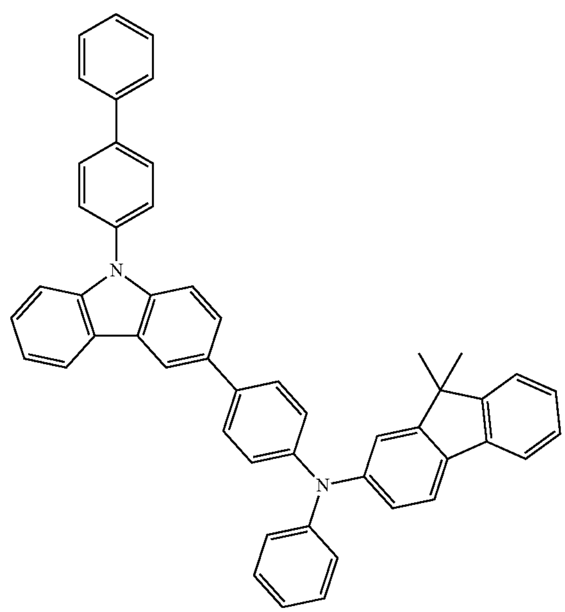

HT5
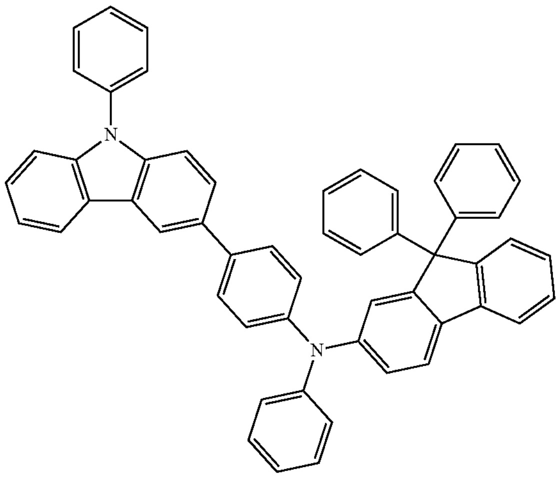
HT6
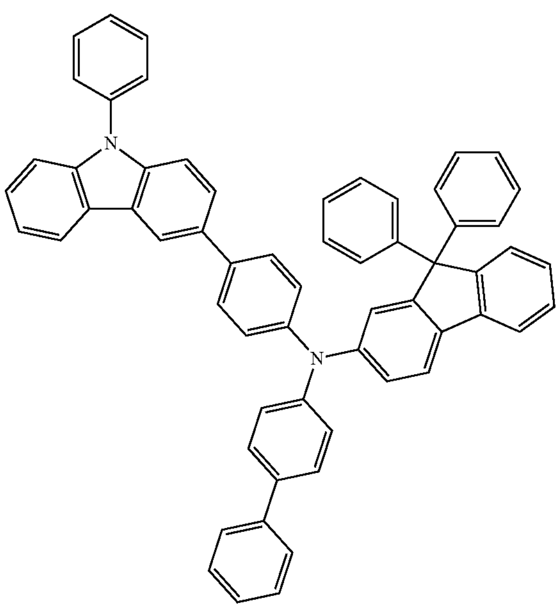
HT7
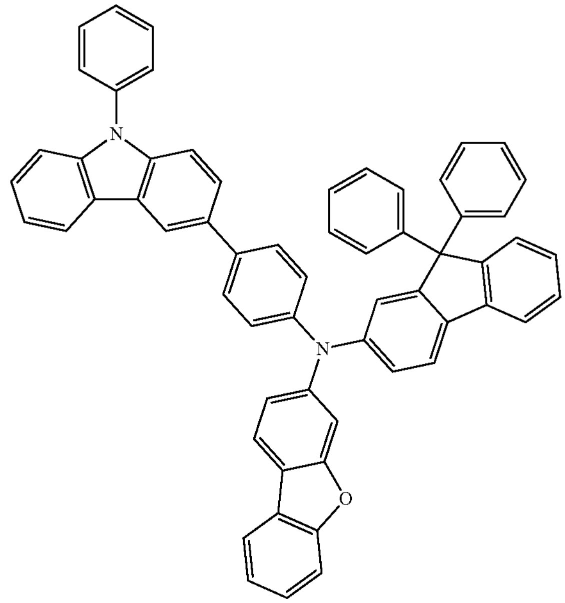
HT8
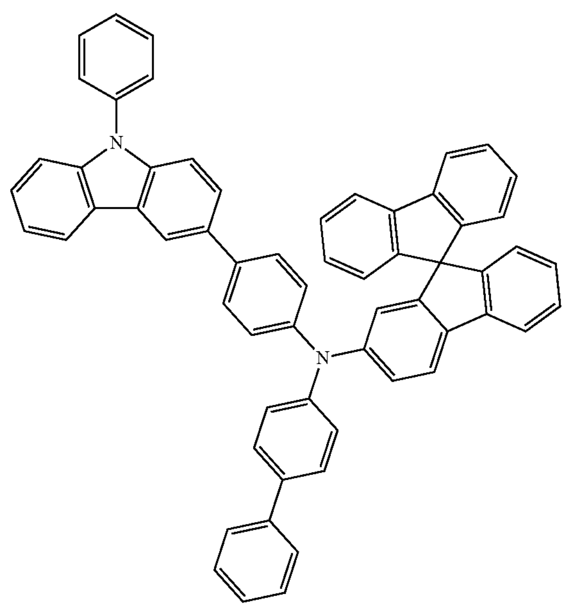

-continued
HT9
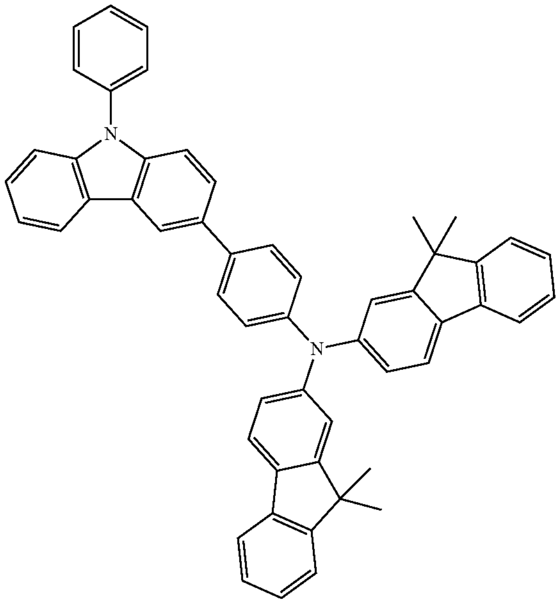
HT10
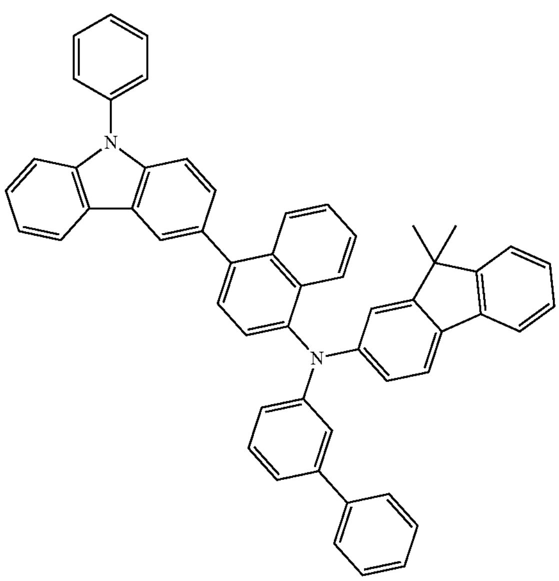
-continued
HT11
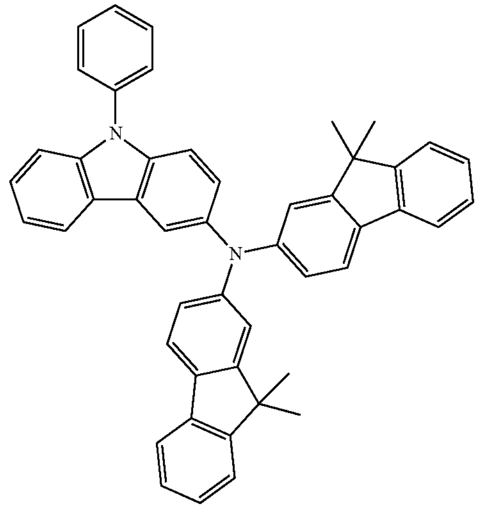
HT12
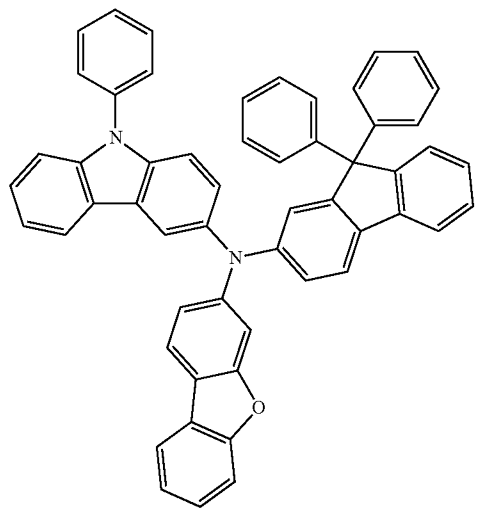
HT13
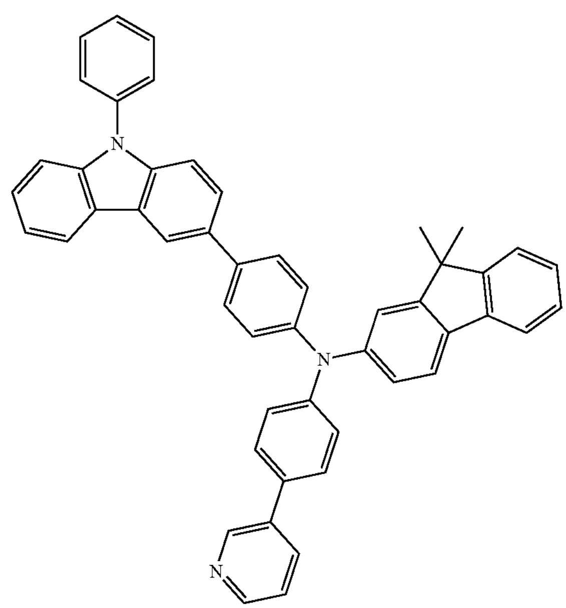

-continued
HT14
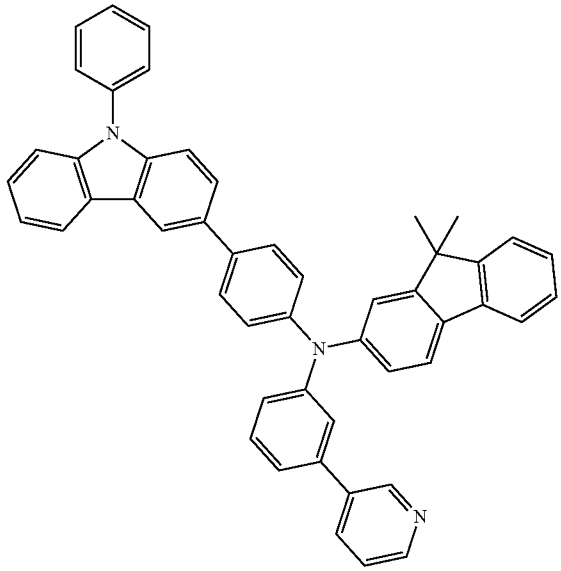
HT15
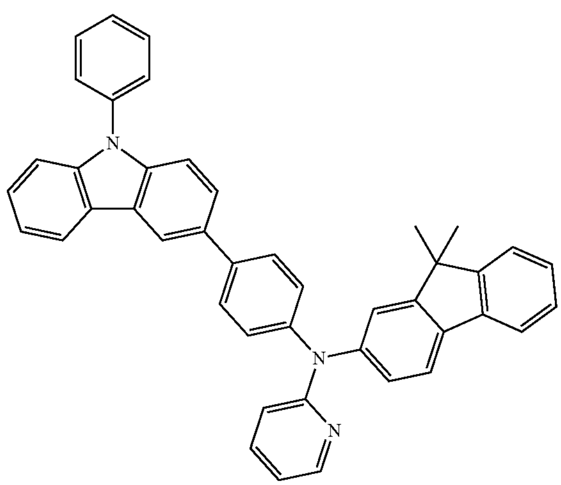
HT16
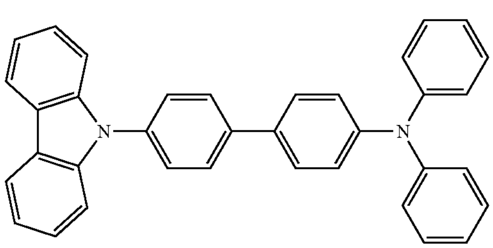
-continued
HT17
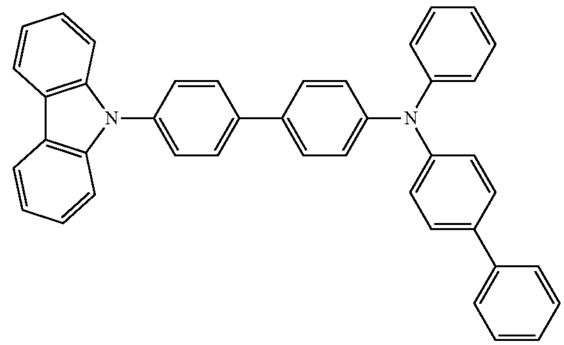
HT18
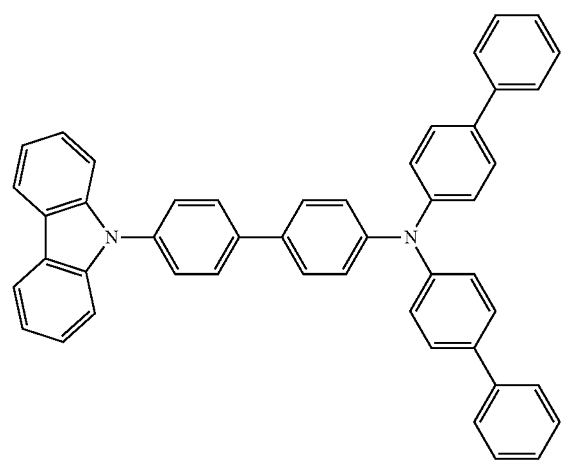
HT19
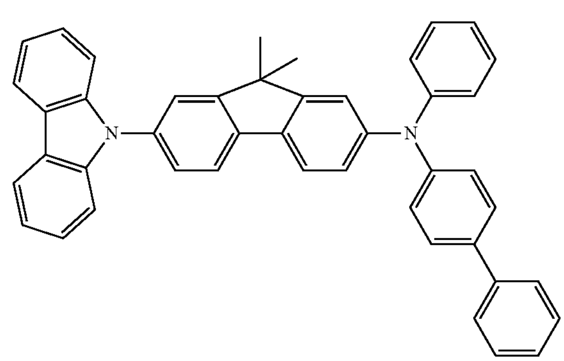

-continued
HT20
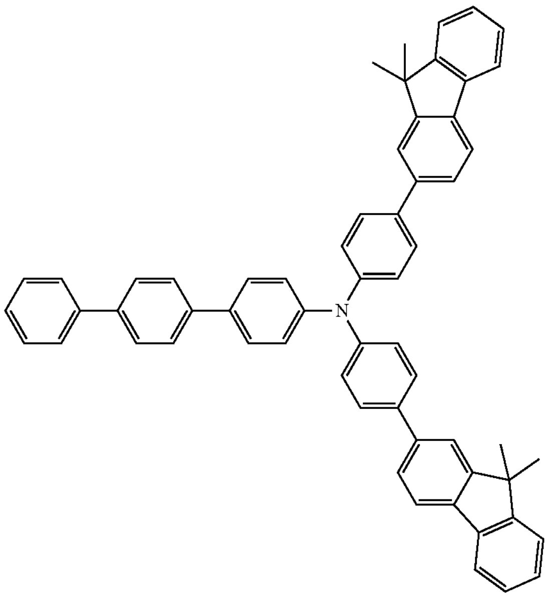
HT21
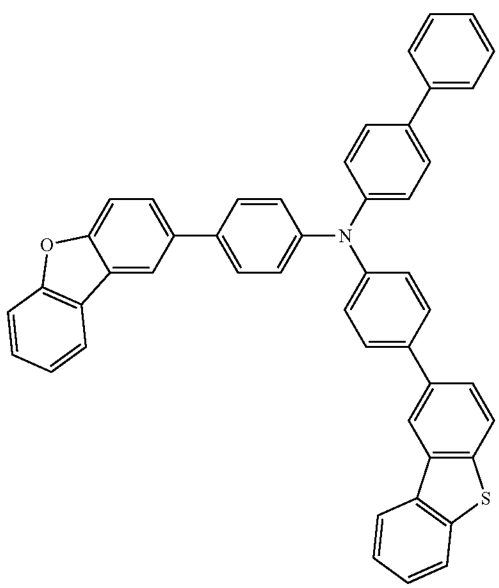
HT22
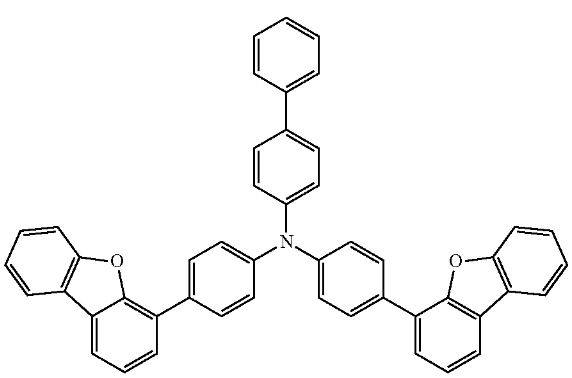
-continued
HT23
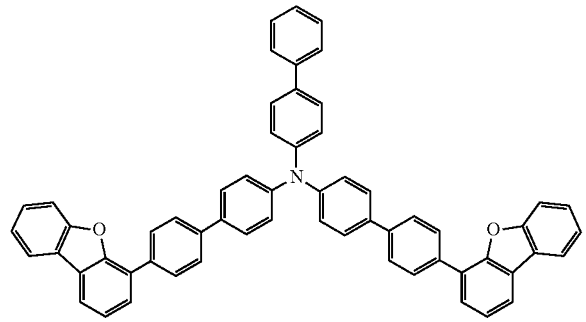
HT24
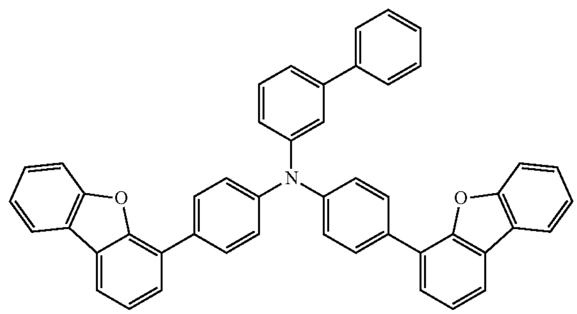
HT25
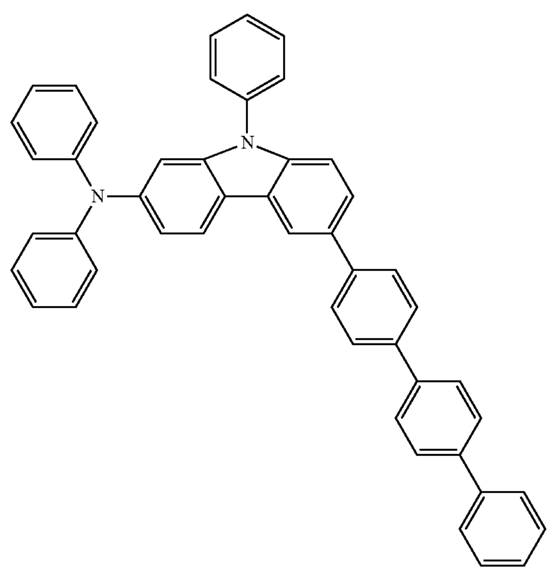

HT26
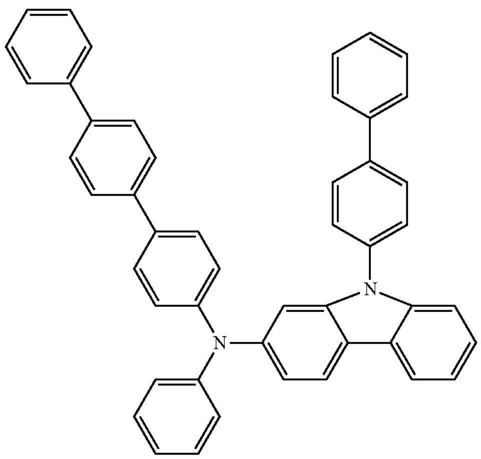
HT27
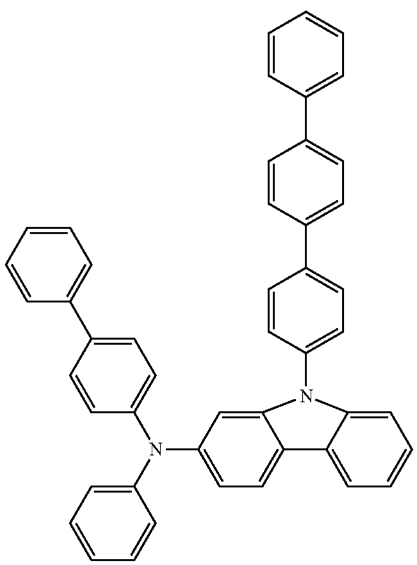
HT28
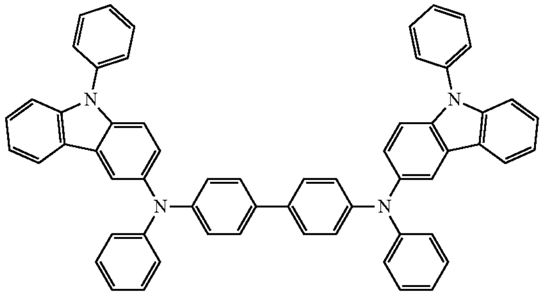
HT29
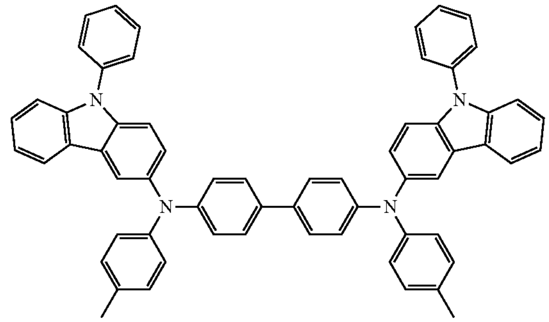
HT30
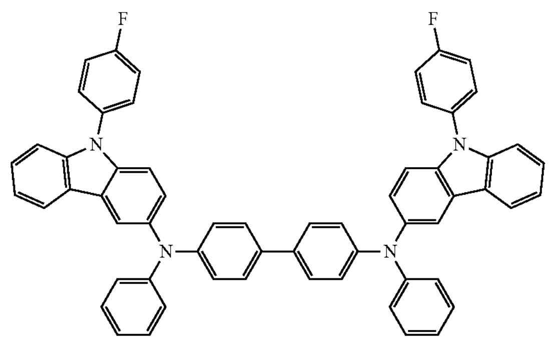
HT31
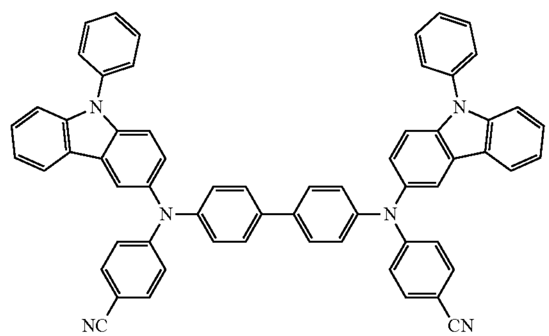
HT32
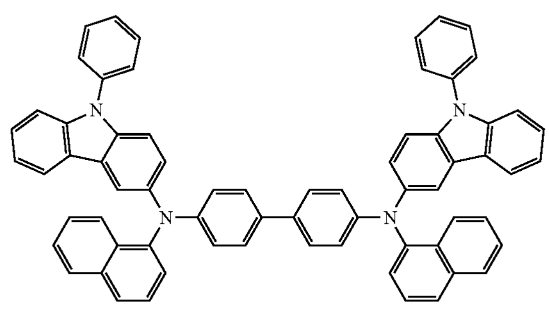

-continued
HT33
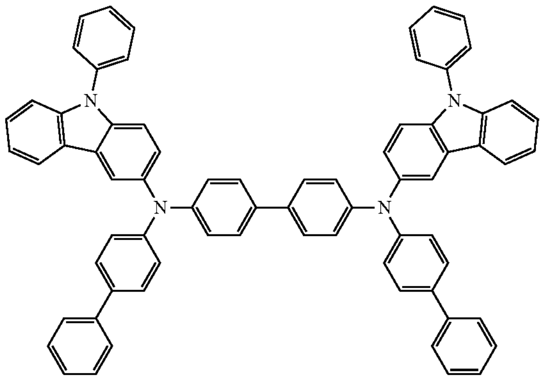
HT34
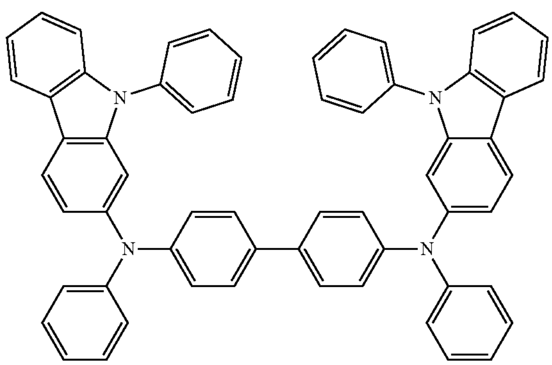
HT35
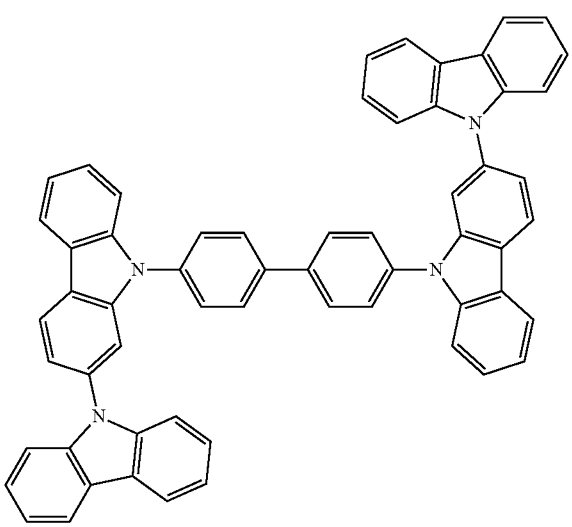
-continued
HT36
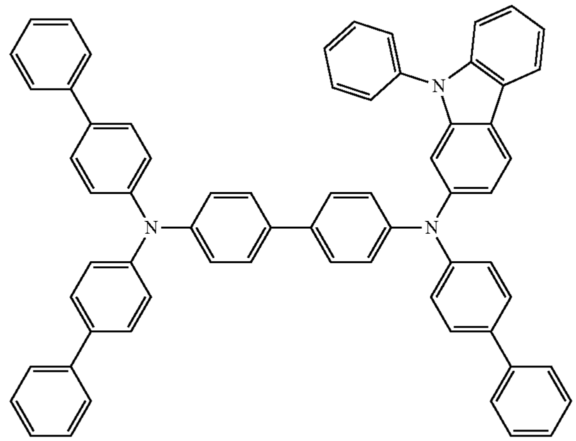
HT37
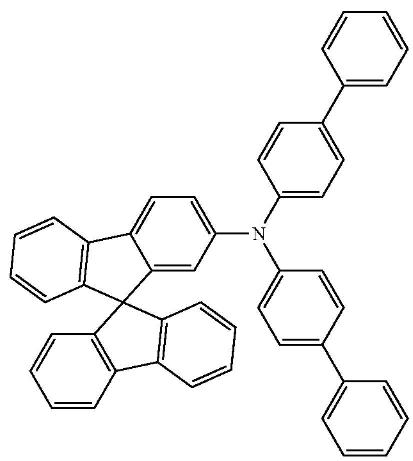
HT38
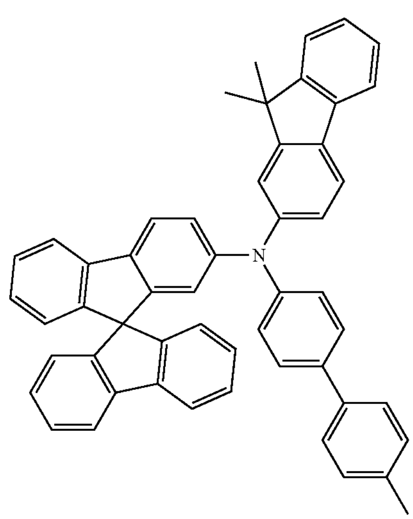

-continued
HT39
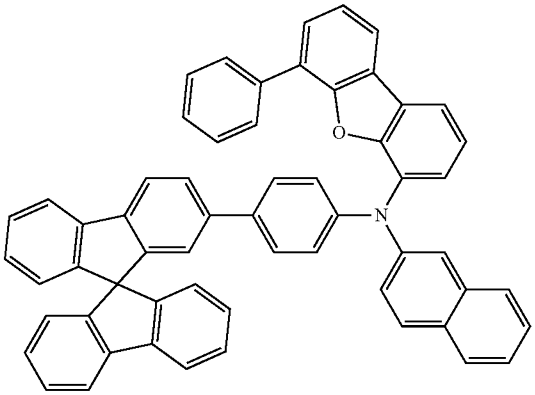
HT40
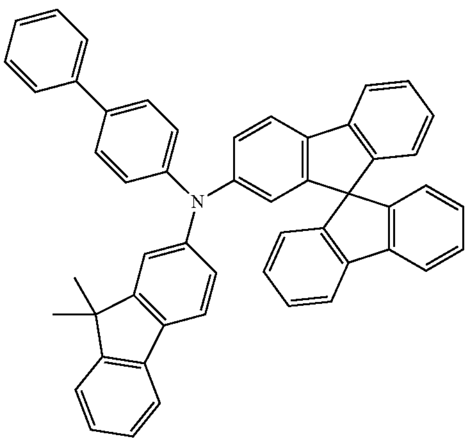
HT41
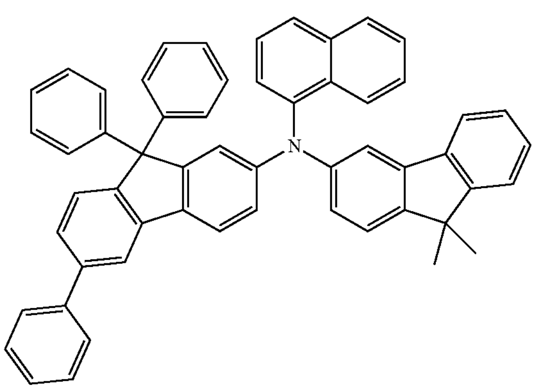
-continued
HT42
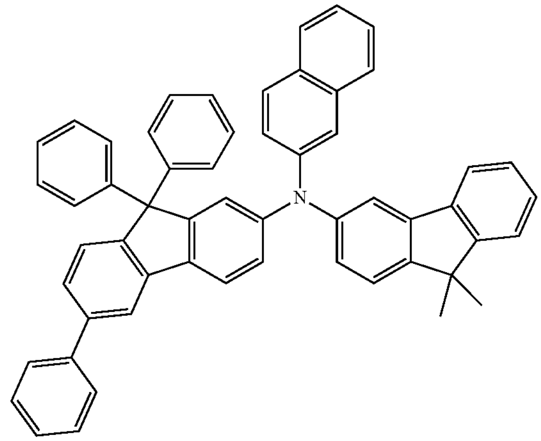
HT43
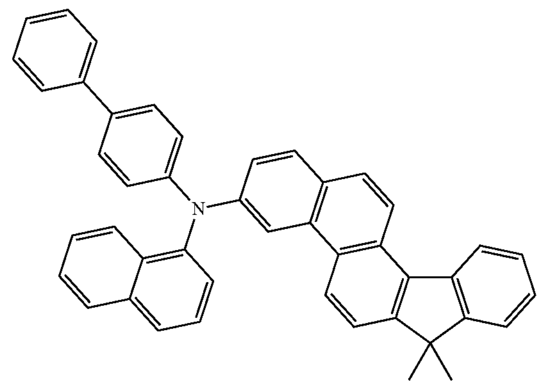
HT44
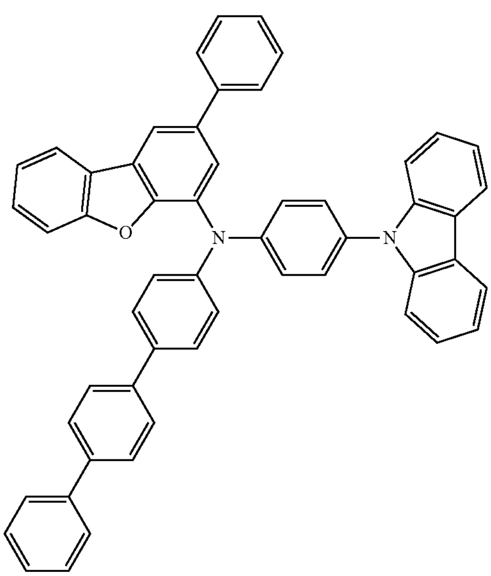

-continued

HT45

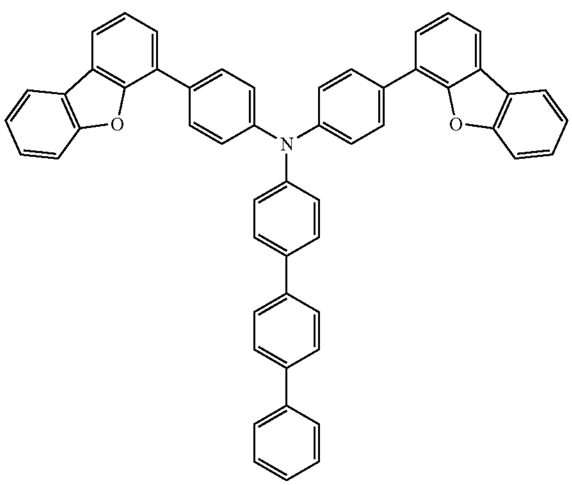

HT46

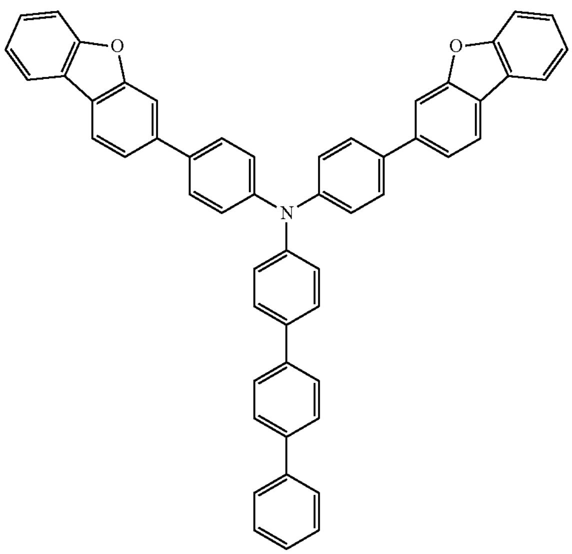

HT47

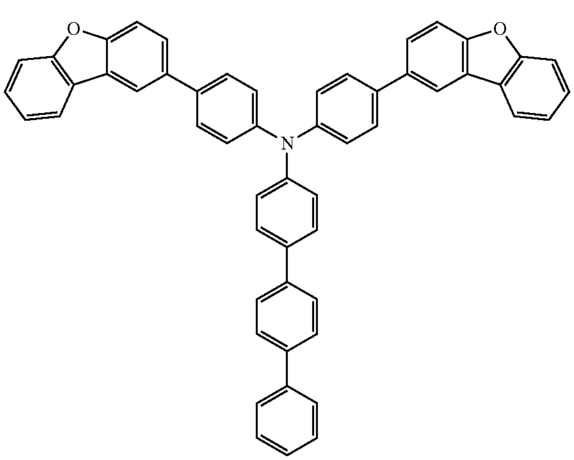

-continued

HT48

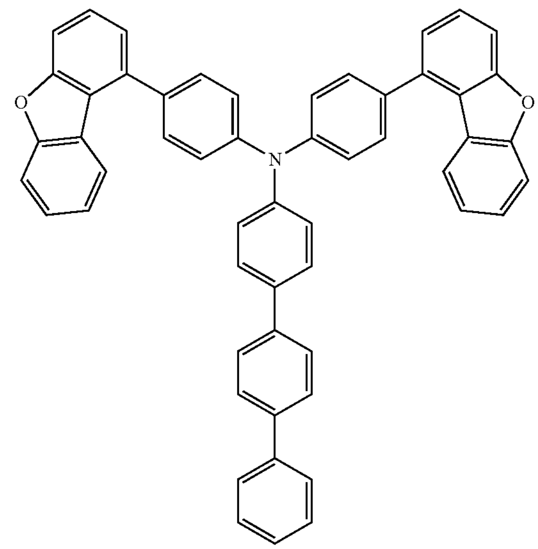

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

p-Dopant

The hole transport region may further include, in addition to these materials, a charge-generation material for the improvement of conductive characteristics. The charge-generation material may be homogeneously or non-homogeneously dispersed in the hole transport region.

The charge-generation material may be, for example, a p-dopant.

In one embodiment, the p-dopant may have a lowest unoccupied molecular orbital (LUMO) energy level of −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative, such as tetracyanoquinodimethane (TCNQ) and/or 2,3,5,6-tetrafluoro-7,7,8,8-tetracyanoquinodimethane (F4-TCNQ);

a metal oxide, such as tungsten oxide and/or molybdenum oxide;

1,4,5,8,9,12-hexaazatriphenylene-hexacarbonitrile (HAT-CN); and a compound represented by Formula 221 below, but embodiments of the present disclosure are not limited thereto:

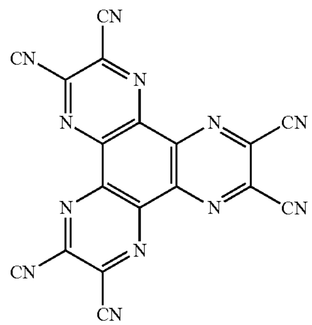

HAT-CN

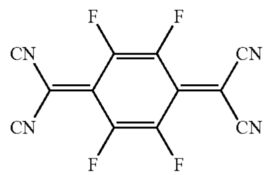

F4-TCNQ

Formula 221

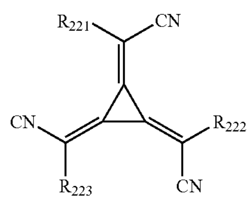

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

A thickness of the emission layer may be in a range of about 100 Å to about 1,000 Å, for example, about 200 Å to about 600 Å. When the thickness of the emission layer is within these ranges, suitable (e.g., excellent) light-emission characteristics may be obtained without a substantial increase in driving voltage.

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from the emission layer in the stated order. However, embodiments of the structure of the electron transport region are not limited thereto.

The electron transport region (for example, a buffer layer, a hole blocking layer, an electron control layer, or an electron transport layer in the electron transport region) may include a metal-free compound containing at least one π electron-depleted nitrogen-containing ring.

The term "π electron-depleted nitrogen-containing ring" as used herein refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, but are not limited thereto.

For example, the electron transport region may include a compound represented by Formula 601 below:

$$[Ar_{601}]_{xe11}\text{-}[(L_{601})_{xe1}\text{-}R_{601}]_{xe21} \quad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(═O)($Q_{601}$), —S(═O)$_2$($Q_{601}$), and —P(═O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and $R_{601}$(s) in the number of xe21 may include the π electron-depleted nitrogen-containing ring.

In one embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —CI, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(═O)$_2$($Q_{31}$), and —P(═O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more $Ar_{601}$(s) may be linked to each other via a single bond.

In one or more embodiments, $Ar_{601}$ in Formula 601 may be an anthracene group.

In one or more embodiments, a compound represented by Formula 601 may be represented by Formula 601-1 below:

Formula 601-1

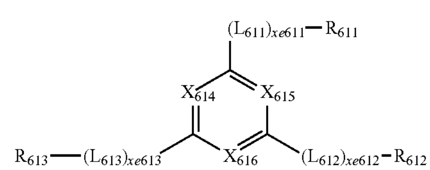

In Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each be understood by referring to the description provided in connection with $L_{601}$, xe611 to xe613 may each be understood by referring to the description provided in connection with xe1, $R_{611}$ to $R_{613}$ may each be understood by referring to the description provided in connection with $R_{601}$, and $R_{614}$ to $R_{616}$ may each independently be selected from hydrogen, deuterium, —F, —CI, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —CI, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(═O)$_2$($Q_{601}$) and —P(═O)($Q_{601}$)($Q_{602}$), wherein $Q_{601}$ and $Q_{602}$ are the same as described above.

The electron transport region may include at least one compound selected from Compounds ET1 to ET36 below, but embodiments of the present disclosure are not limited thereto:

ET1

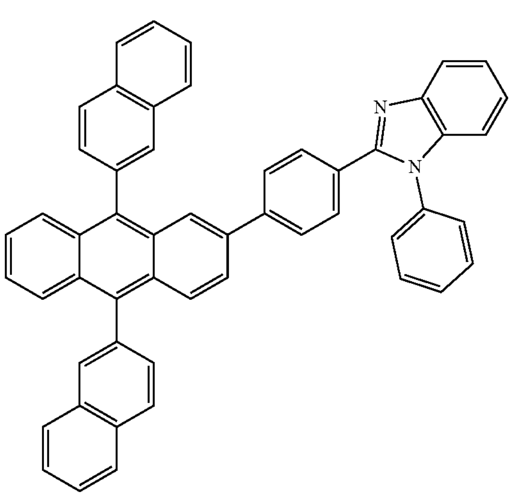

-continued

ET2

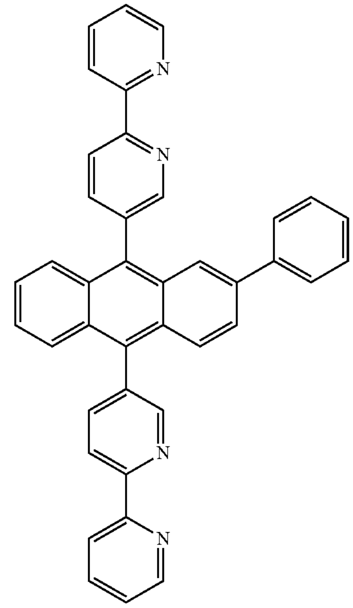

ET3

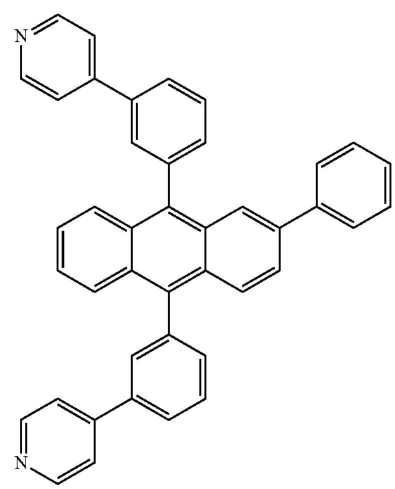

ET4

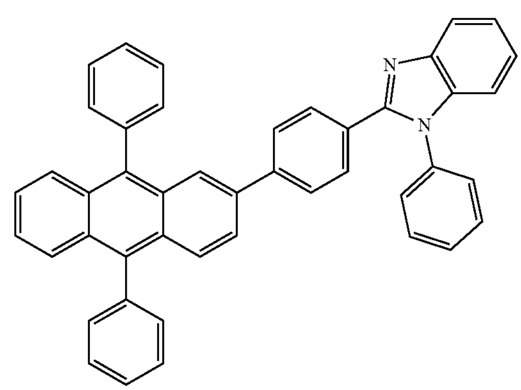

-continued
ET5
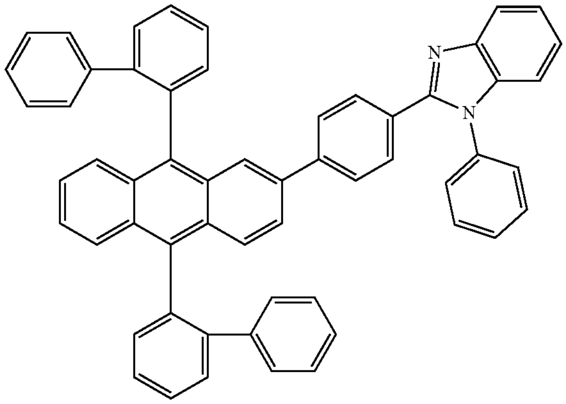
ET6
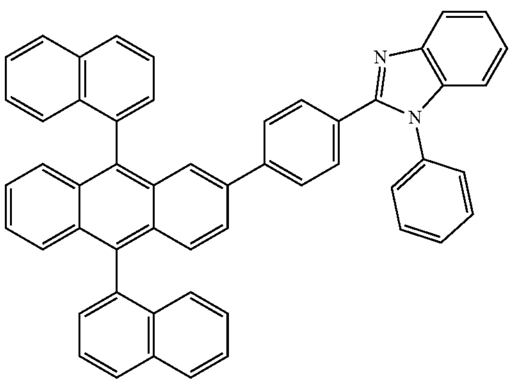
ET7
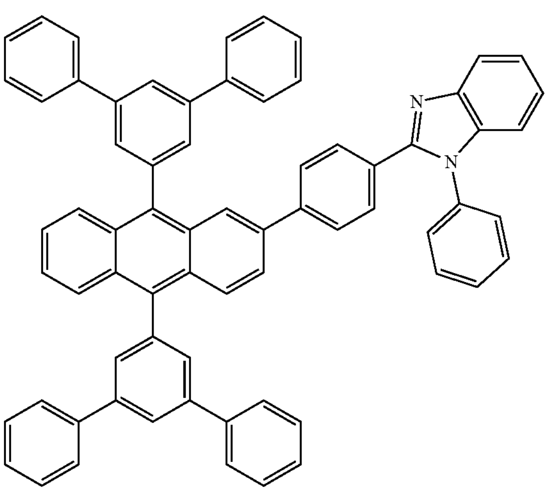
-continued
ET8
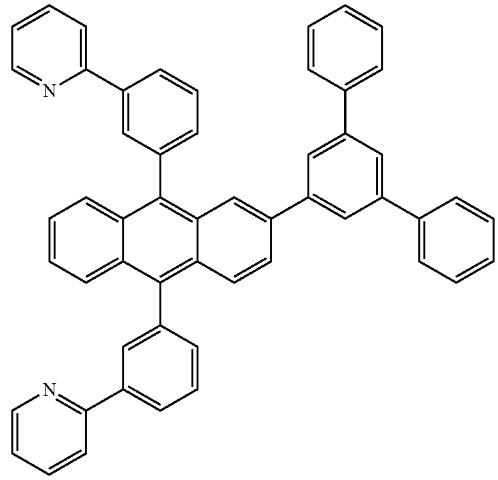
ET9
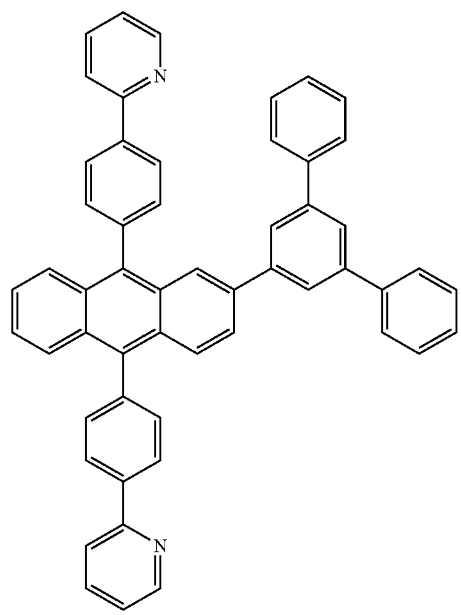

ET10
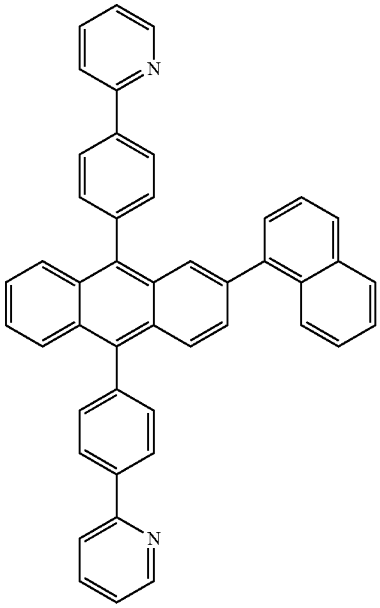
ET11
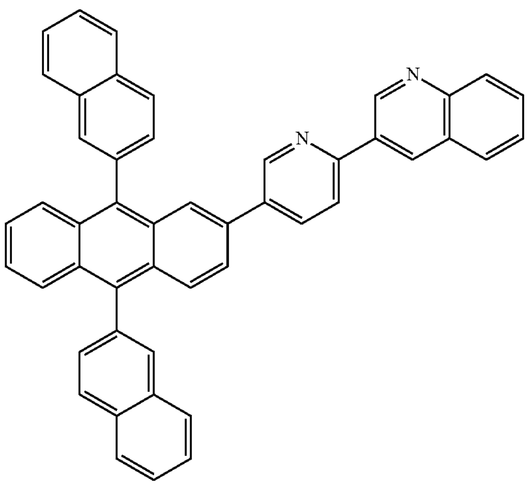
ET12
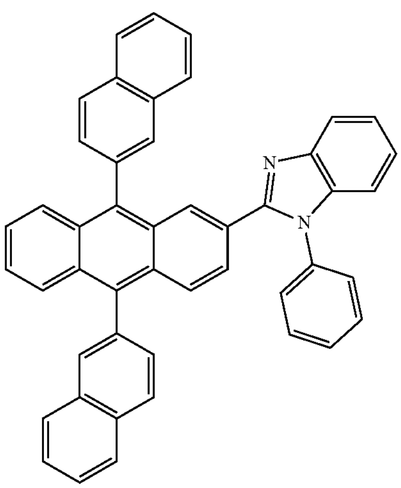
ET13
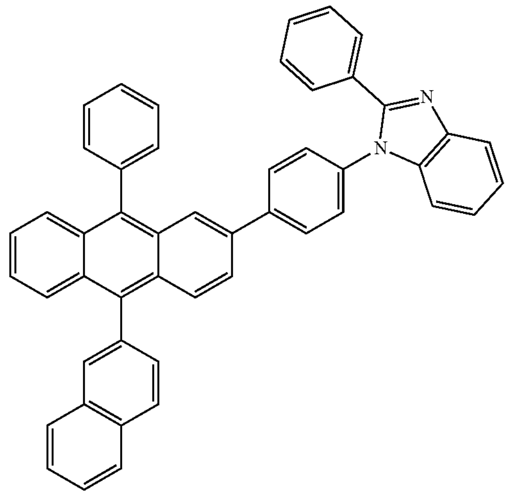
ET14
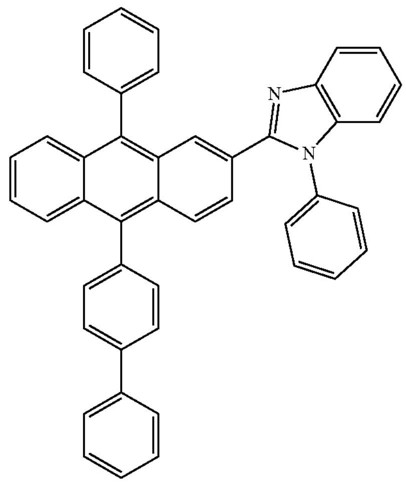
ET15
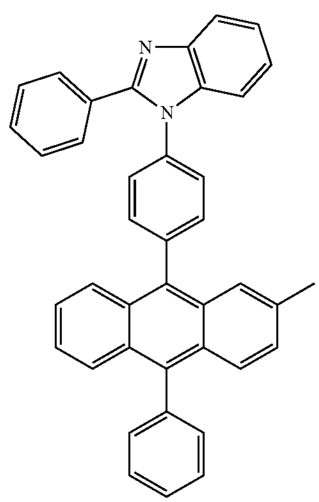

-continued
ET16
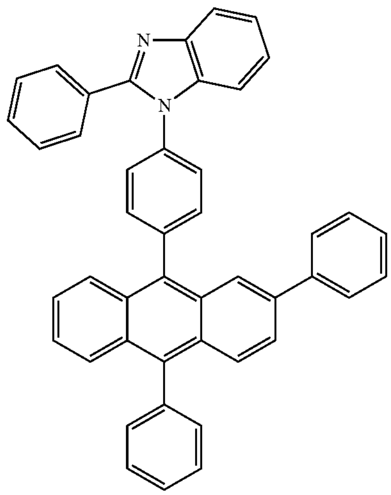
ET17
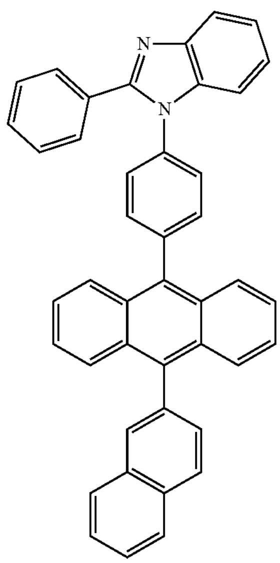
ET18
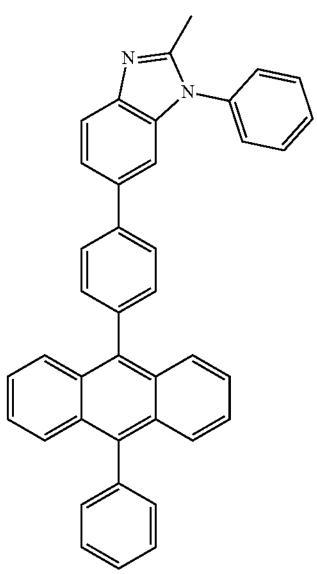
-continued
ET19
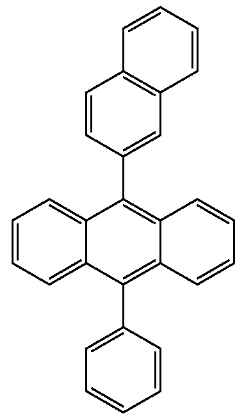
ET20
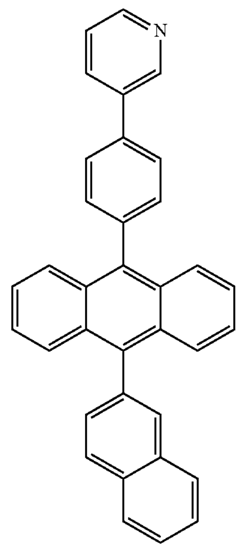
ET21
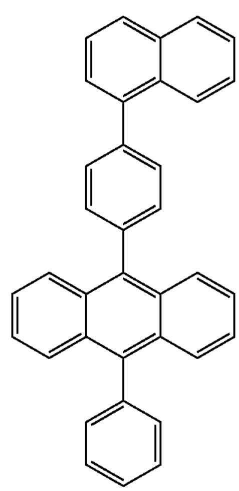

-continued
ET22
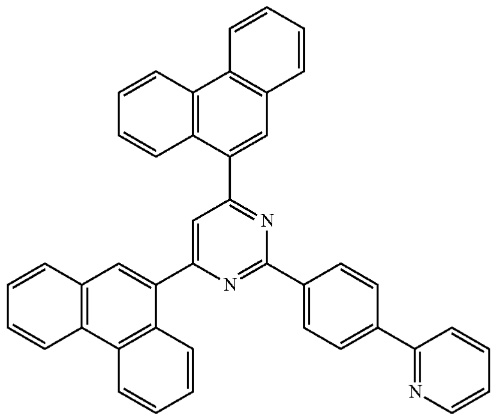
ET23
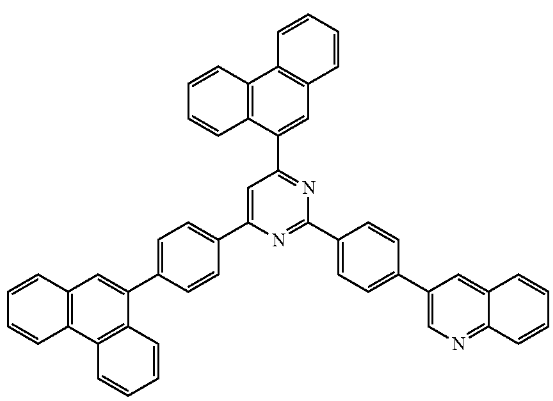
ET24
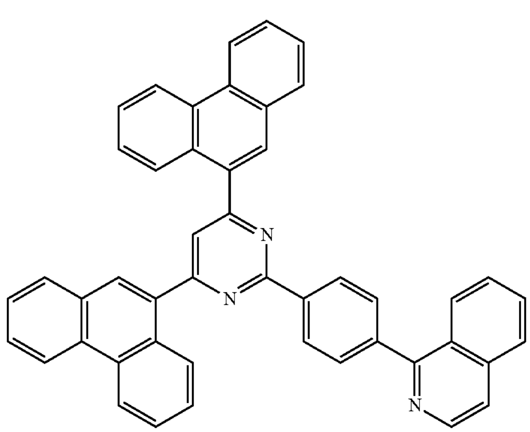
-continued
ET25
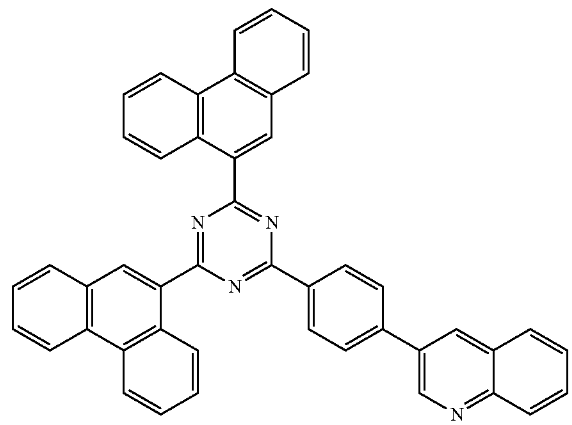
ET26
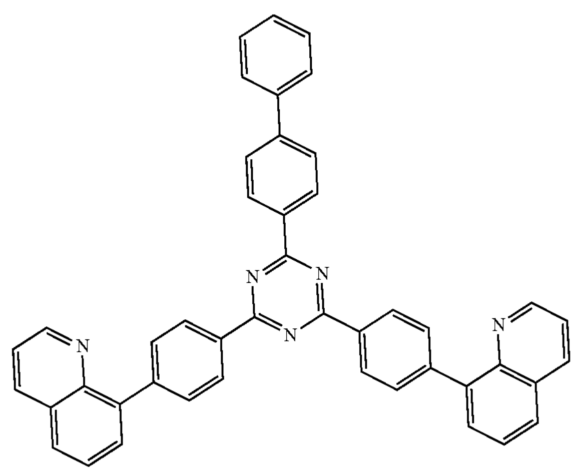
ET27
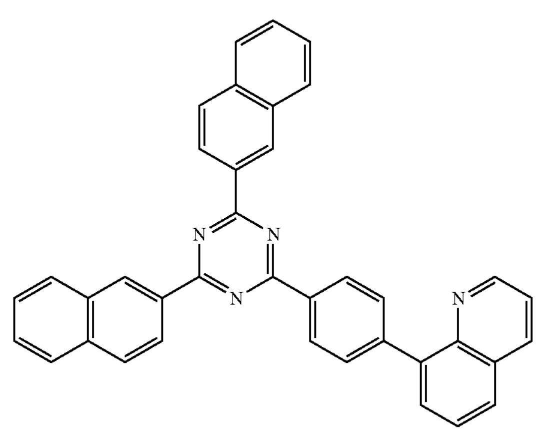

ET28
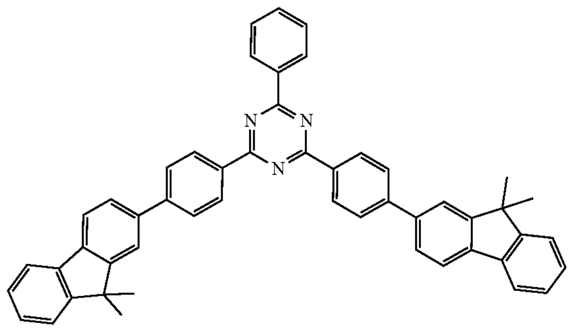
ET29
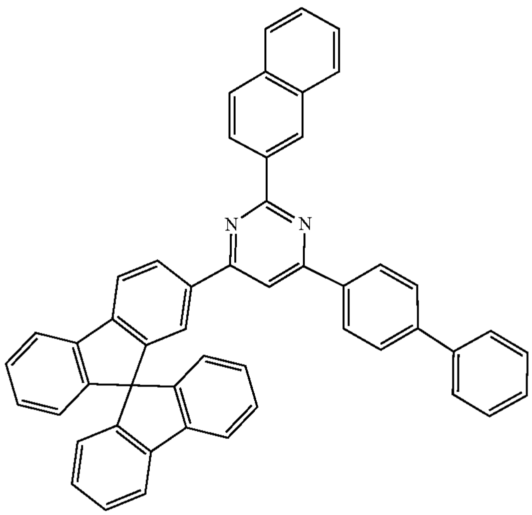
ET30
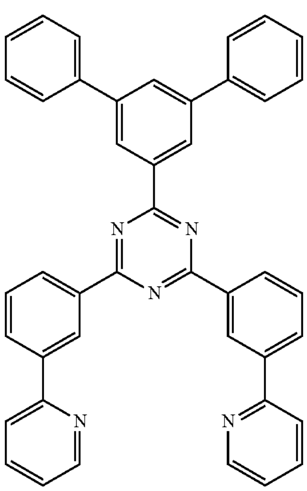
ET31
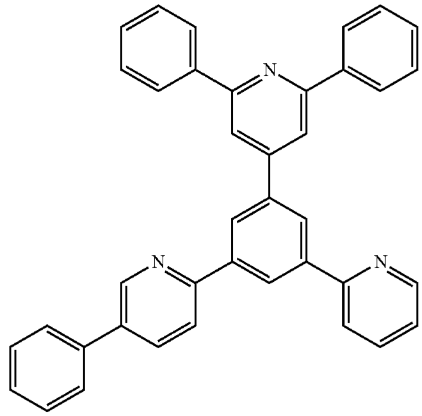
ET32
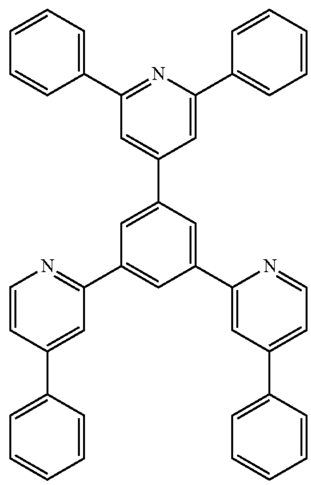
ET33
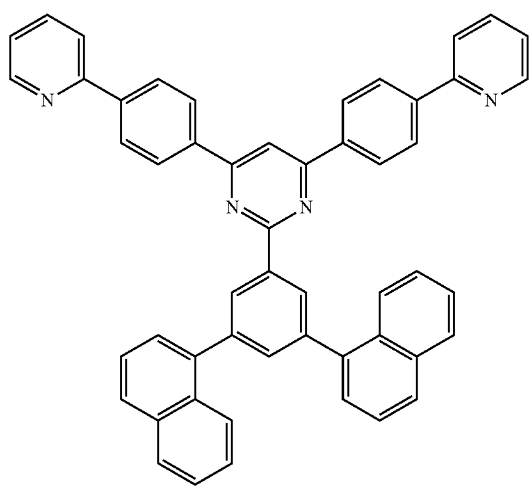

-continued

ET34

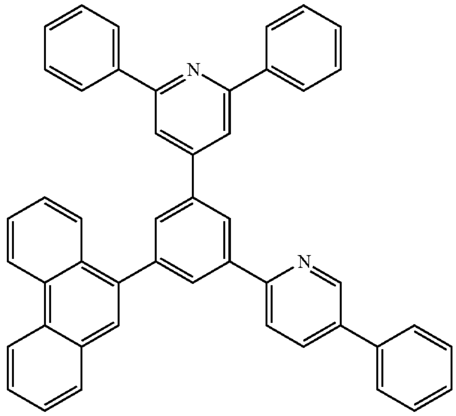

ET35

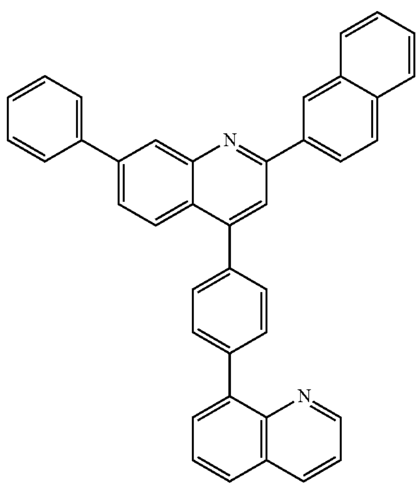

ET36

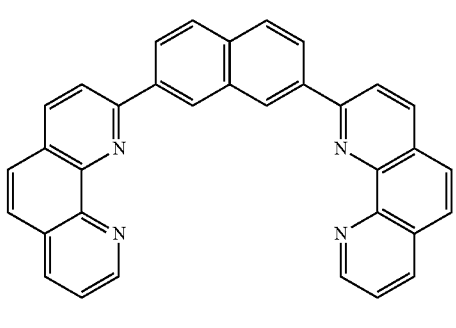

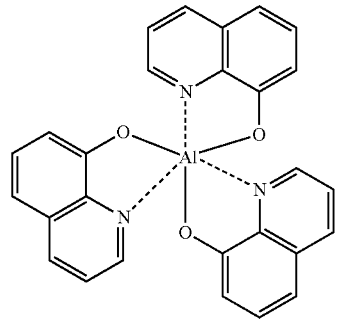

$Alq_3$

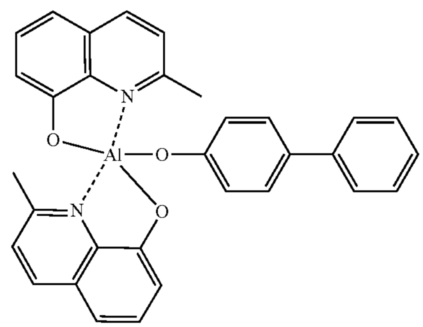

BAlq

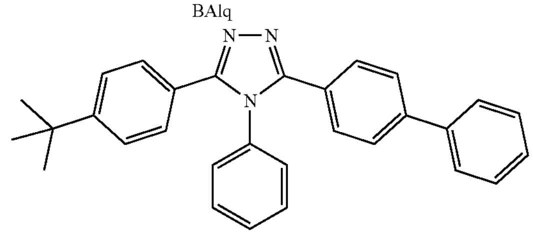

TAZ

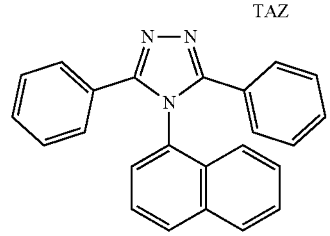

NTAZ

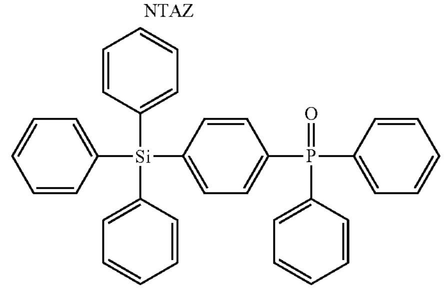

TSPO1

In one or more embodiments, the electron transport region may include at least one compound selected from 2,9-dimethyl-4,7-diphenyl-1, 10-phenanthroline (BCP), 4,7-diphenyl-1, 10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, and diphenyl(4-(triphenylsilyl)phenyl)-phosphine oxide (TSPO1):

A thickness of the buffer layer, the hole blocking layer, or the electron control layer may be in a range of about 20 Å to about 1,000 Å, for example, about 30 Å to about 300 Å. When the thickness of the buffer layer, the hole blocking layer, or the electron control layer is within the ranges described above, suitable (e.g., excellent) hole blocking characteristics or electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within the ranges described above, the electron transport layer may have satisfactory electron transporting characteristics without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cycropentadiene, but embodiments of the present disclosure are not limited thereto.

For example, the metal-containing material may include a Li complex. The Li complex may include, for example, Compound ET-D1 (lithium quinolate, LiQ) or ET-D2 below:

ET-D1

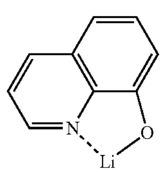

ET-D2

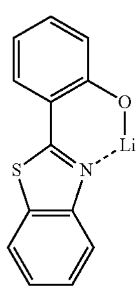

The electron transport region may include an electron injection layer that facilitates electron injection from the second electrode 190. The electron injection layer may be in direct contact with the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

The alkali metal may be selected from Li, Na, K, Rb, and Cs. In one embodiment, the alkali metal may be Li, Na, and/or Cs. In one or more embodiments, the alkali metal may be Li and/or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, and/or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, and/or KI. In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ ($0<x<1$), and/or $Ba_xCa_{1-x}O$ ($0<x<1$). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $Sc_2O_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (e.g., consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In one or more embodiments, the electron injection layer may further include an organic material. When the electron injection layer further includes the organic material, the alkali metal, the alkaline earth metal, the rare earth metal, the alkali metal compound, the alkaline earth-metal compound, the rare earth metal compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the ranges described above, satisfactory electron injection characteristics may be obtained without a substantial increase in driving voltage.

Second Electrode 190

The second electrode 190 may be disposed on the organic layer 150 having such a structure. The second electrode 190 may be a cathode which is an electron injection electrode, and in this regard, a material for forming the second electrode 190 may be selected from a metal, an alloy, an electrically conductive compound, and combinations thereof, which may have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
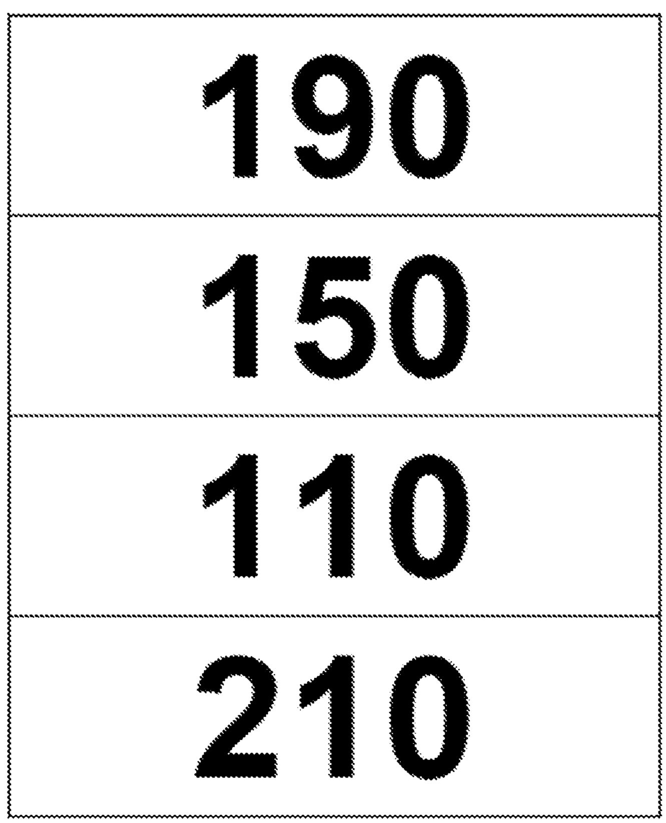
FIG. 2 shows a schematic view of an organic light-emitting device according to another embodiment.
Figure 3:
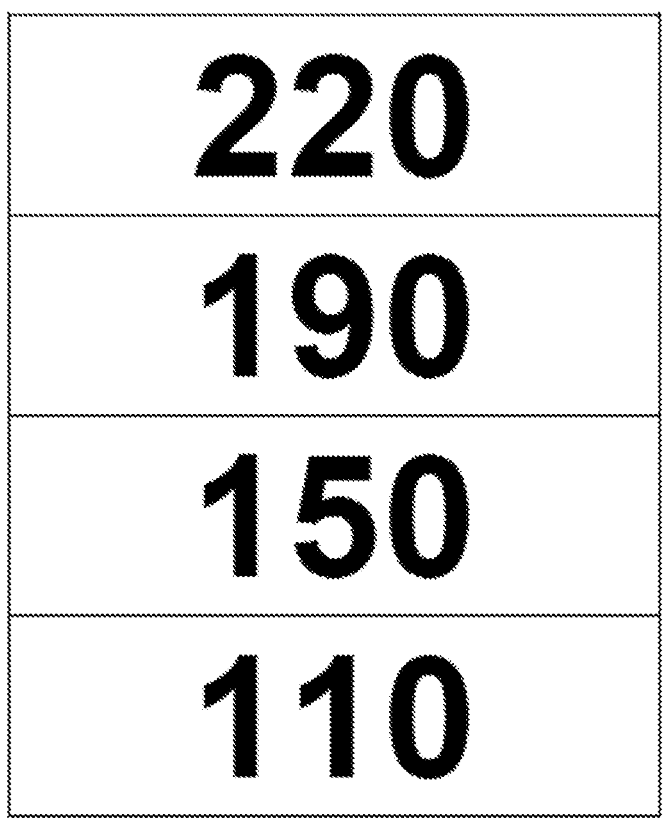
FIG. 3 shows a schematic view of an organic light-emitting device according to another embodiment.
Figure 4:
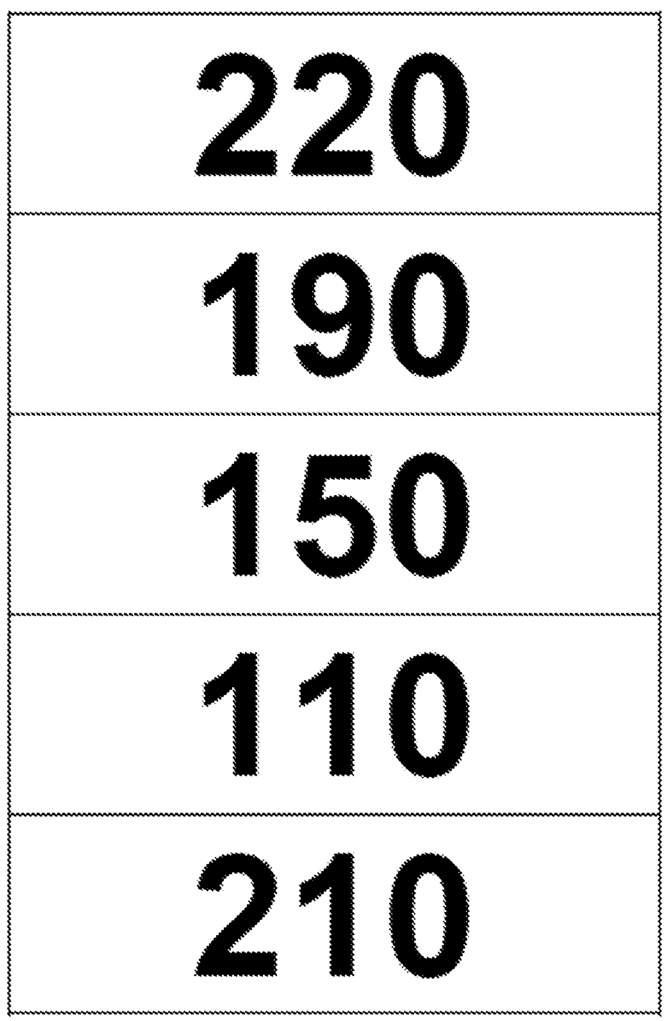
FIG. 4 shows a schematic view of an organic light-emitting device according to another embodiment.

Description of FIGS. 2 to 4

An organic light-emitting device 20 of FIG. 2 includes a first capping layer 210, the first electrode 110, the organic layer 150, and the second electrode 190, which are sequentially stacked in this stated order; an organic light-emitting device 30 of FIG. 3 includes the first electrode 110, the organic layer 150, the second electrode 190, and a second capping layer 220, which are sequentially stacked in this stated order; an organic light-emitting device 40 of FIG. 4 includes the first capping layer 210, the first electrode 110, the organic layer 150, the second electrode 190, and the second capping layer 220, which are sequentially stacked in this stated order.

Regarding FIGS. 2 to 4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110 and the first capping layer 210 toward the outside, wherein the first electrode 110 may be a semi-transmissive electrode or a transmissive electrode. In the organic layer 150 of each of the organic light-emitting devices 30 and 40, light generated in an emission layer may pass through the second electrode 190 and the second capping layer 220 toward the outside, wherein the second electrode 190 may be a semi-transmissive electrode or a transmissive electrode.

The first capping layer 210 and the second capping layer 220 may increase external luminescent efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrine derivatives, phthalocyanine derivatives, a naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In one embodiment, at least one selected from the first capping layer 210 and the second capping layer 220 may each independently include an amine-based compound.

In one embodiment, at least one selected from the first capping layer 210 and the second capping layer 220 may each independently include the compound represented by Formula 201 or the compound represented by Formula 202.

In one or more embodiments, at least one selected from the first capping layer 210 and the second capping layer 220 may each independently include a compound selected from Compounds HT28 to HT33 and Compounds CP1 to CP5, but embodiments of the present disclosure are not limited thereto.

CP1

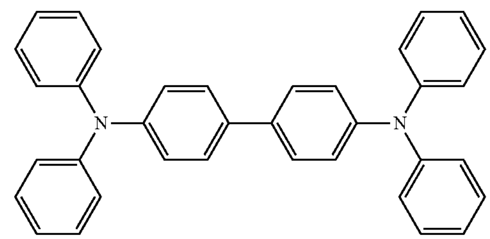

CP2

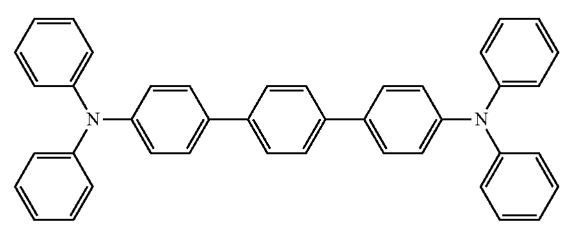

CP3

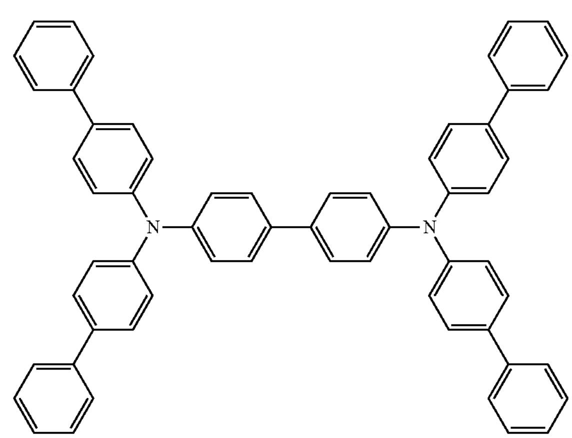

-continued

CP4

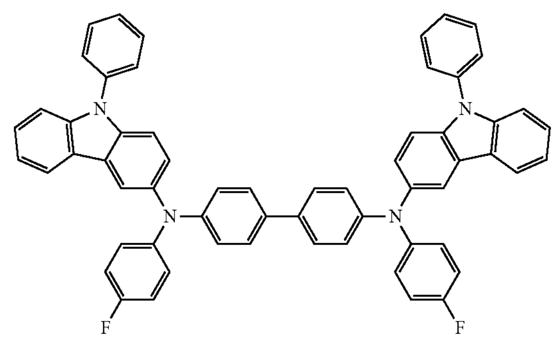

CP5

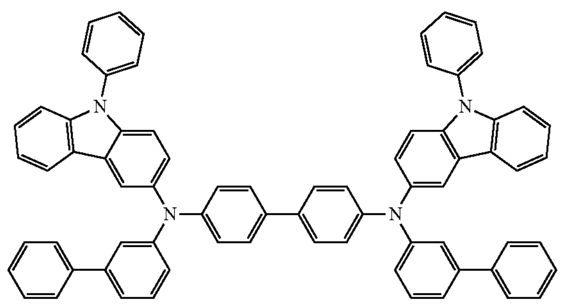

Hereinbefore, the organic light-emitting device according to an embodiment has been described in connection with FIGS. 1 to 4, but embodiments of the present disclosure are not limited thereto.

Layers constituting the hole transport region, the emission layer, and layers constituting the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed, and the structure of a layer to be formed.

When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed, and the structure of a layer to be formed.

Apparatus

The organic light-emitting device may be included in various suitable apparatuses.

Figure 5:
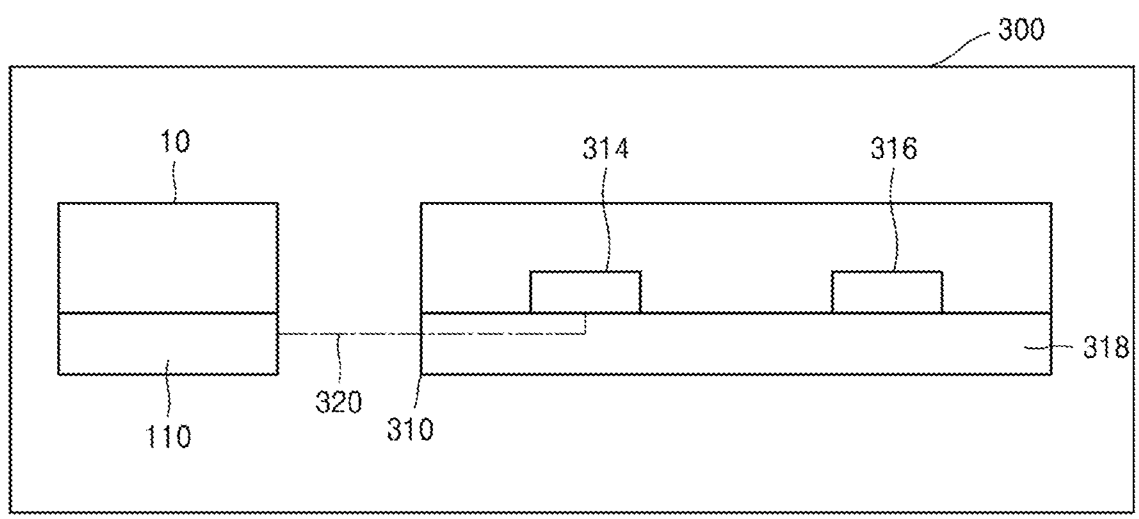
FIG. 5 is a schematic diagram of an exemplary embodiment of an apparatus containing an organic light-emitting device constructed according to principles of the invention.

FIG. 5 is a schematic diagram of an exemplary embodiment of an apparatus containing an organic light-emitting device constructed according to principles of the invention. Referring to FIG. 5, an apparatus 300 includes a thin-film transistor 310 having a source electrode 314, a drain electrode 316, and an activation layer 318. In the illustrated embodiment, the first electrode 110 of the organic light-emitting device 10 is in electrical connection 320 with the source electrode 314, but in other exemplary embodiments the first electrode 110 is in electrical connection 320 with one of the source electrode 314 and the drain electrode 316 of the thin-film transistor 310.

The thin-film transistor 310 may further include a gate electrode, a gate insulation layer, or the like. The activation layer 318 may include crystalline silicon, amorphous silicon, organic semiconductor, oxide semiconductor, or the like, but exemplary embodiments are not limited thereto. In other exemplary embodiments, the organic light-emitting device may be included in many other various apparatuses.

The apparatus may further include a sealing part for sealing the organic light-emitting device. The sealing part may allow an image from the organic light-emitting device to be implemented and may block outside air and moisture from penetrating into the organic light-emitting device. The sealing part may be a sealing substrate including a transparent glass or a plastic substrate. The sealing part may be a thin film encapsulation layer including a plurality of organic layers and/or a plurality of inorganic layers. When the sealing unit is a thin film encapsulation layer, the entire apparatus may be flexible.

For example, the apparatus may be a light-emitting apparatus, an authentication apparatus, or an electronic apparatus.

The light-emitting apparatus may be used as various displays, light sources, and the like.

The authentication apparatus may be, for example, a biometric authentication apparatus for authenticating an individual by using biometric information of a biometric body (for example, a finger tip, a pupil, or the like). The authentication apparatus may further include, in addition to the organic light-emitting device, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various measuring instruments, meters (for example, meters for a vehicle, an aircraft, and a vessel), projectors, and the like, but exemplary embodiments of the invention are not limited thereto.

General Definition of Substituents

The term "π electron-depleted nitrogen-containing cyclic group" as used herein refers to a cyclic group having at least one *—N=*' moiety, and non-limiting examples thereof include an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group.

The π electron-depleted nitrogen-free cyclic group may be selected from a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corozen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group and a triindolobenzene group, but embodiments of the present disclosure are not limited thereto.

The term "Period 4 transition metal" as used herein refers to an element of Period 4 and the d-block of the Periodic Table of Elements, and non-limiting examples thereof include scandium (Sc), titanium (Ti), vanadium (V), chromium (Cr), manganese (Mn), iron (Fe), cobalt (Co), nickel (Ni), copper (Cu), and zinc (Zn).

The term "Period 5 transition metal" as used herein refers to an element of Period 5 and the d-block of the Periodic Table of Elements, and non-limiting examples thereof include yttrium (Y), zirconium (Zr), niobium (Nb), molybdenum (Mo), technetium (Tc), ruthenium (Ru), rhodium (Rh), palladium (Pd), silver (Ag), and cadmium (Cd).

The term "Period 6 transition metal" as used herein refers to an element of Period 6 and the d-block and the f-block of the Periodic Table of Elements, and non-limiting examples thereof include lanthanum (La), samarium (Sm), europium (Eu), terbium (Tb), thulium (Tm), ytterbium (Yb), lutetium (Lu), hafnium (Hf), tantalum (Ta), tungsten (W), rhenium (Re), osmium (Os), iridium (Ir), platinum (Pr), gold (Au), and mercury (Hg).

The term "$C_1$-$C_{60}$ alkyl group" as used herein refers to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in, for example, the middle and/or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in, for example, the middle and/or at the terminus of the $C_2$-$C_{60}$ alkyl group, and non-limiting examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom, and 1 to 10 carbon atoms as the remaining ring-forming atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms as the remaining ring-forming atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. The term "$C_6$-$C_{60}$ arylene group" used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, in addition to 1 to 60 carbon atoms as the remaining ring-forming atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. The term "$C_1$-$C_{60}$ heteroarylene group" as used herein refers to a divalent group having the same structure as the $C_1$-$C_{60}$ heteroaryl group. When the $C_1$-$C_{60}$ heteroaryl group and the $C_1$-$C_{60}$ heteroarylene group each independently include two or more rings, the respective rings may be condensed (fused) with each other.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_1$-$C_{60}$ heteroaryloxy group" as used herein refers to a monovalent group represented by —$OA_{104}$ (wherein $A_{104}$ is the $C_1$-$C_{60}$ heteroaryl group), and the term "$C_1$-$C_{60}$ heteroarylthio group" as used herein refers to —$SA_{105}$ (wherein $A_{105}$ is the $C_1$-$C_{60}$ heteroaryl group).

The term "monovalent non-aromatic condensed polycyclic group" as used herein refers to a monovalent group having two or more rings condensed with each other, only carbon atoms as ring-forming atoms (for example, having 8 to 60 carbon atoms), and no aromaticity in its entire molecular structure (e.g., the molecular structure as a whole does not have aromaticity). A non-limiting example of the monovalent non-aromatic condensed polycyclic group is a fluorenyl group. The term "divalent non-aromatic condensed polycyclic group" as used herein refers to a divalent group having the same structure as that of the monovalent non-aromatic condensed polycyclic group.

The term "monovalent non-aromatic condensed heteropolycyclic group" as used herein refers to a monovalent group having two or more rings condensed to each other, at least one heteroatom selected from N, O, Si, P, and S, other than carbon atoms (for example, 1 to 60 carbon atoms), as a ring-forming atom, and no aromaticity in its entire molecular structure (e.g., the molecular structure as a whole does not have aromaticity). A non-limiting example of the monovalent non-aromatic condensed heteropolycyclic group is a carbazolyl group. The term "divalent non-aromatic condensed heteropolycyclic group" as used herein refers to a divalent group having the same structure as that of the monovalent non-aromatic condensed heteropolycyclic group.

The term "$C_5$-$C_{60}$ carbocyclic group" as used herein refers to a monocyclic or polycyclic group having 5 to 60 carbon atoms in which ring-forming atoms are carbon atoms only. The term "$C_5$-$C_{60}$ carbocyclic group" as used herein refers to an aromatic carbocyclic group or a non-aromatic carbocyclic group. The $C_5$-$C_{60}$ carbocyclic group may be a ring (such as benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon atoms (the number of carbon atoms may be in a range of 1 to 60).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium, —F, —CI, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, the term "OMe" as used herein refers to a methoxy group, and "D" refers to deuterium.

The term "biphenyl group" as used herein refers to "a phenyl group substituted with a phenyl group". For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and an organic light-emitting device according to embodiments will be described in more detail with reference to Examples. The expression "B was utilized instead of A" utilized in describing Synthesis Examples refers to that an identical molar equivalent of B was utilized in place of A.

EXAMPLE

Example 1-1

As an anode, an indium tin oxide (ITO)-deposited substrate was cut to a size of 50 mm×50 mm×0.5 mm and sonicated utilizing isopropyl alcohol and pure water for 10 minutes each, and then, cleaned by irradiation of ultraviolet rays for 10 minutes and exposure to ozone. The resultant ITO substrate was mounted on a vacuum deposition apparatus.

m-MTDATA was deposited on the ITO substrate to form a hole injection layer having a thickness of 40 Å, followed by vacuum deposition of NPB on the hole injection layer to form a hole transport layer having a thickness of 10 Å, and compounds HT-01, ET01, PD1 and DA-02 were co-deposited on the hole transport layer at a weight ratio of 70:30:15:1 to form an emission layer having a thickness of 200 Å. Compound ETL1 was deposited on the emission layer to form an electron transport layer having a thickness of 300 Å. Al was deposited on the electron transport layer to form a cathode having a thickness of 1200 Å, thereby completing the manufacture of an organic light-emitting device.

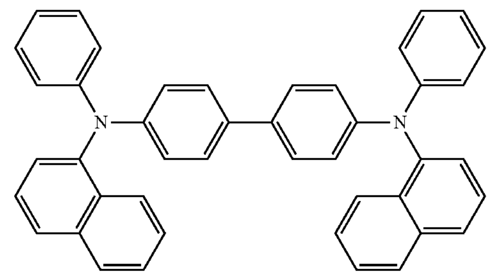

NPB

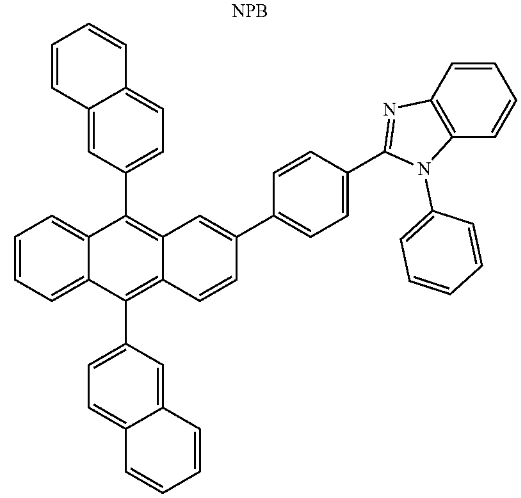

ETL1

Examples 1-2 to 1-5 and Comparative Examples 1-1 to 1-25

Organic light-emitting devices were manufactured in the same manner as in Example 1-1, except that emission layers were each formed utilizing compounds respectively shown in Table 1.

Evaluation Example 1

The efficiency, emission wavelength and lifespan of the organic light-emitting devices manufactured according to Examples 1-1 to 1-5 and Comparative Examples 1-1 to 1-25 were measured utilizing a Keithley SMU 236 and luminance meter PR650 at a current density of 10 mA/cm$^2$. The results are shown in Table 1. The lifespan is a measure of how long it took for luminance to reduce from an initial luminance to 90% of the initial luminance.

TABLE 1

| | Emission layer | | | | | | | |
|---|---|---|---|---|---|---|---|---|
| | First compound (weight ratio) | Second compound (weight ratio) | Third compound (weight ratio) | Fourth compound (weight ratio) | Luminance (cd/m$^2$) | Efficiency (cd/A) | Emission wave length (nm) | Life span (hr) |
| Example 1-1 | HT-01 (70) | ET01 (30) | PD1 (15) | DA-02 (1) | 1000 | 147.74 | 456 | 50 |

TABLE 1-continued

| | Emission layer | | | | | | | |
|---|---|---|---|---|---|---|---|---|
| | First compound (weight ratio) | Second compound (weight ratio) | Third compound (weight ratio) | Fourth compound (weight ratio) | Luminance ($cd/m^2$) | Efficiency (cd/A) | Emission wave length (nm) | Life span (hr) |
| Example 1-2 | HT-04 (70) | ET02 (30) | PD3 (15) | DA-06 (1) | 1000 | 150.89 | 458 | 46 |
| Example 1-3 | HT-06 (70) | ET03 (30) | PD2 (15) | DA-16 (1) | 1000 | 200.62 | 457 | 33 |
| Example 1-4 | HT-08 (70) | ET07 (30) | PD11 (15) | DA-10 (1) | 1000 | 237.21 | 457 | 46 |
| Example 1-5 | HT-12 (70) | ET015 (30) | PD8 (15) | DA-03 (1) | 1000 | 245.55 | 458 | 55 |
| Comparative Example 1-1 | HT-01 (100) | — | PD1 (15) | DA-01 (1) | 1000 | 50.14 | 459 | 0.3 |
| Comparative Example 1-2 | HT-09 (100) | — | PD3 (15) | DA-05 (1) | 1000 | 23.45 | 457 | 5 |
| Comparative Example 1-3 | — | ET01 (100) | PD5 (15) | DA-15 (1) | 1000 | 12.16 | 483 | 4 |
| Comparative Example 1-4 | — | ET06 (100) | PD10 (15) | DA-17 (1) | 1000 | 36.30 | 482 | 0.9 |
| Comparative Example 1-5 | CBP (100) | | PD8 (15) | DA-03 (1) | 1000 | 27.11 | 459 | 1 |
| Comparative Example 1-6 | HT-01 (70) | ET01 (30) | — | DA-02 (1) | 1000 | 80.14 | 456 | 8 |
| Comparative Example 1-7 | HT-04 (70) | ET02 (30) | — | DA-06 (1) | 1000 | 92.19 | 458 | 2 |
| Comparative Example 1-8 | HT-06 (70) | ET03 (30) | — | DA-16 (1) | 1000 | 88.12 | 457 | 3 |
| Comparative Example 1-9 | HT-08 (70) | ET07 (30) | — | DA-10 (1) | 1000 | 75.22 | 457 | 2 |
| Comparative Example 1-10 | HT-12 (70) | ET015 (30) | — | DA-03 (1) | 1000 | 90.45 | 458 | 12 |
| Comparative Example 1-11 | HT-01 (70) | ET01 (30) | PD1 (15) | — | 1000 | 71.55 | 461 | 10 |
| Comparative Example 1-12 | HT-04 (70) | ET02 (30) | PD3 (15) | — | 1000 | 79.65 | 465 | 5 |
| Comparative Example 1-13 | HT-06 (70) | ET03 (30) | PD2 (15) | — | 1000 | 85.45 | 465 | 3 |
| Comparative Example 1-14 | HT-08 (70) | ET07 (30) | PD11 (15) | — | 1000 | 105.12 | 454 | 4 |
| Comparative Example 1-15 | HT-12 (70) | ET015 (30) | PD8 (15) | — | 1000 | 112.54 | 461 | 4 |
| Comparative Example 1-16 | HT-01 (70) | ET01 (30) | PD1 (15) | DCJTB (1) | 1000 | 99.14 | 465 | 25 |
| Comparative Example 1-17 | HT-04 (70) | ET02 (30) | PD3 (15) | DCJTB (1) | 1000 | 91.12 | 466 | 13 |
| Comparative Example 1-18 | HT-06 (70) | ET03 (30) | PD2 (15) | DCJTB (1) | 1000 | 88.45 | 465 | 14 |
| Comparative Example 1-19 | HT-08 (70) | ET07 (30) | PD11 (15) | DCJTB (1) | 1000 | 92.15 | 465 | 22 |
| Comparative Example 1-20 | HT-12 (70) | ET015 (30) | PD8 (15) | DCJTB (1) | 1000 | 101.31 | 466 | 21 |

TABLE 1-continued

| | Emission layer | | | | | | | |
|---|---|---|---|---|---|---|---|---|
| | First compound (weight ratio) | Second compound (weight ratio) | Third compound (weight ratio) | Fourth compound (weight ratio) | Luminance ($cd/m^2$) | Efficiency (cd/A) | Emission wave length (nm) | Life span (hr) |
| Comparative Example 1-21 | Cmp3 (70) | Cmp2 (30) | PD1 (15) | DA-02 (1) | 1000 | 77.74 | 456 | 10 |
| Comparative Example 1-22 | Cmp3 (70) | Cmp2 (30) | PD3 (15) | DA-06 (1) | 1000 | 65.49 | 458 | 7 |
| Comparative Example 1-23 | Cmp3 (70) | Cmp2 (30) | PD2 (15) | DA-16 (1) | 1000 | 87.42 | 457 | 8 |
| Comparative Example 1-24 | Cmp3 (70) | Cmp2 (30) | PD11 (15) | DA-10 (1) | 1000 | 75.45 | 457 | 12 |
| Comparative Example 1-25 | Cmp3 (70) | Cmp2 (30) | PD8 (15) | DA-03 (1) | 1000 | 44.12 | 458 | 9 |

Cmp2

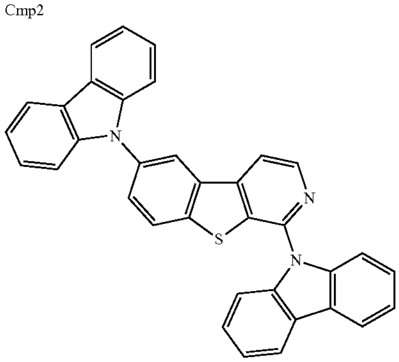

Compound 2

Cmp3

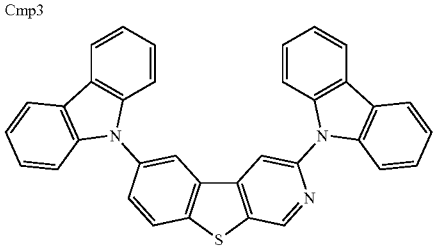

Compound 3

DCJTB: (4-(Dicyanomethylene)-2-tert-butyl-6-(1,1,7,7,-tetramethyljulolidyl-9-enyl)-H-pyran)

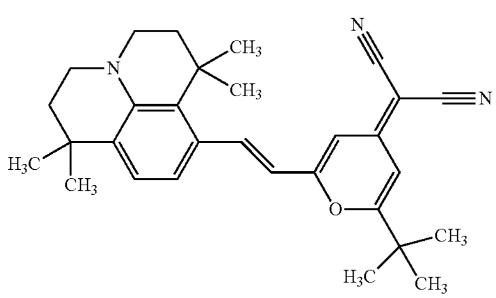 [SMILES: CC(C)(C)C1=CC(=C(C#N)C#N)C=C(/C=C/c2ccc3c4c2C(C)(C)CCN4CCC3(C)C)O1]

Table 1 shows that the organic light-emitting devices of Examples 1-1 to 1-5 have greater current efficiency and longer lifespan than the organic light-emitting devices of Comparative Examples 1-1 to 1-25.

Example 2-1

As an anode, an indium tin oxide (ITO)-deposited substrate was cut to a size of 50 mm×50 mm×0.5 mm and sonicated utilizing isopropyl alcohol and pure water for 10 minutes each, and then, cleaned by irradiation of ultraviolet rays for 10 minutes and exposure to ozone. The resultant ITO substrate was mounted on a vacuum deposition apparatus.

m-MTDATA was deposited on the ITO substrate to form a hole injection layer having a thickness of 40 Å, followed by vacuum deposition of NPB on the hole injection layer to form a hole transport layer having a thickness of 10 Å, and compounds HT-02, ET02, PD3 and DA-03 were co-deposited on the hole transport layer at a weight ratio of 70:30:15:1 to form an emission layer having a thickness of 200 Å.

Compound ET01 was deposited on the emission layer to form a hole blocking layer having a thickness of 50 Å. Compound ETL1 was deposited on the hole blocking layer to form an electron transport layer having a thickness of 300 Å. AI was deposited on the electron transport layer to form a cathode having a thickness of 1200 Å, thereby completing the manufacture of an organic light-emitting device.

Examples 2-2 to 2-5 and Comparative Examples 2-1 to 2-25

Organic light-emitting devices were manufactured in the same manner as in Example 2-1, except that emission layers and the hole blocking layers were formed utilizing compounds respectively shown in Table 2.

Evaluation Example 2

The efficiency, emission wavelength and lifespan of the organic light-emitting devices manufactured according to Examples 2-1 to 2-5 and Comparative Examples 2-1 to 2-25 were measured utilizing a Keithley SMU 236 and luminance meter PR650 at a current density of 10 mA/cm$^2$. The results are shown in Table 2. The lifespan is a measure of how long it took for luminance to reduce from an initial luminance to 90% of the initial luminance.

TABLE 2

| | Emission layer | | | | Hole | | | Emission | Life |
|---|---|---|---|---|---|---|---|---|---|
| | First compound | Second compound | Third compound | Fourth compound | blocking layer | Luminance (cd/m$^2$) | Efficiency (cd/A) | wave length (nm) | span (hr) |
| Example 2-1 | HT-02 | ET02 | PD3 | DA-03 | ET01 | 1000 | 145.87 | 456 | 71 |
| Example 2-2 | HT-02 | ET02 | PD4 | DA-04 | ET01 | 1000 | 155.23 | 458 | 66 |
| Example 2-3 | HT-09 | ET03 | PD7 | DA-11 | ET03 | 1000 | 159.45 | 457 | 75 |
| Example 2-4 | HT-09 | ET03 | PD20 | DA-13 | ET03 | 1000 | 280.25 | 457 | 76 |
| Example 2-5 | HT-12 | ET015 | PD14 | DA-18 | ET05 | 1000 | 294.21 | 458 | 98 |
| Comparative Example 2-1 | HT-02 | — | PD3 | DA-02 | ET01 | 1000 | 19.18 | 459 | 1 |
| Comparative Example 2-2 | HT-07 | — | PD6 | DA-05 | ET03 | 1000 | 18.46 | 458 | 2 |
| Comparative Example 2-3 | — | ET03 | PD10 | DA-20 | ET04 | 1000 | 20.24 | 485 | 3 |
| Comparative Example 2-4 | — | ET09 | PD11 | DA-19 | E5 | 1000 | 15.50 | 485 | 4 |
| Comparative Example 2-5 | CBP | | PD8 | DA-03 | ET01 | 1000 | 29.52 | 460 | 2 |
| Comparative Example 2-6 | HT-02 | ET02 | — | DA-03 | ET01 | 1000 | 99.87 | 456 | 22 |
| Comparative Example 2-7 | HT-02 | ET02 | — | DA-04 | ET01 | 1000 | 98.10 | 458 | 23 |
| Comparative Example 2-8 | HT-09 | ET03 | — | DA-11 | ET03 | 1000 | 100.15 | 457 | 35 |
| Comparative Example 2-9 | HT-09 | ET03 | — | DA-13 | ET03 | 1000 | 110.45 | 457 | 21 |
| Comparative Example 2-10 | HT-12 | ET015 | — | DA-18 | ET05 | 1000 | 154.31 | 458 | 20 |
| Comparative Example 2-11 | HT-02 | ET02 | PD3 | — | ET01 | 1000 | 81.55 | 464 | 34 |
| Comparative Example 2-12 | HT-02 | ET02 | PD4 | — | ET01 | 1000 | 99.65 | 468 | 36 |
| Comparative Example 2-13 | HT-09 | ET03 | PD7 | — | ET03 | 1000 | 105.45 | 465 | 23 |
| Comparative Example 2-14 | HT-09 | ET03 | PD20 | — | ET03 | 1000 | 115.12 | 466 | 32 |
| Comparative Example 2-15 | HT-12 | ET015 | PD14 | — | ET05 | 1000 | 132.54 | 466 | 22 |
| Comparative Example 2-16 | HT-02 | ET02 | PD3 | DCJTB | ET01 | 1000 | 102.14 | 465 | 25 |
| Comparative Example 2-17 | HT-02 | ET02 | PD4 | DCJTB | ET01 | 1000 | 111.12 | 466 | 13 |
| Comparative Example 2-18 | HT-09 | ET03 | PD7 | DCJTB | ET03 | 1000 | 98.45 | 465 | 14 |
| Comparative Example 2-19 | HT-09 | ET03 | PD20 | DCJTB | ET03 | 1000 | 100.15 | 465 | 22 |
| Comparative Example 2-20 | HT-12 | ET015 | PD14 | DCJTB | ET05 | 1000 | 123.31 | 466 | 21 |
| Comparative Example 2-21 | Cmp3 | Cmp2 | PD3 | DA-03 | ET01 | 1000 | 96.87 | 456 | 16 |
| Comparative Example 2-22 | Cmp3 | Cmp2 | PD4 | DA-04 | ET01 | 1000 | 94.12 | 458 | 9 |
| Comparative Example 2-23 | Cmp3 | Cmp2 | PD7 | DA-11 | ET03 | 1000 | 88.45 | 457 | 15 |
| Comparative Example 2-24 | Cmp3 | Cmp2 | PD20 | DA-13 | ET03 | 1000 | 100.15 | 457 | 13 |
| Comparative Example 2-25 | Cmp3 | Cmp2 | PD14 | DA-18 | ET05 | 1000 | 101.31 | 458 | 12 |

Table 2 shows that the organic light-emitting devices of Examples 2-1 to 2-5 have greater current efficiency and longer lifespan than the organic light-emitting devices of Comparative Examples 2-1 to 2-25.

Example 3-1

As an anode, an indium tin oxide (ITO)-deposited substrate was cut to a size of 50 mm×50 mm×0.5 mm and sonicated utilizing isopropyl alcohol and pure water for 10 minutes each, and then, cleaned by irradiation of ultraviolet rays for 10 minutes and exposure to ozone. The resultant ITO substrate was mounted on a vacuum deposition apparatus.

m-MTDATA was deposited on the ITO substrate to form a hole injection layer having a thickness of 40 Å, followed by vacuum deposition of NPB on the hole injection layer to form a hole transport layer having a thickness of 10 Å, and compounds HT-01, ET02, 1 and DA-02 were co-deposited on the hole transport layer at a weight ratio of 70:30:15:1 to form an emission layer having a thickness of 200 Å. Compound ETL1 was deposited on the emission layer to form an electron transport layer having a thickness of 300 Å. AI was deposited on the electron transport layer to form a cathode having a thickness of 1200 Å, thereby completing the manufacture of an organic light-emitting device.

Examples 3-2 to 3-5 and Comparative Examples 3-1 to 3-25

Organic light-emitting devices were manufactured in the same manner as in Example 3-1, except that an emission layer is formed utilizing compounds respectively shown in Table 3.

Evaluation Example 3

The efficiency, emission wavelength and lifespan of the organic light-emitting devices manufactured according to Examples 3-1 to 3-5 and Comparative Examples 3-1 to 3-25 were measured utilizing a Kethley SMU 236 and luminance meter PR650 at a current density of 10 mA/cm$^2$. The results are shown in Table 3. The lifespan is a measure of how long it took for luminance to reduce from an initial luminance to 90% of theinitial luminance.

TABLE 3

| | Emission layer | | | | | | Emission | Life |
|---|---|---|---|---|---|---|---|---|
| | First compound | Second compound | Third compound | Fourth compound | Luminance (cd/m$^2$) | Efficiency (cd/A) | wave length (nm) | span (hr) |
| Example 3-1 | HT-01 | ET02 | 1 | DA-02 | 1000 | 146.35 | 458 | 25 |
| Example 3-2 | HT-03 | ET04 | 3 | DA-04 | 1000 | 149.36 | 455 | 23 |
| Example 3-3 | HT-05 | ET06 | 5 | DA-06 | 1000 | 168.25 | 453 | 32 |
| Example 3-4 | HT-07 | ET08 | 7 | DA-08 | 1000 | 144.23 | 457 | 18 |
| Example 3-5 | HT-09 | ET010 | 9 | DA-10 | 1062 | 122.56 | 458 | 9 |
| Comparative Example 3-1 | HT-01 | — | 1 | DA-01 | 1000 | 50.14 | 459 | 0.5 |
| Comparative Example 3-2 | HT-05 | — | 3 | DA-05 | 1000 | 23.45 | 457 | 2 |
| Comparative Example 3-3 | — | ET01 | 5 | DA-15 | 1000 | 12.16 | 483 | 4 |
| Comparative Example 3-4 | — | ET05 | 10 | DA-17 | 1000 | 36.30 | 482 | 0.9 |
| Comparative Example 3-5 | CBP | | 8 | DA-03 | 1000 | 27.11 | 459 | 1.1 |
| Comparative Example 3-6 | HT-01 | ET02 | — | DA-02 | 1000 | 75.37 | 458 | 6 |
| Comparative Example 3-7 | HT-03 | ET04 | — | DA-04 | 1000 | 60.37 | 455 | 4 |
| Comparative Example 3-8 | HT-05 | ET06 | — | DA-06 | 1000 | 55.25 | 453 | 5 |
| Comparative Example 3-9 | HT-07 | ET08 | — | DA-08 | 1000 | 49.24 | 457 | 5 |
| Comparative Example 3-10 | HT-09 | ET010 | — | DA-10 | 1000 | 62.54 | 458 | 2 |
| Comparative Example 3-11 | HT-01 | ET02 | 1 | — | 1000 | 66.54 | 469 | 7 |
| Comparative Example 3-12 | HT-03 | ET04 | 3 | — | 1000 | 75.34 | 468 | 5 |
| Comparative Example 3-13 | HT-05 | ET06 | 5 | — | 1000 | 45.44 | 466 | 6 |
| Comparative Example 3-14 | HT-07 | ET08 | 7 | — | 1000 | 65.12 | 466 | 7 |
| Comparative Example 3-15 | HT-09 | ET010 | 9 | — | 1062 | 44.13 | 468 | 6 |
| Comparative Example 3-16 | HT-01 | ET02 | 1 | DCJTB | 1000 | 50.42 | 465 | 10 |
| Comparative Example 3-17 | HT-03 | ET04 | 3 | DCJTB | 1000 | 45.15 | 466 | 5 |
| Comparative Example 3-18 | HT-05 | ET06 | 5 | DCJTB | 1000 | 44.44 | 465 | 7 |
| Comparative Example 3-19 | HT-07 | ET08 | 7 | DCJTB | 1000 | 32.14 | 465 | 8 |
| Comparative Example 3-20 | HT-09 | ET010 | 9 | DCJTB | 1000 | 10.31 | 466 | 10 |

TABLE 3-continued

| | Emission layer | | | | Luminance ($cd/m^2$) | Efficiency (cd/A) | Emission wave length (nm) | Life span (hr) |
|---|---|---|---|---|---|---|---|---|
| | First compound | Second compound | Third compound | Fourth compound | | | | |
| Comparative Example 3-21 | Cmp3 | Cmp2 | 1 | DA-02 | 1000 | 32.37 | 458 | 2 |
| Comparative Example 3-22 | Cmp3 | Cmp2 | 3 | DA-04 | 1000 | 20.22 | 455 | 1 |
| Comparative Example 3-23 | Cmp3 | Cmp2 | 5 | DA-06 | 1000 | 15.12 | 453 | 1 |
| Comparative Example 3-24 | Cmp3 | Cmp2 | 7 | DA-08 | 1000 | 19.14 | 457 | 0.5 |
| Comparative Example 3-25 | Cmp3 | Cmp2 | 9 | DA-10 | 1000 | 20.44 | 458 | 1 |

Table 3 shows that the organic light-emitting devices of Examples 3-1 to 3-5 have greater current efficiency and longer lifespan than the organic light-emitting devices of Comparative Examples 3-1 to 3-25.

As described above, the organic light-emitting devices according to embodiments of the present disclosure may have high efficiency and a long lifespan.

The terminology used herein is for the purpose of describing particular example embodiments only and is not intended to be limiting of the invention.

As used herein, the term “substantially,” “about,” and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

The use of “may” when describing embodiments of the inventive concept refers to “one or more embodiments of the inventive concept.”

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. An organic light-emitting device comprising:

a first electrode;

a second electrode facing the first electrode; and an organic layer between the first electrode and the second electrode, wherein the organic layer comprises an emission layer, the emission layer comprises a first compound, a second compound, a third compound, and a fourth compound, the first compound is represented by Formula 1;

the second compound is represented by Formula 2;

the third compound is represented by Formula 3;

the fourth compound is represented by any one of Formulae 4-1 to 4-3; and the first compound, the second compound, the third compound, and the fourth compound are different from each other:

<Formula 1>

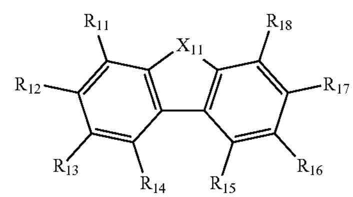

<Formula 2>

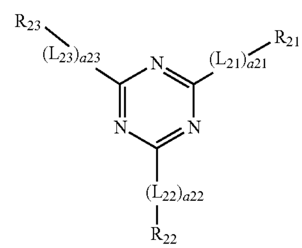

<Formula 3>

$$M_{31}(L_{31})_{n31}(L_{32})_{n32}$$

<Formula 3A>

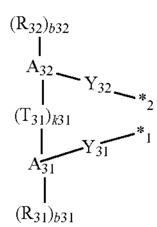

-continued

<Formula 3B>

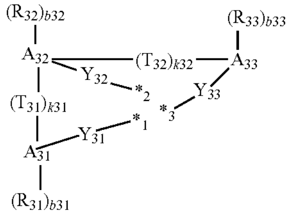

<Formula 3C>

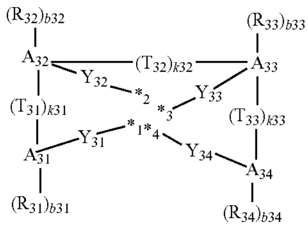

<Formula 3D>

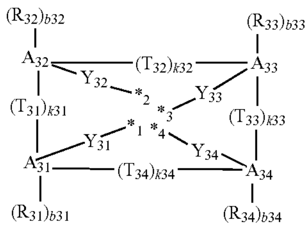

<Formula 4-1>

$$(D_{41})_{n41}—(L_{41})_{a41}—(A_{41})_{m41}$$

<Formula 4-2>

$$(D_{41})_{n41}—(L_{41})_{a41}—(A_{41})_{m41}—(L_{42})_{a42}—(D_{42})_{n42}$$

<Formula 4-3>

$$(A_{41})_{m41}—(L_{41})_{a41}—(D_{41})_{n41}—(L_{42})_{a42}—(A_{42})_{m42}$$

wherein, in Formula 1, $X_{11}$ is selected from O, S, N($R_{19}$), and C($R_{19}$)($R_{20}$);

$R_{11}$ to $R_{20}$ are each independently selected from:

a group represented by *-$(L_{11})_{a11}$-$A_{11}$, hydrogen, deuterium, a $C_1$-$C_{60}$ alkyl group, a π electron-depleted nitrogen-free cyclic group, —C($Q_1$)($Q_2$)($Q_3$), —Si($Q_1$)($Q_2$)($Q_3$), —B($Q_1$)($Q_2$), and —N($Q_1$)($Q_2$);

a π electron-depleted nitrogen-free cyclic group substituted with at least one selected from deuterium, a $C_1$-$C_{60}$ alkyl group, a π electron-depleted nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$); and a π electron-depleted nitrogen-free cyclic group substituted with at least one π electron-depleted nitrogen-free cyclic group that is substituted with at least one selected from deuterium, a $C_1$-$C_{60}$ alkyl group, a π electron-depleted nitrogen-free cyclic group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), $L_{11}$ is selected from:

a π electron-depleted nitrogen-free cyclic group, —C($Q_1$)($Q_2$)-, —Si($Q_1$)($Q_2$)-, —B($Q_1$)-, and —N($Q_1$)-; and a π electron-depleted nitrogen-free cyclic group substituted with at least one selected from deuterium, a $C_1$-$C_{60}$ alkyl group, a π electron-depleted nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), a11 is selected from 1, 2, and 3, and $A_{11}$ is selected from:

a π electron-depleted nitrogen-free cyclic group;

a π electron-depleted nitrogen-free cyclic group substituted with at least one selected from deuterium, a $C_1$-$C_{60}$ alkyl group, a π electron-depleted nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$); and a π electron-depleted nitrogen-free cyclic group substituted with at least one π electron-depleted nitrogen-free cyclic group that is substituted with at least one selected from deuterium, a $C_1$-$C_{60}$ alkyl group, a π electron-depleted nitrogen-free cyclic group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), wherein in Formula 2, $L_{21}$ to $L_{23}$ are each independently selected from a substituted or unsubstituted $C_5$-$C_{30}$ carbocyclic group and a substituted or unsubstituted $C_1$-$C_{30}$ heterocyclic group, a21 to a23 are each independently selected from 0, 1, and 2, and $R_{21}$ to $R_{23}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), wherein in Formula 3, $M_{31}$ is selected from a Period 4 transition metal, a Period 5 transition metal, and a Period 6 transition metal, $L_{31}$ is a ligand represented by one of Formulae 3A to 3D, $L_{32}$ is selected from a monodentate ligand, a bidentate ligand, and a tridentate ligand, n31 is 1 or 2, and n32 is selected from 0, 1, 2, 3, and 4, wherein in Formulae 3A to 3D, $A_{31}$ to $A_{34}$ are each independently selected from a $C_5$-$C_{30}$ carbocyclic group and a $C_1$-$C_{30}$ heterocyclic group, $T_{31}$ to $T_{34}$ are each independently selected from a single bond, a double bond, *—O—*',*—S—*', *—C(=O)—*', *—S(=O)—*' *—C($R_{35}$)($R_{36}$)—*', *—C($R_{35}$)=C($R_{36}$)—*', *—C($R_{35}$)=*', *—Si($R_3$s)($R_{36}$)—*', *—B($R_{35}$)*', *—N($R_{35}$)—*', and *—P($R_{35}$)—*', k31 to k34 are each independently selected from 1, 2, and 3, $Y_{31}$ to $Y_{34}$ are each independently selected from a single bond, *—O—*', *—S*', *—C($R_{37}$)($R_{38}$)—*', *—Si($R_{37}$)($R_{38}$)—*', *—B($R_{37}$)—*', *—N($R_{37}$)—*', and *—P($R_{37}$)—*', $*_1$, $*_2$, $*_3$, and $*_4$ each indicate a binding site to $M_{31}$, $R_{31}$ to $R_{38}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), wherein $R_{31}$ to $R_{38}$ are optionally linked to each other to form a substituted or unsubstituted $C_5$-$C_{60}$ carbocyclic group or a substituted or unsubstituted $C_1$-$C_{60}$ heterocyclic group, and b31 to b34 are each independently an integer from 0 to 10, wherein in Formulae 4-1 to 4-3, $A_{41}$ and $A_{42}$ are each independently selected from:

a π electron-depleted nitrogen-free cyclic group, —Si($Q_1$)($Q_2$)($Q_3$), —B($Q_1$)($Q_2$), and —N($Q_1$)($Q_2$);

a π electron-depleted nitrogen-free cyclic group substituted with at least one selected from deuterium, a $C_1$-$C_{60}$ alkyl group, a π electron-depleted nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$); and a π electron-depleted nitrogen-free cyclic group substituted with at least one π electron-depleted nitrogen-free cyclic group that is substituted with at least one selected from deuterium, a $C_1$-$C_{60}$ alkyl group, a π electron-depleted nitrogen-free cyclic group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), m41 and m42 are each independently selected from 1, 2, and 3, $D_{41}$ and $D_{42}$ are each independently selected from:

—F, a cyano group, a π electron-depleted nitrogen-containing cyclic group, a C(=O)-containing group, a P(=O)-containing group, and a P(=S)-containing group;

a π electron-depleted nitrogen-containing cyclic group, a C(=O)-containing group, a P(=O)-containing group, and a P(=S)-containing group, each substituted with at least one selected from deuterium, —F, a cyano group, a $C_1$-$C_{60}$ alkyl group, a π electron-depleted nitrogen-containing cyclic group, and a π electron-depleted nitrogen-free cyclic group;

a π electron-depleted nitrogen-containing cyclic group, a C(=O)-containing group, a P(=O)-containing group, and a P(=S)-containing group, each substituted with at least one selected from a $C_1$-$C_{60}$ alkyl group, a π electron-depleted nitrogen-containing cyclic group and a π electron-depleted nitrogen-free cyclic group that are each independently substituted with at least one selected from deuterium, —F, a cyano group, a $C_1$-$C_6$ alkyl group, a π electron-depleted nitrogen-containing cyclic group, and a π electron-depleted nitrogen-free cyclic group;

a $C_1$-$C_{60}$ alkyl group and a π electron-depleted nitrogen-free cyclic group, each substituted with at least one selected from —F, a cyano group, and a π electron-depleted nitrogen-containing cyclic group;

a $C_1$-$C_{60}$ alkyl group and a π electron-depleted nitrogen-free cyclic group, each substituted with at least one π electron-depleted nitrogen-containing cyclic group that is substituted with at least one selected from deuterium, —F, a cyano group, a $C_1$-$C_{60}$ alkyl group, a π electron-depleted nitrogen-containing cyclic group, and a π electron-depleted nitrogen-free cyclic group; and a $C_1$-$C_{60}$ alkyl group and a π electron-depleted nitrogen-free cyclic group, each substituted with at least one selected from a $C_1$-$C_{60}$ alkyl group and a π electron-depleted nitrogen-free cyclic group that are each independently substituted with at least one selected from —F, a cyano group, and a π electron-depleted nitrogen-containing cyclic group, n41 and n42 are each independently selected from 1, 2, and 3, $L_{41}$ and $L_{42}$ are each independently selected from:

a π electron-depleted nitrogen-free cyclic group, —C($Q_1$)($Q_2$)-, —Si($Q_1$)($Q_2$)-, —B($Q_1$)-, and —N($Q_1$)-; and a π electron-depleted nitrogen-free cyclic group substituted with at least one selected from deuterium, a $C_1$-$C_{60}$ alkyl group, a π electron-depleted nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), and a41 and a42 are each independently selected from 0, 1, 2, and 3, wherein in Formulae 1, 2, 3, and 4-1 to 4-3, at least one substituent of the substituted $C_1$-$C_6$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, the substituted monovalent non-aromatic condensed heteropolycyclic group, the substituted $C_5$-$C_{60}$ carbocyclic group, and the substituted $C_1$-$C_6$ heterocyclic group is selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_6$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_6$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_1$ to $Q_3$, $Q_{11}$ to $Q_{13}$, $Q_{21}$ to $Q_{23}$ and $Q_{31}$ to $Q_{33}$ are each independently selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group.

2. The organic light-emitting device of claim 1, wherein $D_{41}$ and $D_{42}$ are each independently selected from:

—F, a cyano group, a pyrazole group, an imidazole group, a triazole group, an oxazole group, an isoxazole group, an oxadiazole group, an isoxadiazole group, a thiazole group, an isothiazole group, a thiadiazole group, an isothiadiazole group, a pyridine group, a pyrazine group, a pyridazine group, a pyrimidine group, a triazine group, a quinoline group, an isoquinoline group, a naphthyridine group, a quinoxaline group, a quinazoline group, and a group represented by one of Formulae 13-1 to 13-3, a pyrazole group, an imidazole group, a triazole group, an oxazole group, an isoxazole group, an oxadiazole group, an isoxadiazole group, a thiazole group, an isothiazole group, a thiadiazole group, an isothiadiazole group, a pyridine group, a pyrazine group, a pyridazine group, a pyrimidine group, a triazine group, a quinoline group, an isoquinoline group, a naphthyridine group, a quinoxaline group, and a quinazoline group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group;

a pyrazole group, an imidazole group, a triazole group, an oxazole group, an isoxazole group, an oxadiazole group, an isoxadiazole group, a thiazole group, an isothiazole group, a thiadiazole group, an isothiadiazole group, a pyridine group, a pyrazine group, a pyridazine group, a pyrimidine group, a triazine group, a quinoline group, an isoquinoline group, a naphthyridine group, a quinoxaline group, and a quinazoline group, each substituted with at least one selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group that are each independently substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group;

a $C_1$-$C_{20}$ alkyl group, a benzene group, biphenyl group, terphenyl group, a naphthalene group, a phenanthrene group, a triphenylene group, a chrysene group, a fluoranthene group, a fluorene group, a carbazole group, a dibenzofuran group, a dibenzothiophene group, a benzofluorene group, a benzocarbazole group, a benzonaphthofuran group, a benzonaphthothiophene group, a dibenzofluorene group, a dibenzocarbazole group, a dinaphthofuran group, and a dinaphthothiophene group, each substituted with at least one selected from —F, a cyano group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group;

a $C_1$-$C_{20}$ alkyl group, a benzene group, biphenyl group, terphenyl group, a naphthalene group, a phenanthrene group, a triphenylene group, a chrysene group, a fluoranthene group, a fluorene group, a carbazole group, a dibenzofuran group, a dibenzothiophene group, a benzofluorene group, a benzocarbazole group, a benzonaphthofuran group, a benzonaphthothiophene group, a dibenzofluorene group, a dibenzocarbazole group, a dinaphthofuran group, and a dinaphthothiophene group, each substituted with at least one selected from a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group that are each independently substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group; and a $C_1$-$C_{20}$ alkyl group, a benzene group, biphenyl group, terphenyl group, a naphthalene group, a phenanthrene group, a triphenylene group, a chrysene group, a fluoranthene group, a fluorene group, a carbazole group, a dibenzofuran group, a dibenzothiophene group, a benzofluorene group, a benzocarbazole group, a benzonaphthofuran group, a benzonaphthothiophene group, a dibenzofluorene group, a dibenzocarbazole group, a dinaphthofuran group, and a dinaphthothiophene group, each substituted with at least one selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each independently substituted with at least one selected from —F, a cyano group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group:

<Formula 13-1>

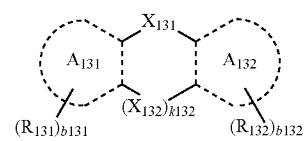

<Formula 13-2>

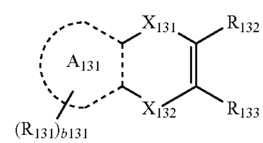

<Formula 13-3>

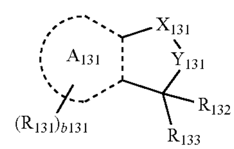

wherein, in Formulae 13-1 to 13-3, $X_{131}$ is selected from C(═O), S(═O), S(═O)$_2$, P(═O)($R_{134}$), and P(═S)($R_{134}$), $X_{132}$ is selected from O, S, C(═O), S(═O), S(═O)$_2$, P(═O)($R_{135}$), and P(═S)($R_{135}$), k132 is 0 or 1, wherein, when k132 is 0, —$(X_{132})_{k132}$— is a direct link, $Y_{131}$ is selected from O and S, $A_{131}$ and $A_{132}$ are each independently selected from a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, $R_{131}$ to $R_{135}$ are each independently selected from:

a binding site, hydrogen, deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group; and a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group, wherein at least one selected from $R_{131}$ to $R_{135}$ is the binding site, and b131 and b132 are each independently selected from 1, 2, 3, 4, 5, and 6.

3. The organic light-emitting device of claim 1, wherein:

the first electrode is an anode, the second electrode is a cathode, the organic layer further comprises a hole transport region between the first electrode and the emission layer and/or an electron transport region between the emission layer and the second electrode, the hole transport region comprises a hole injection layer, a hole transport layer, an emission auxiliary layer, and/or an electron blocking layer, and the electron transport region comprises a hole blocking layer, an electron transport layer, and/or an electron injection layer.

4. The organic light-emitting device of claim 1, wherein $R_{21}$ to $R_{23}$ in Formula 2 are each independently selected from:

a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group;

a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, —Cl, —Br, —I, a hydroxyl group, a cyano group, a nitro group, an amidino group, a hydrazine group, a hydrazone group, a $C_1$-$C_{10}$ alkyl group, a $C_1$-$C_{10}$ alkoxy group, a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, $—C(Q_{31})(Q_{32})(Q_{33})$, $—Si(Q_{31})(Q_{32})(Q_{33})$, $—B(Q_{31})(Q_{32})$, $—N(Q_{31})(Q_{32})$, $—P(Q_{31})(Q_{32})$, $—C(=O)(Q_{31})$, $—S(=O)(Q_{31})$, $—S(=O)_2(Q_{31})$, $—P(=O)(Q_{31})(Q_{32})$, and $—P(=S)(Q_{31})(Q_{32})$; and $—C(Q_1)(Q_2)(Q_3)$, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, and $—P(=S)(Q_1)(Q_2)$, and wherein $Q_1$ to $Q_3$ and $Q_{31}$ to $Q_{33}$ are each independently selected from a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

5. The organic light-emitting device of claim 1, wherein $A_{11}$ is selected from:

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$.

6. The organic light-emitting device of claim 1, wherein $L_{21}$ to $L_{23}$ in Formula 2 are each independently selected from a benzene group, a naphthalene group, a phenalene group, an anthracene group, a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group; and a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indeno fluorenyl group, an indolofluorenyl group, a benzofurofluorenyl group, a benzothienofluorenyl group, an indenocarbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

7. The organic light-emitting device of claim 1, wherein $A_{41}$ and $A_{42}$ are each independently selected from a group represented by Formula 12, —Si($Q_1$)($Q_2$)($Q_3$), —B($Q_1$)($Q_2$), and —N($Q_1$)($Q_2$):

<Formula 12>

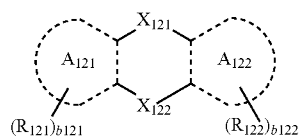

wherein, in Formula 12, $X_{121}$ is selected from O, S, N($R_{123}$), and C($R_{123}$)($R_{124}$), $X_{122}$ is selected from a single bond, O, S, N($R_{125}$), and C($R_{125}$)($R_{126}$), $A_{121}$ and $A_{122}$ are each independently selected from a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, $R_{121}$ to $R_{126}$ are each independently selected from:

a binding site, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —Si($Q_{31}$)($Q_{32}$)($Q_{33}$), —B($Q_{31}$)($Q_{32}$), and —N($Q_{31}$)($Q_{32}$); and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —Si($Q_{21}$)($Q_{22}$)($Q_{23}$), —B($Q_{21}$)($Q_{22}$), and —N($Q_{21}$)($Q_{22}$), wherein $R_{123}$ and $R_{124}$ are optionally linked to each other to form a π electron-depleted nitrogen-free cyclic group, $R_{125}$ and $R_{126}$ are optionally linked to each other to form a π electron-depleted nitrogen-free cyclic group, and at least one selected from $R_{121}$ to $R_{126}$ is the binding site, and b121 and b122 are each independently selected from 1, 2, 3, 4, 5, and 6.

8. The organic light-emitting device of claim 1, wherein $L_{41}$ and $L_{42}$ are each independently selected from:

a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, a dibenzothiophene group, —C($Q_1$)($Q_2$)- and —Si($Q_1$)($Q_2$)-; and a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —C($Q_{31}$)($Q_{32}$)($Q_{33}$), and —Si($Q_{31}$)($Q_{32}$)($Q_{33}$).

9. The organic light-emitting device of claim 1, wherein:

the first compound is selected from compounds of Group I;

the second compound is selected from compounds of Group II, the third compound is selected from compounds of Group III-I and Group III-II, and the fourth compound is selected from compounds of Group IV:

<Group I>

HT-01

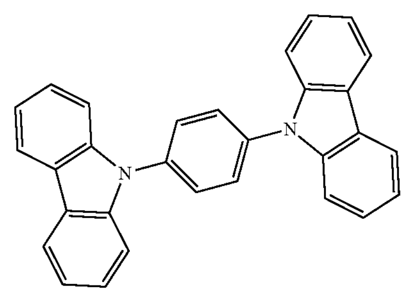

HT-02

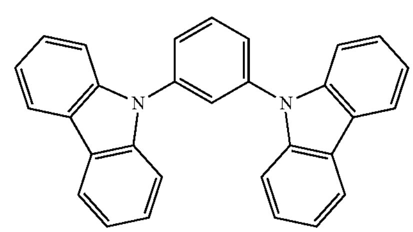

-continued
HT-03
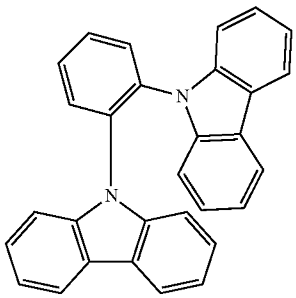
HT-04
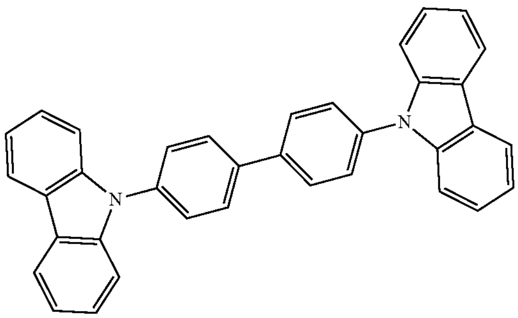
HT-05
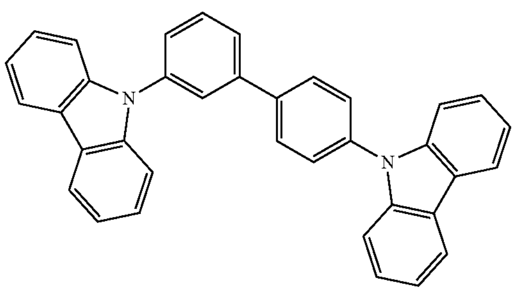
HT-06
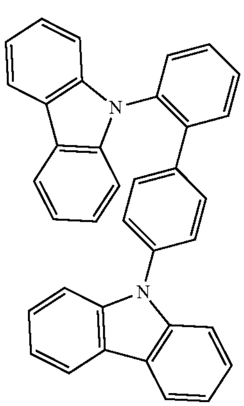
-continued
HT-07
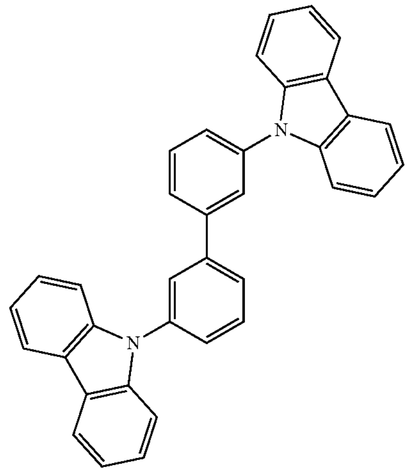
HT-08
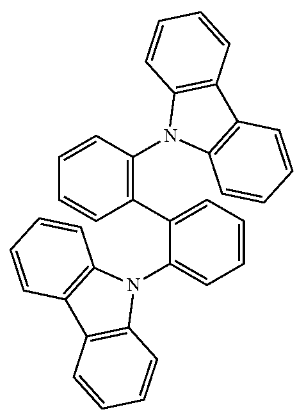
HT-09
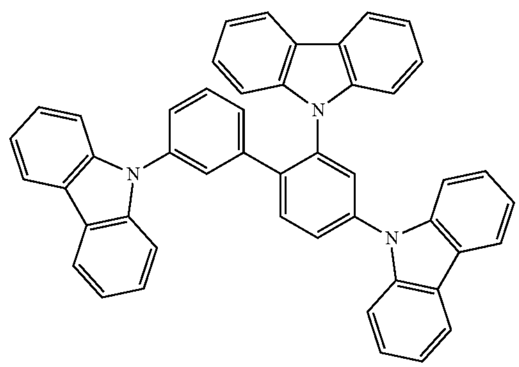

-continued
HT-10
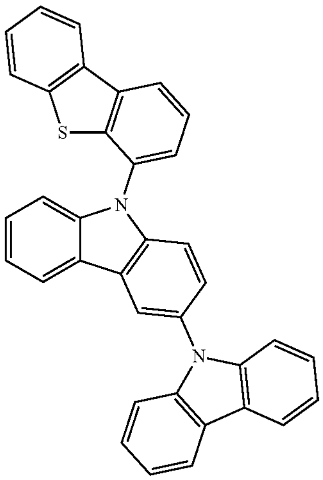
HT-11
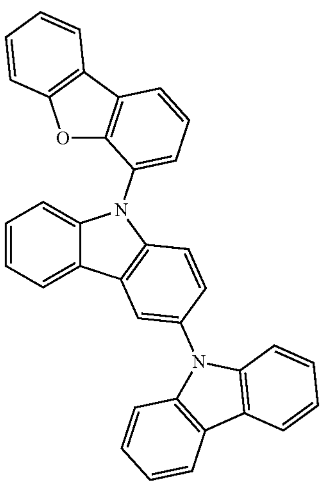
HT-12
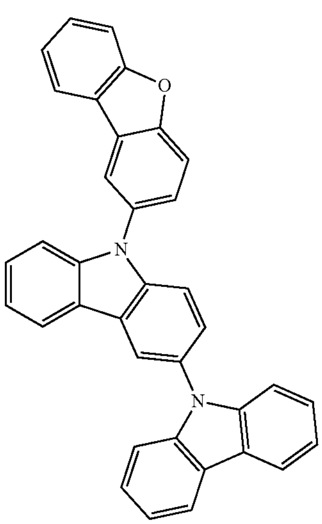
-continued
HT-13
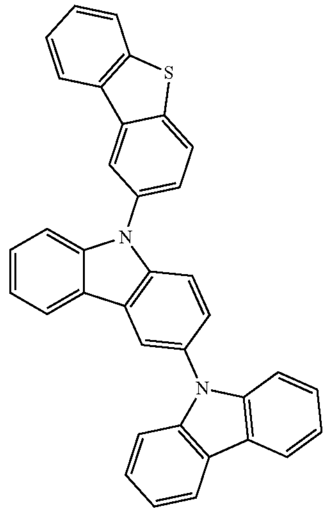
HT-14
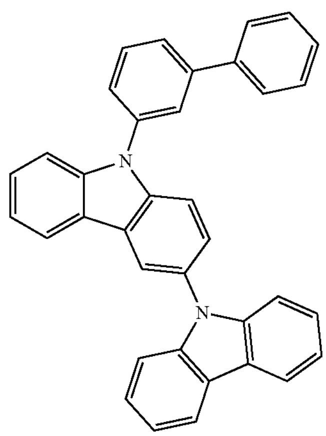
HT-15
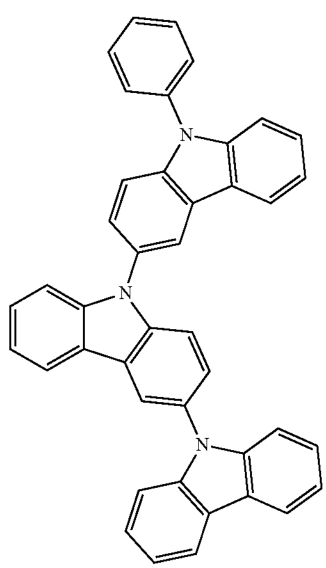

-continued
HT-16
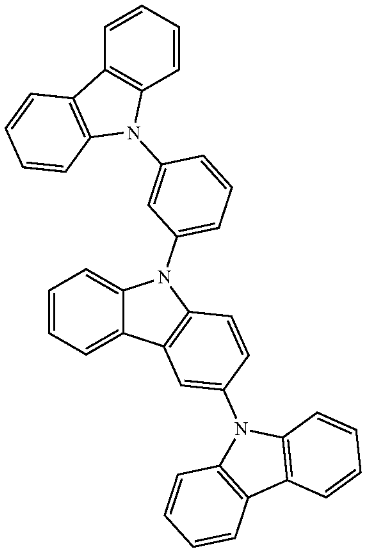
HT-17
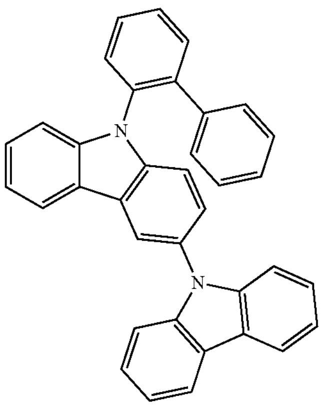
<Group II>
ET01
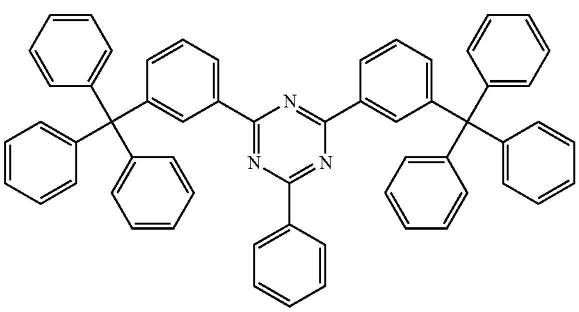
ET02
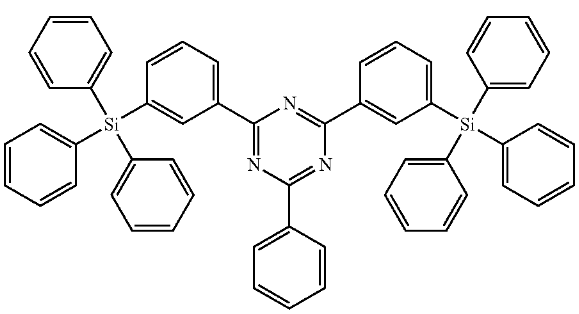
-continued
ET03
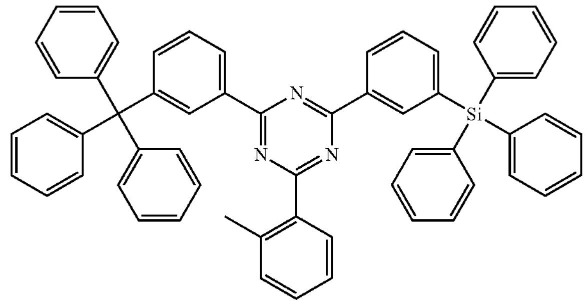
ET04
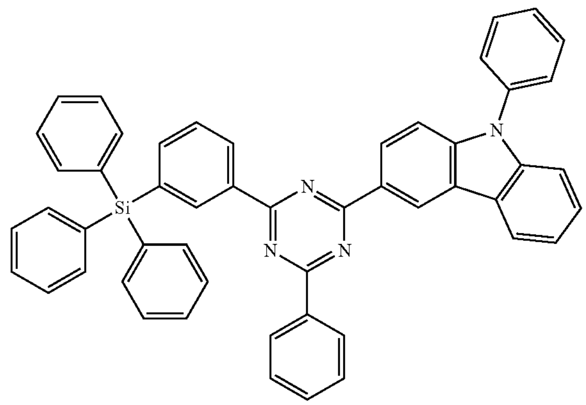
ET05
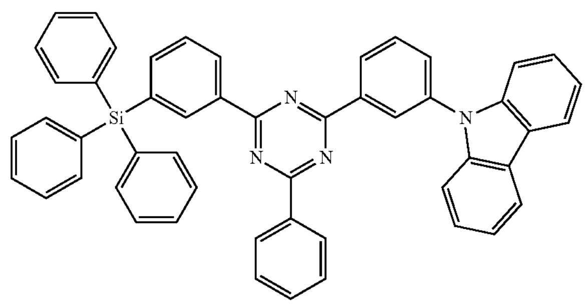
ET06
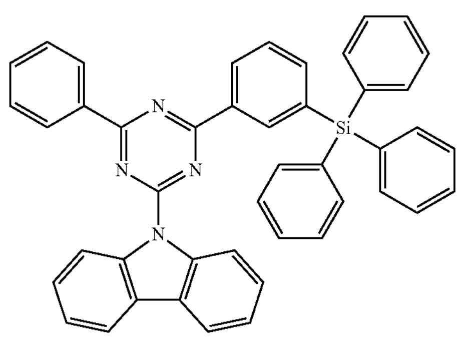

-continued
ET07
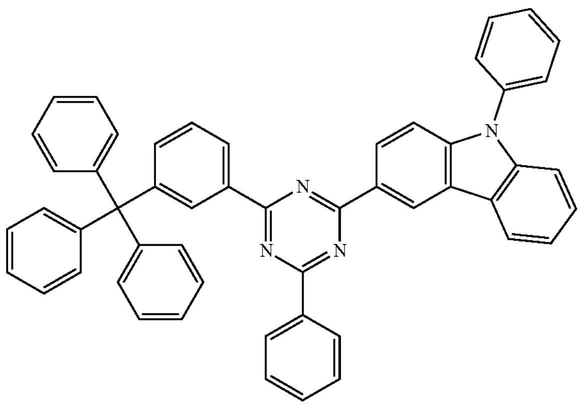
ET08
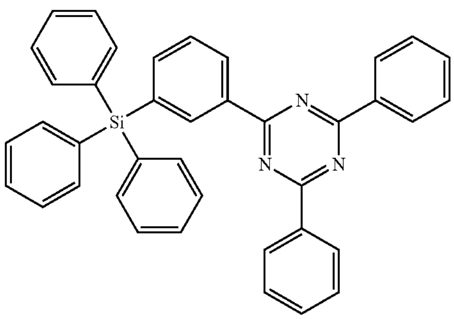
ET09
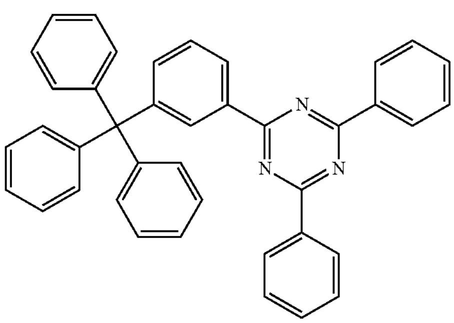
ET010
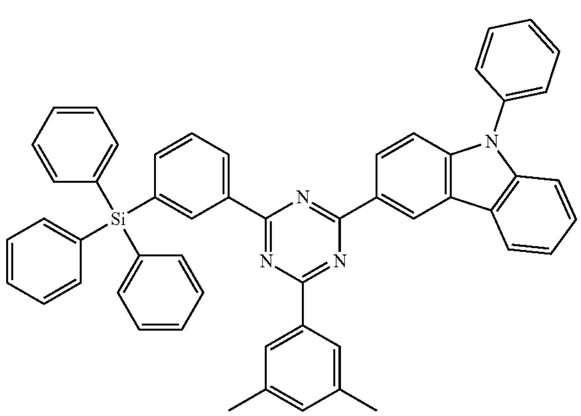
-continued
ET011
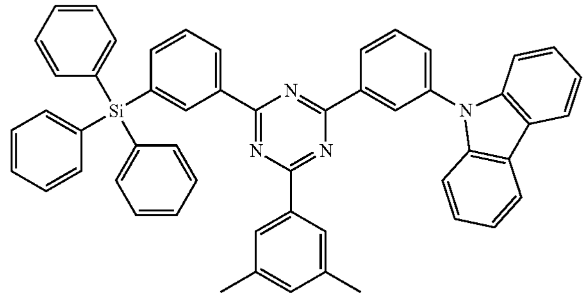
ET012
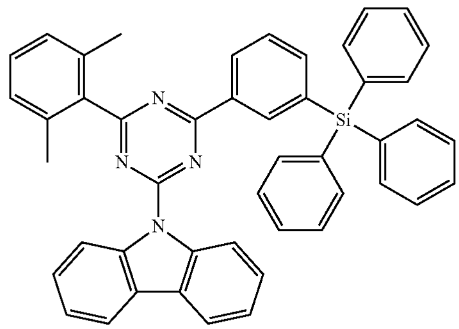
ET013
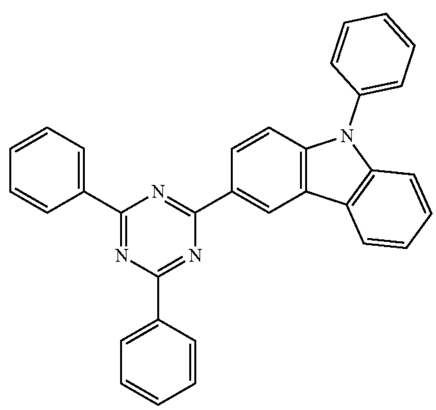
ET014
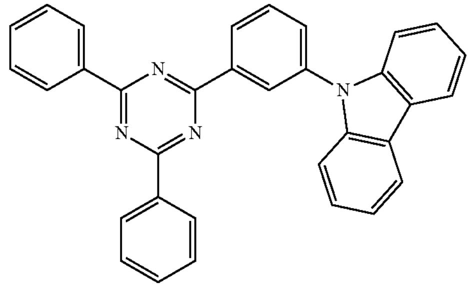

-continued
ET015
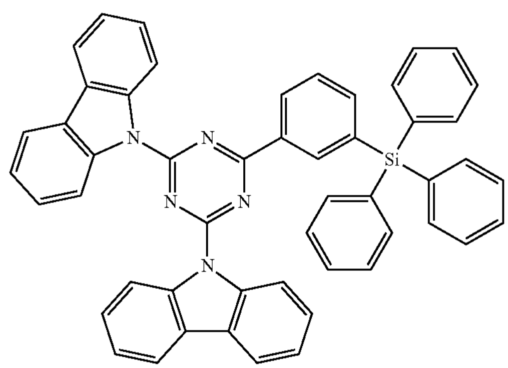
<Group III-1>
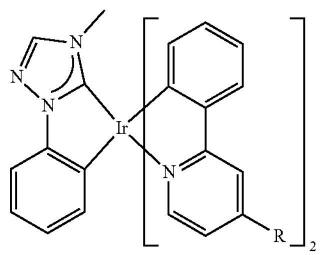
1 (R = H)
2 (R = Me)
3 (R = iso-Pr)
4 (R = tert-Bu)
5 (R = $NMe_2$)
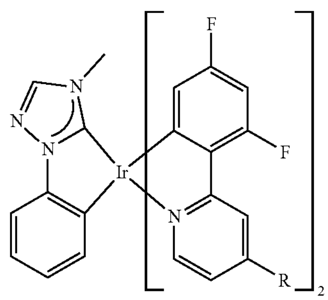
6 (R = H)
7 (R = Me)
8 (R = iso-Pr)
9 (R = tert-Bu)
10 (R = $NMe_2$)
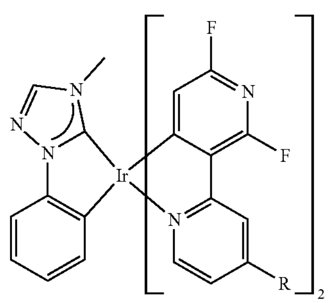
11 (R = H)
12 (R = Me)
13 (R = iso-Pr)
14 (R = tert-Bu)
15 (R = $NMe_2$)
-continued
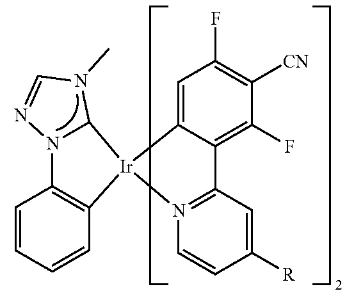
16 (R = H)
17 (R = Me)
18 (R = iso-Pr)
19 (R = tert-Bu)
20 (R = $NMe_2$)
21
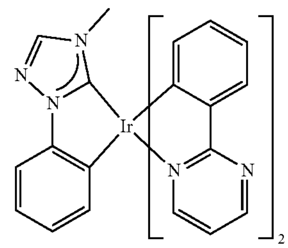
22
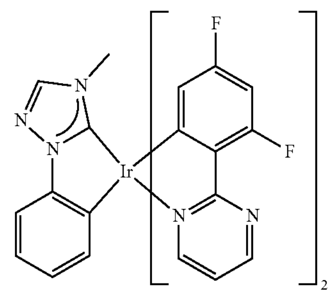
23
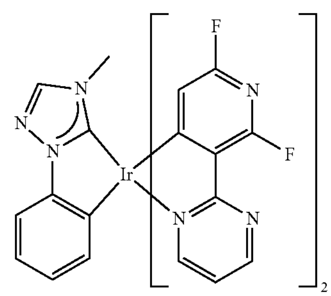
24
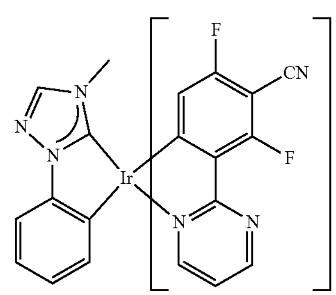

-continued
25
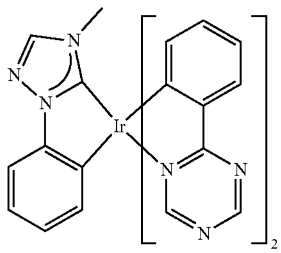
26
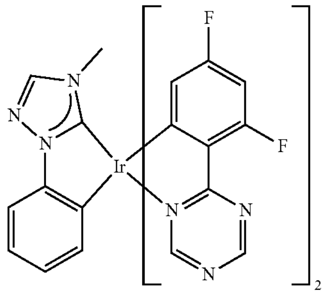
27
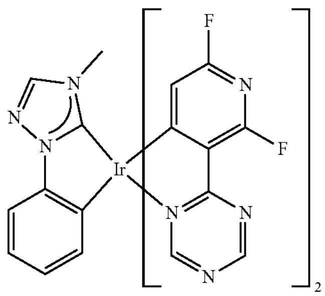
28
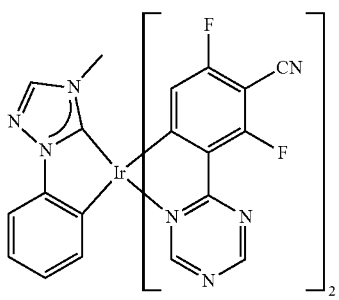
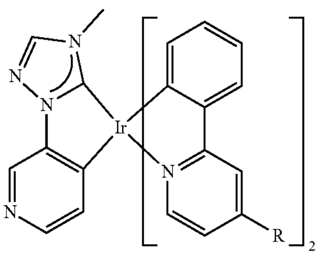
29 (R = H)
30 (R = Me)
31 (R = iso-Pr)
32 (R = tert-Bu)
33 (R = $NMe_2$)
-continued
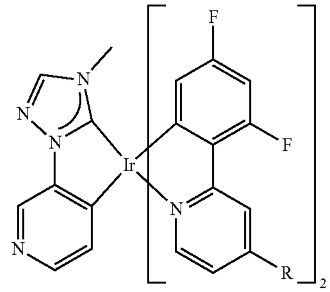
34 R = H)
35 (R = Me)
36 (R = iso-Pr)
37 (R = tert-Bu)
38 (R = $NMe_2$)
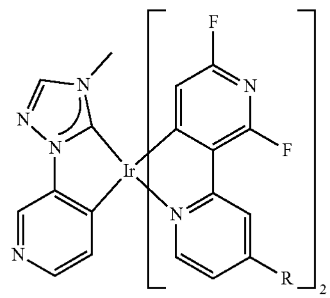
39 R = H)
40 (R = Me)
41 (R = iso-Pr)
42 (R = tert-Bu)
43 (R = $NMe_2$)
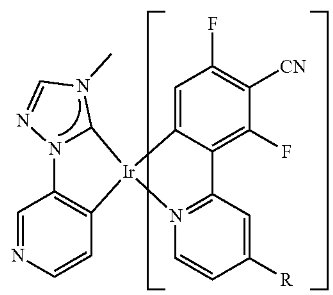
44 R = H)
45 (R = Me)
46 (R = iso-Pr)
47 (R = tert-Bu)
48 (R = $NMe_2$)
49
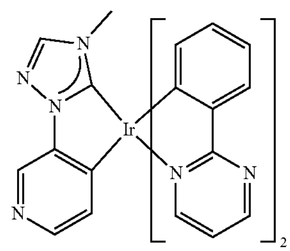

50
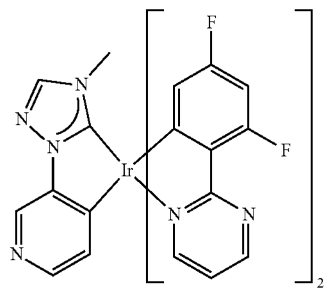
51
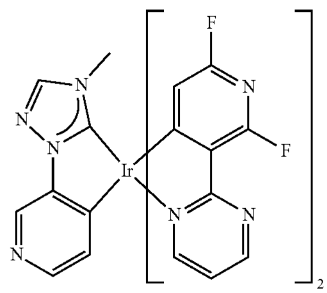
52
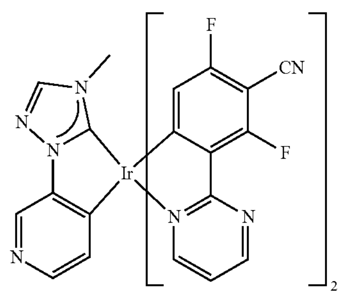
53
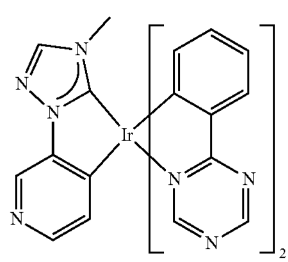
54
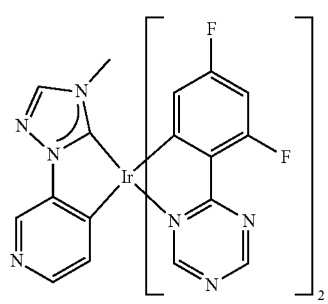
55
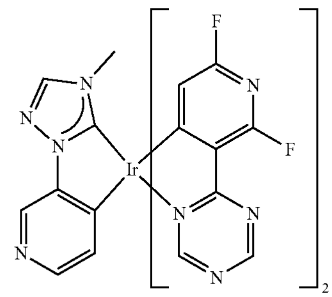
56
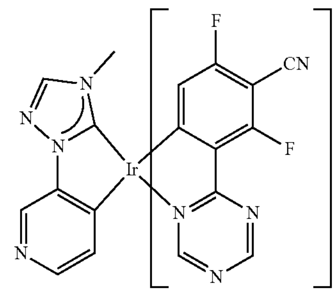
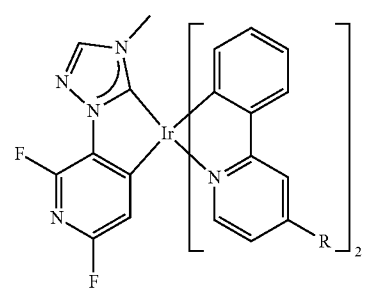
57 (R = H)
58 (R = Me)
59 (R = iso-Pr)
60 (R = tert-Bu)
61 (R = $NMe_2$)
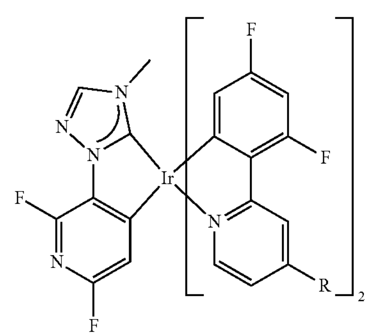
62 (R = H)
63 (R = Me)
64 (R = iso-Pr)
65 (R = tert-Bu)
66 (R = $NMe_2$)

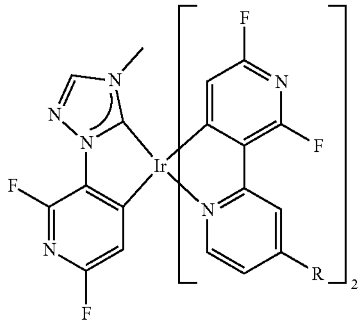
67 (R = H)
68 (R = Me)
69 (R = iso-Pr)
70 (R = tert-Bu)
71 (R = $NMe_2$)
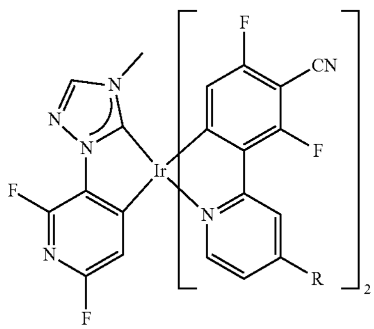
72 (R = H)
73 (R = Me)
74 (R = iso-Pr)
75 (R = tert-Bu)
76 (R = $NMe_2$)
77
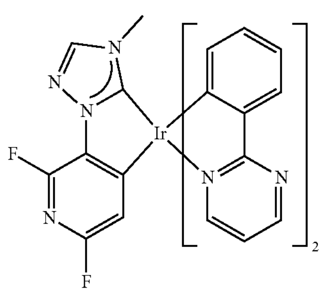
78
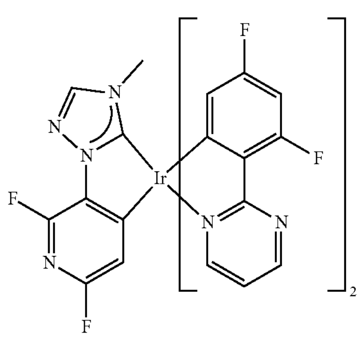
79
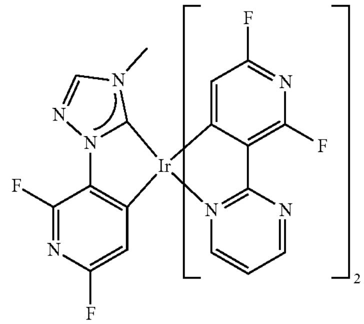
80
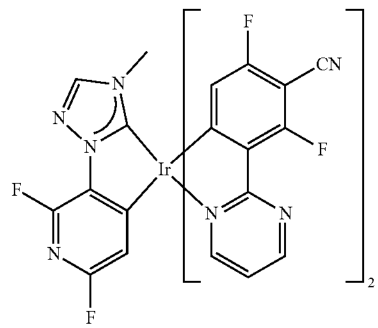
81
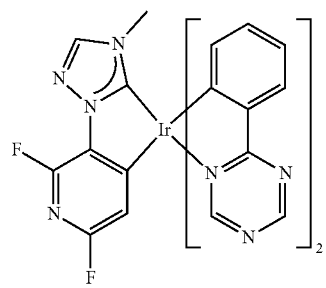
82
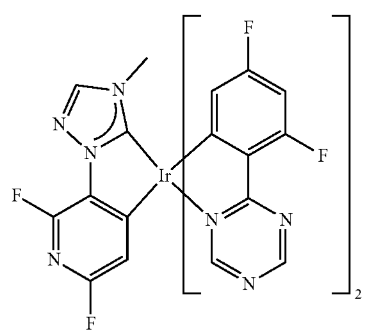
83
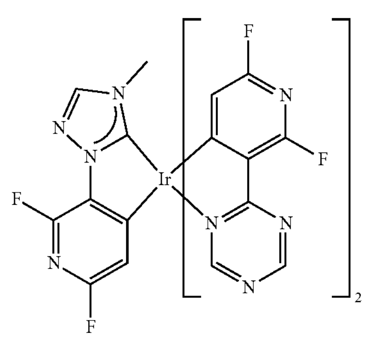

84
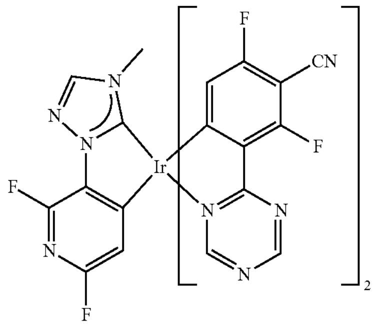
<Group III-2>
PD1
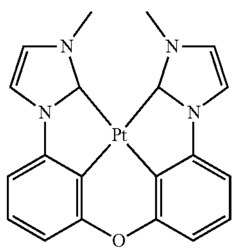
PD2
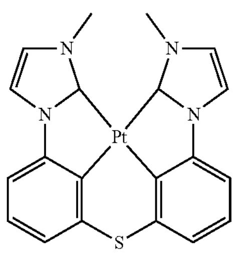
PD3
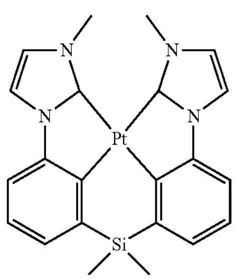
PD4
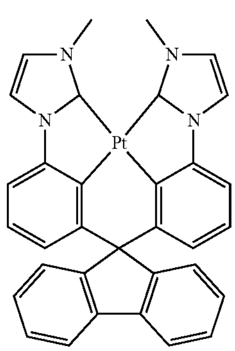
PD5
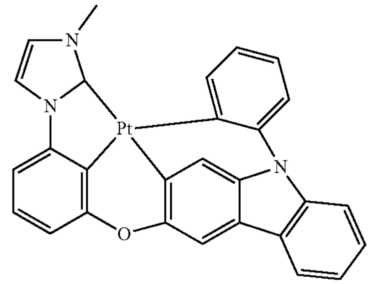
PD6
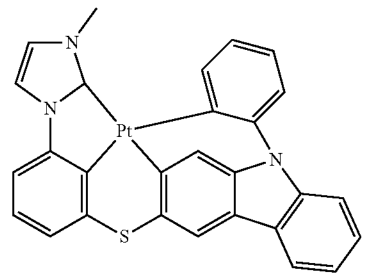
PD7
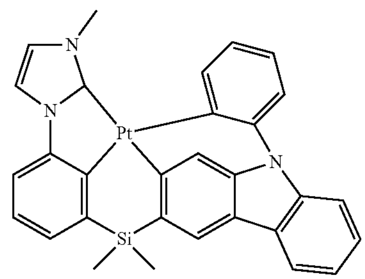
PD8
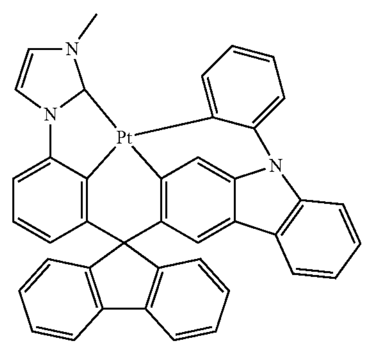
PD9
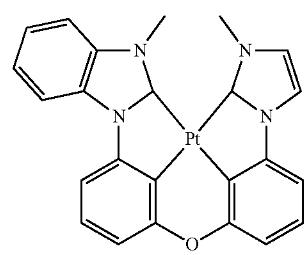

PD10
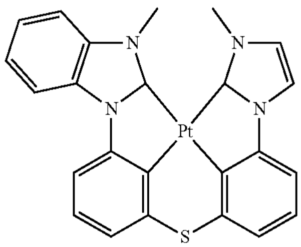
PD11
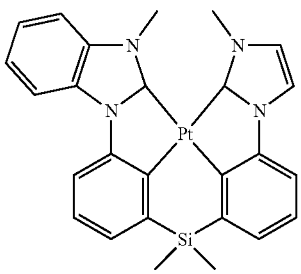
PD12
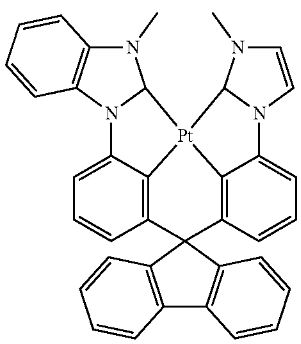
PD13
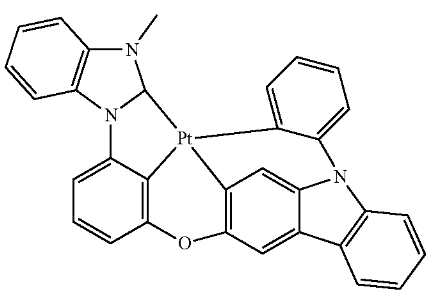
PD14
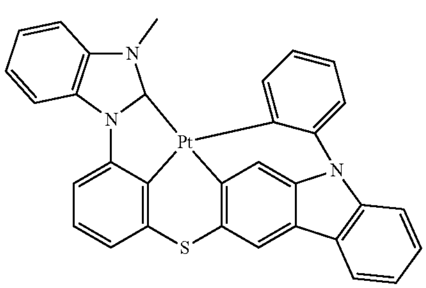
PD15
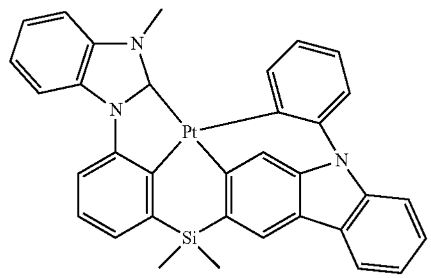
PD16
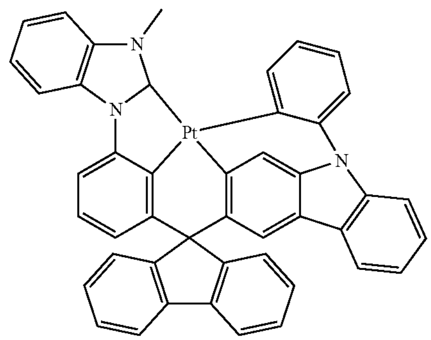
PD17
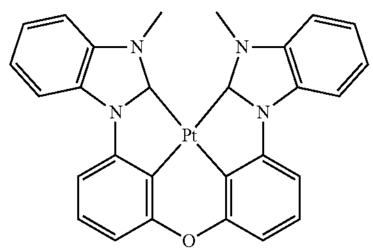
PD18
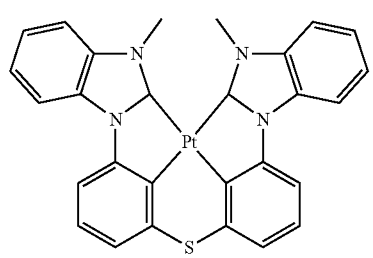
PD19
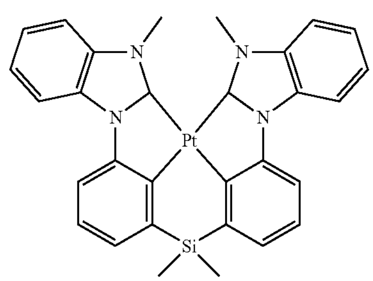

PD20
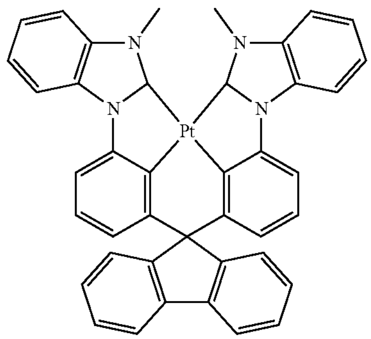
PD21
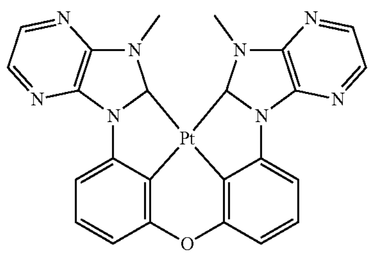
PD22
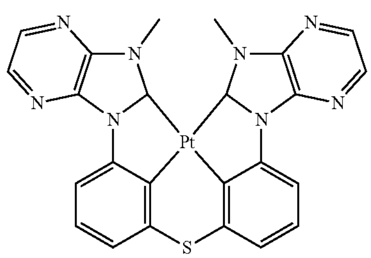
PD23
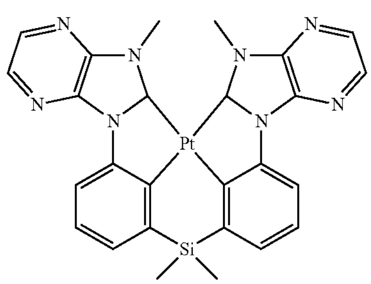
PD24
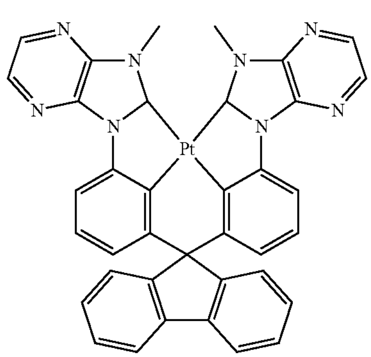
PD25
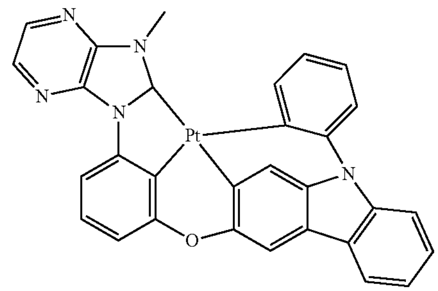
PD26
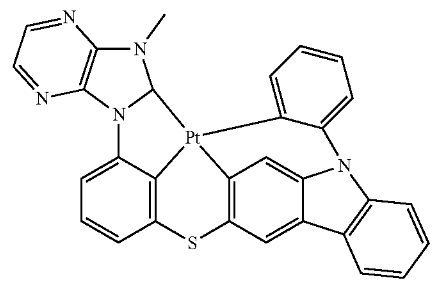
PD27
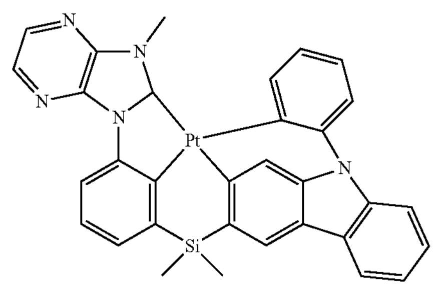
PD28
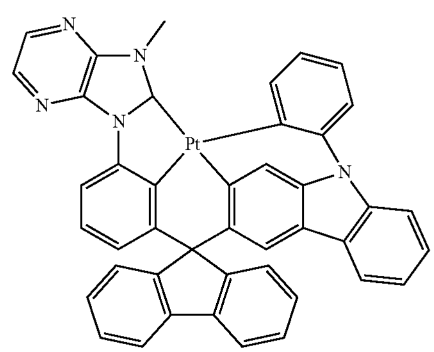
PD29
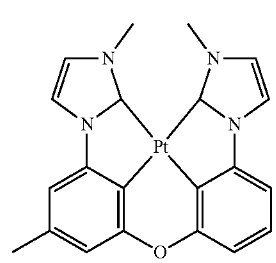

-continued
PD30
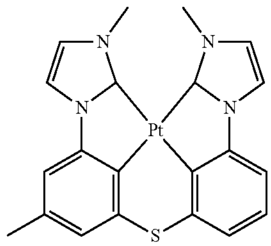
PD31
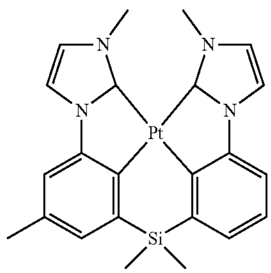
PD32
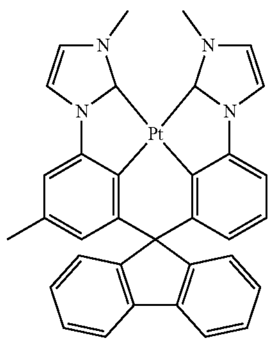
PD33
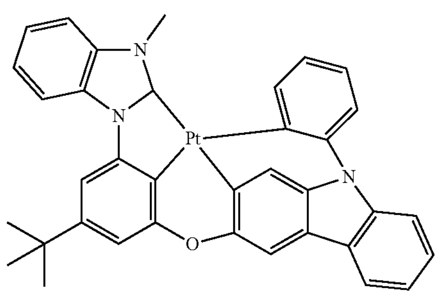
PD34
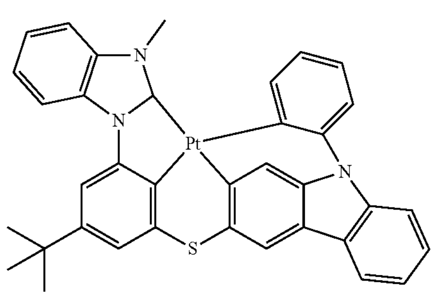
-continued
PD35
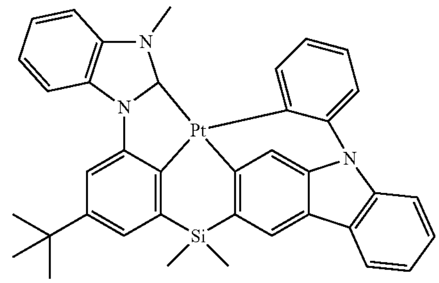
PD36
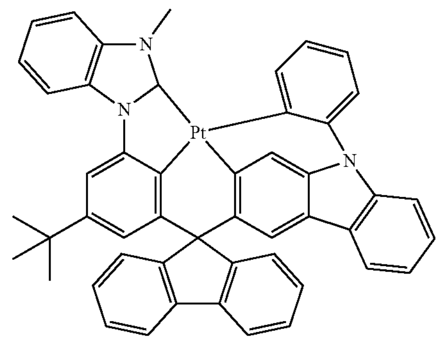
<Group IV>
DA-01
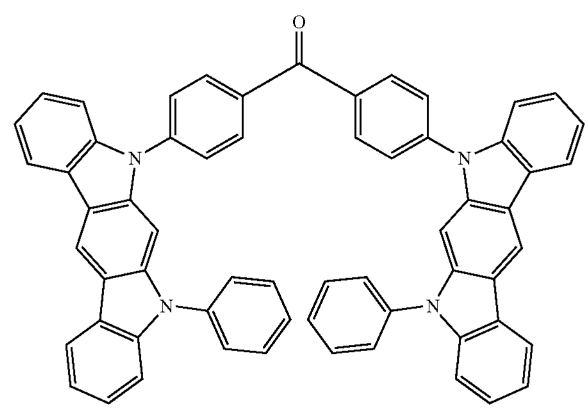
DA-02
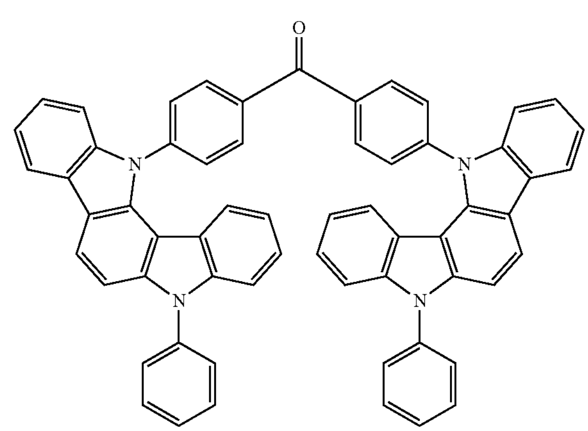

-continued
DA-03
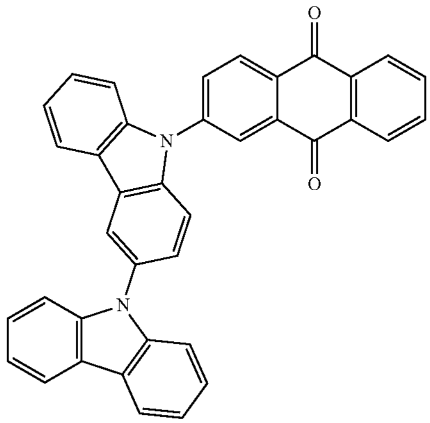
DA-04
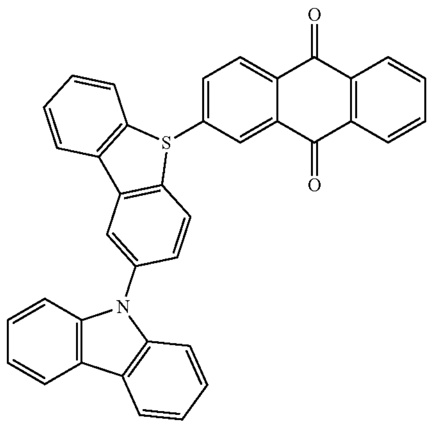
DA=05
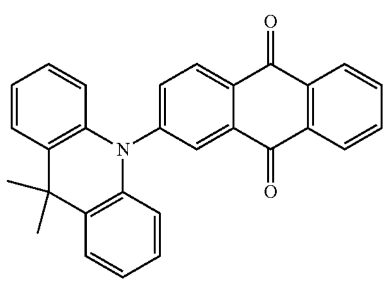
DA-06
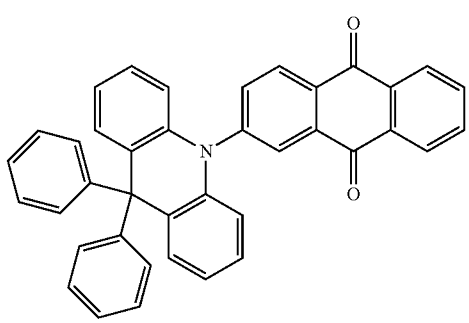
-continued
DA-07
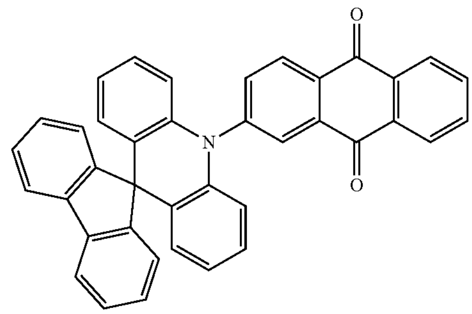
DA-08
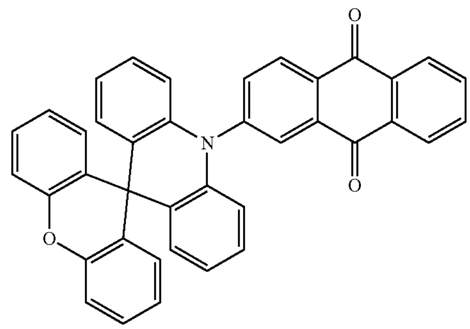
DA-09
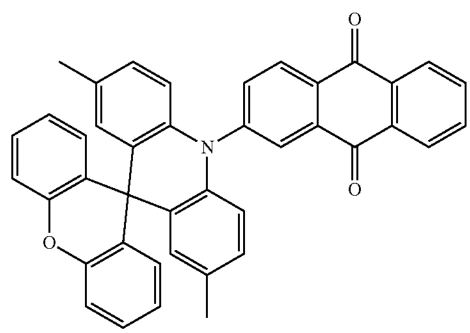
DA-10
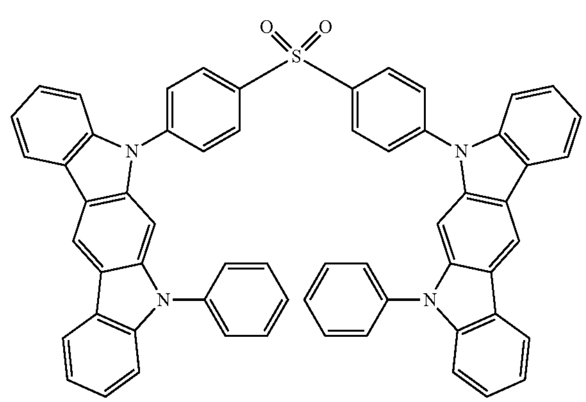

DA-11
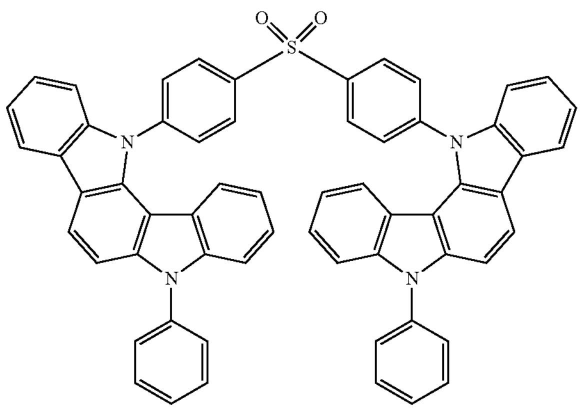
DA-12
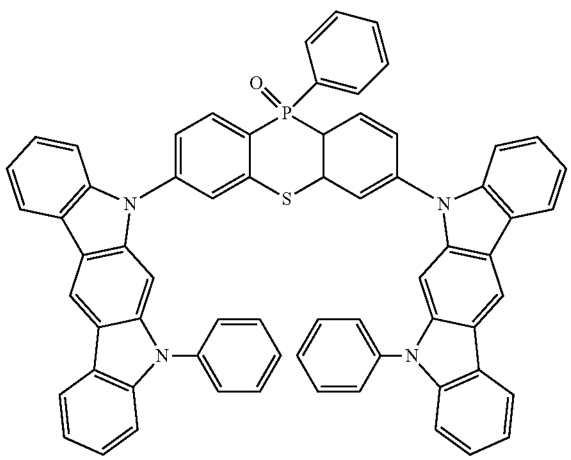
DA-13
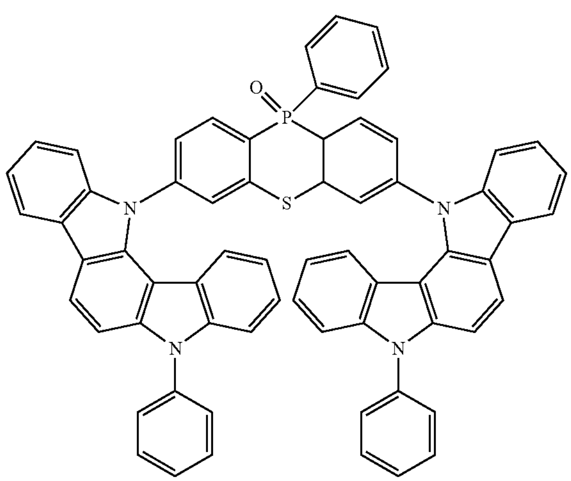
DA-14
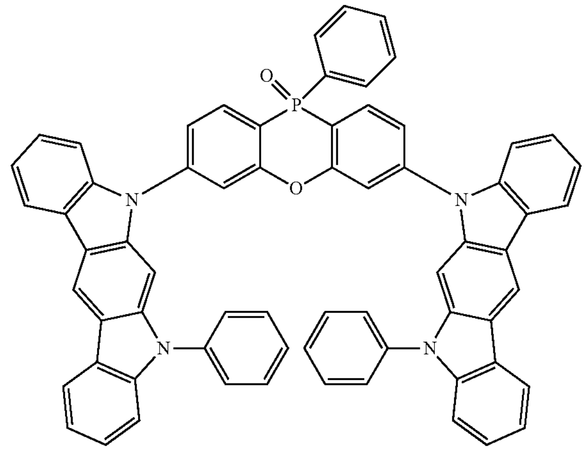
DA-15
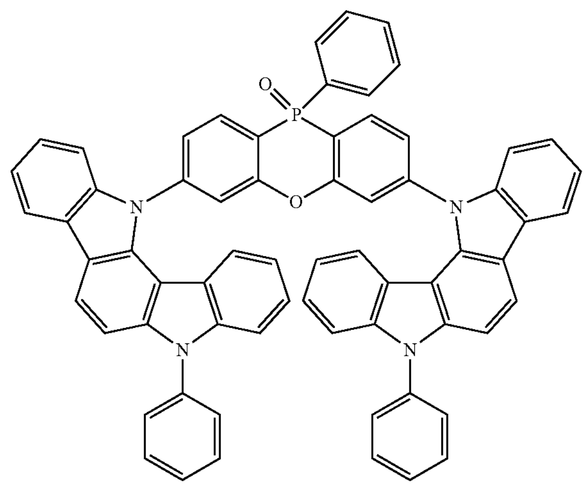
DA-16
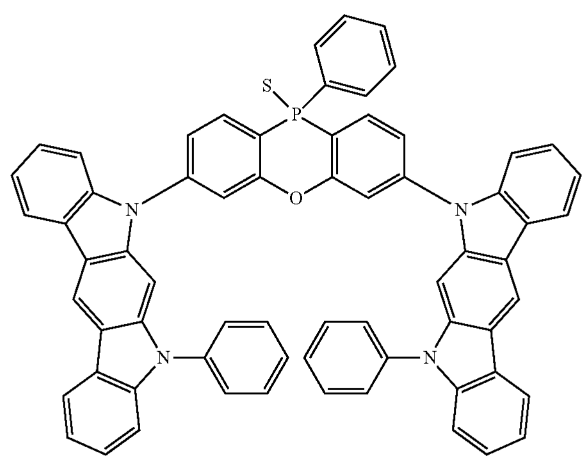

DA-17
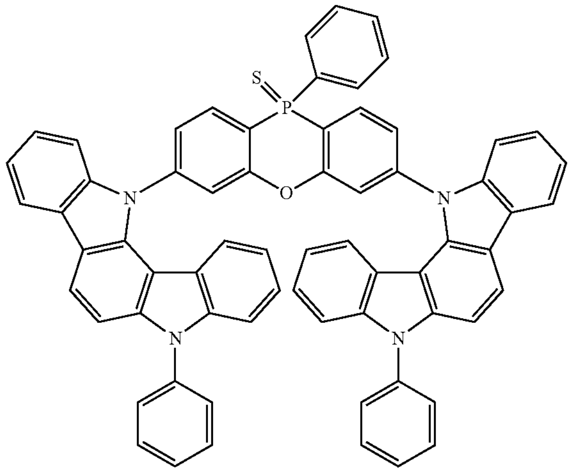
DA-18
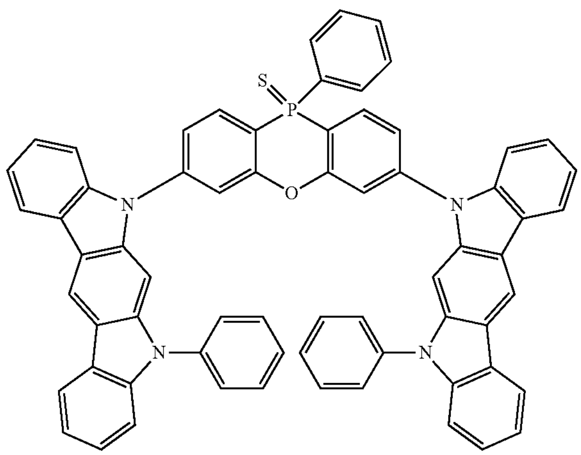
DA-19
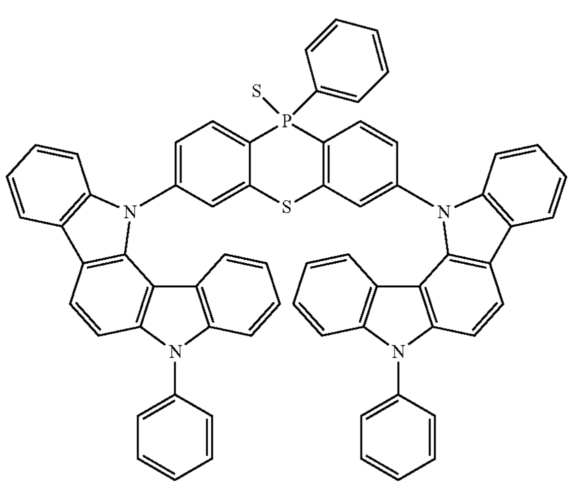
DA-20
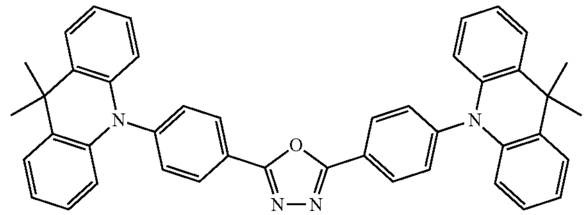
DA-21
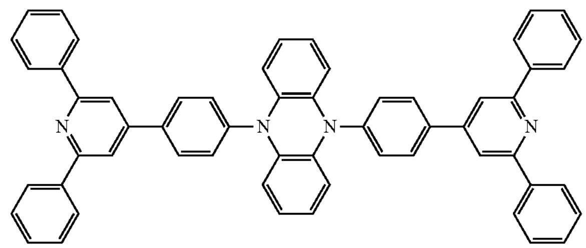
DA-22
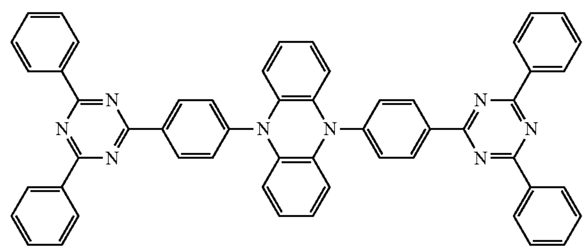
DA-23
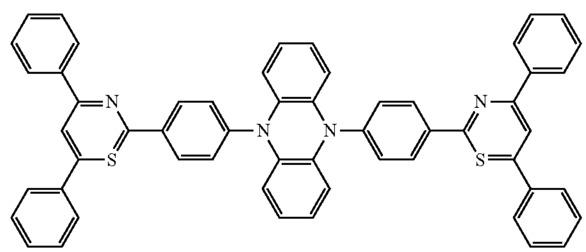
DA-24
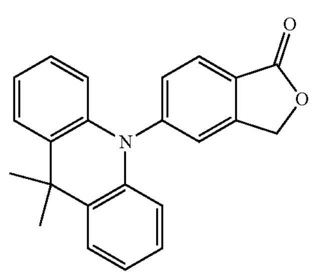
DA-25
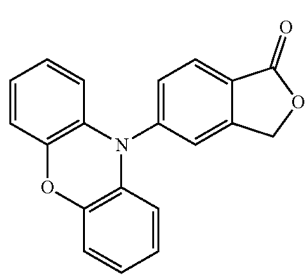

-continued

DA-26

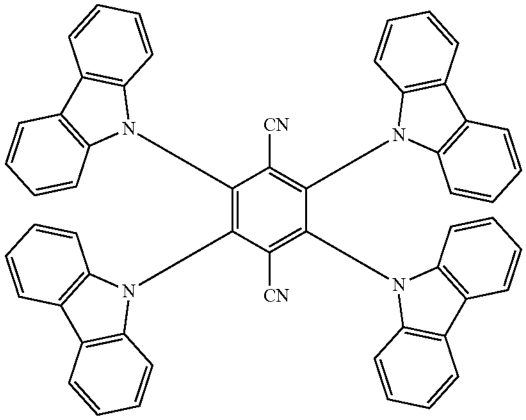

DA-27

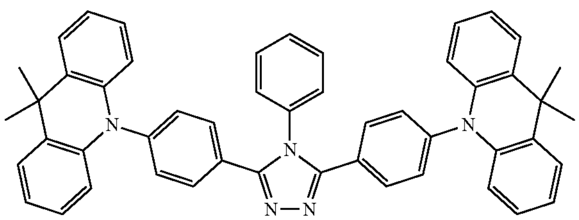

DA-28

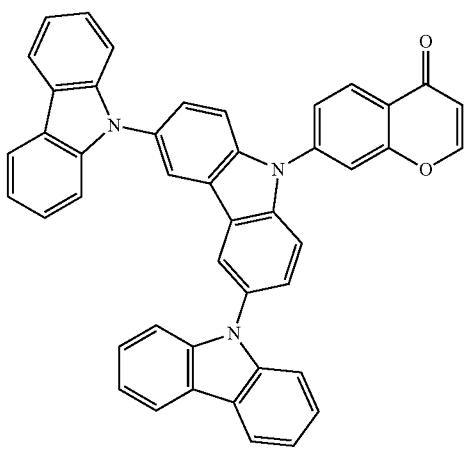

DA-29

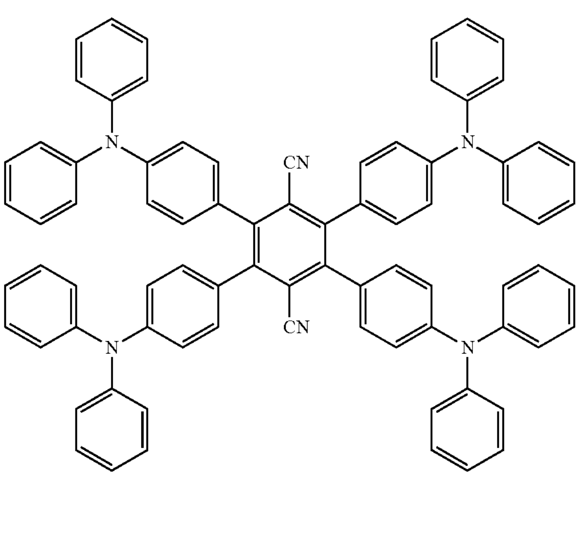

-continued

DA-30

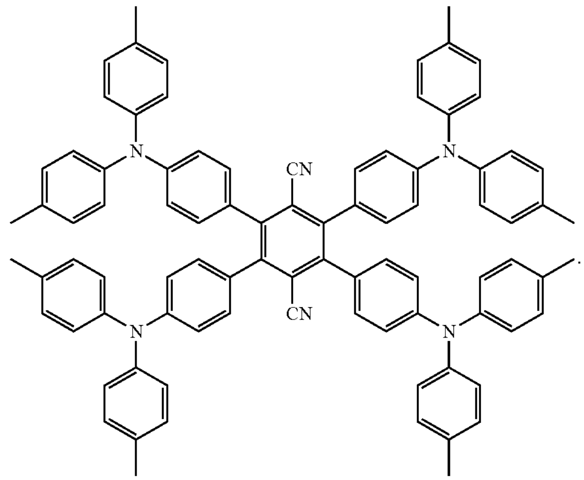

10. The organic light-emitting device of claim 1, wherein at least one selected from $R_{21}$ to $R_{23}$ is selected from a group represented by Formula 2A, a group represented by Formula 2B, —$C(Q_1)(Q_2)(Q_3)$, and —$Si(Q_1)(Q_2)(Q_3)$:

<Formula 2A>

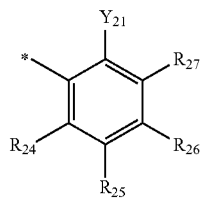

<Formula 2B>

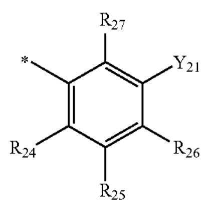

wherein, in Formulae 2A and 2B, $Y_{21}$ is selected from a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$, $R_{24}$ to $R_{27}$ are each independently selected from hydrogen, deuterium, a $C_1$-$C_{10}$ alkyl group, a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$, $Q_1$ to $Q_3$ and $Q_{31}$ to $Q_{33}$ are each independently selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and

* indicates a binding site to a neighboring atom.

11. The organic light-emitting device of claim 3, wherein the hole blocking layer comprises a hole blocking material represented by Formula 2:

<Formula 2>

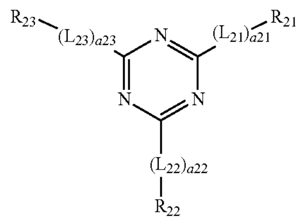

wherein, in Formula 2, $L_{21}$ to $L_{23}$ are each independently selected from a substituted or unsubstituted $C_5$-$C_{30}$ carbocyclic group and a substituted or unsubstituted $C_1$-$C_{30}$ heterocyclic group, a21 to a23 are each independently selected from 0, 1, and 2, $R_{21}$ to $R_{23}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), and —P(═S)($Q_1$)($Q_2$), and at least one substituent of the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, the substituted monovalent non-aromatic condensed heteropolycyclic group is selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_6$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

12. The organic light-emitting device of claim 1, wherein $A_{11}$ is represented by one of Formulae 8-1 to 8-5:

8-1

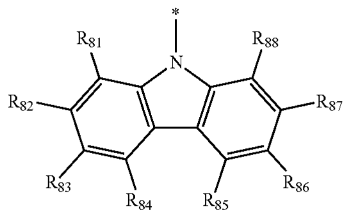

8-2

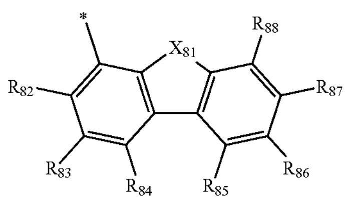

8-3

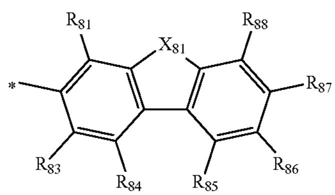

8-4

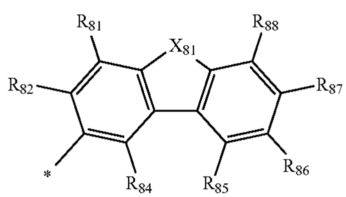

8-5

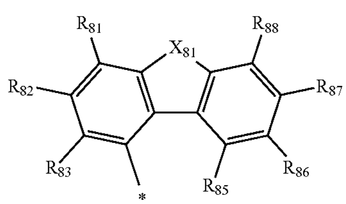

wherein, in Formulae 8-1 to 8-5, $X_{81}$ is selected from O, S, $N(R_{89})$, and $C(R_{89})(R_{90})$, $R_{81}$ to $R_{90}$ are each independently selected from hydrogen, deuterium, a $C_1$-$C_{20}$ alkyl group, a phenyl group, a biphenyl group, a terphenyl group, a fluorenyl group, a carbazolyl group, a dibenzofuranyl group, and a dibenzothiophenyl group, and

* indicates a binding site to a neighboring atom.

13. The organic light-emitting device of claim 1, wherein the third compound is represented by Formula 3-1 or Formula 3-2:

<Formula 3-1>

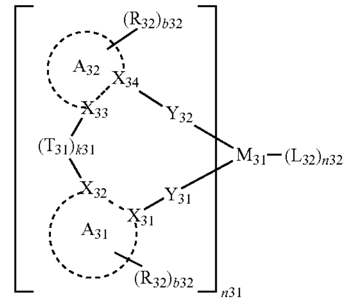

<Formula 3-2>

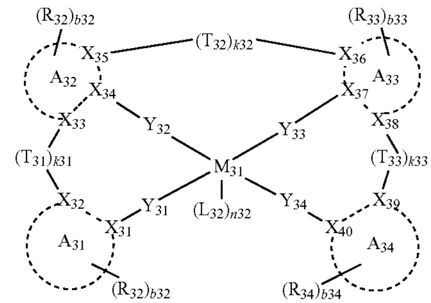

wherein, in Formulae 3-1 and 3-2, $X_{31}$ to $X_{40}$ are each independently selected from N and C, and $M_{31}$, $A_{31}$ to $A_{34}$, $R_{32}$ to $R_{34}$, b32 to b34, $Y_{31}$ to $Y_{34}$, $T_{31}$ to $T_{33}$, k31 to k33, $L_{32}$, n31 and n32 are each the same as respectively defined in connection with Formula 3.

14. An apparatus comprising:

a thin-film transistor comprising a source electrode, a drain electrode, an activation layer, and a sealing part; and the organic light-emitting device of claim 1, wherein the first electrode of the organic light-emitting device is electrically connected to the source electrode or the drain electrode of the thin-film transistor.

15. The organic light-emitting device of claim 1, wherein the first compound is represented by one of Formulae 1-1 to 1-9:

1-1

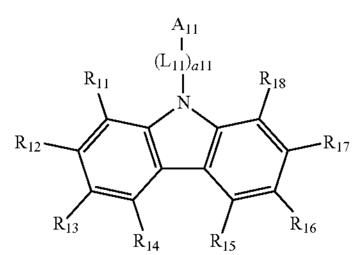

1-2

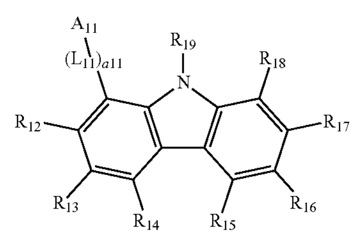

-continued 1-3

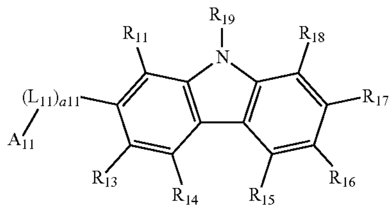

1-4

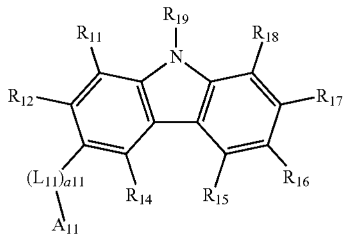

1-5

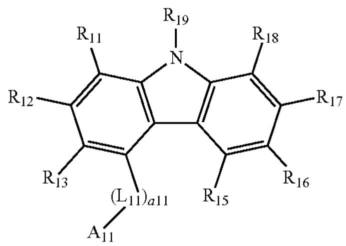

1-6

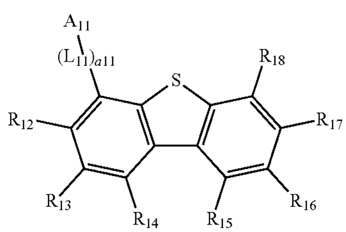

-continued 1-7

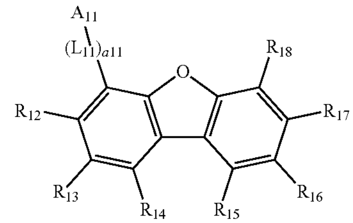

1-8

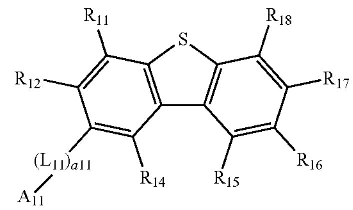

1-9

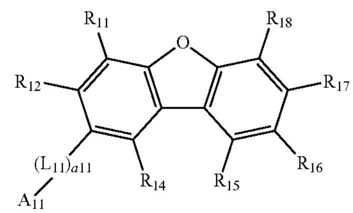

wherein, in Formulae 1-1 to 1-9, $L_{11}$, a11, $A_{11}$, and $R_{11}$ to $R_{19}$ are each the same as respectively defined in connection with Formula 1.

16. The organic light-emitting device of claim 1, wherein a ratio of a light emitted from the fourth compound to a total light emitted from the emission layer is 80% or more.

17. The organic light-emitting device of claim 1, wherein the first compound, the second compound, and the third compound are substantially not to emit light.

18. The organic light-emitting device of claim 1, wherein at least one of $R_{11}$ to $R_{19}$ is represented by $*\text{-}(L_{11})_{a11}\text{-}A_{11}$.

19. The organic light-emitting device of claim 1, wherein the fourth compound is to emit light.

20. The organic light-emitting device of claim 1, wherein $X_{11}$ is O, S, or $N(R_{19})$.

* * * * *